(12) United States Patent
Ogihara et al.

(10) Patent No.: US 8,697,330 B2
(45) Date of Patent: Apr. 15, 2014

(54) COMPOSITION FOR FORMING A SILICON-CONTAINING ANTIREFLECTION FILM, SUBSTRATE HAVING THE SILICON-CONTAINING ANTIREFLECTION FILM FROM THE COMPOSITION AND PATTERNING PROCESS USING THE SAME

(75) Inventors: Tsutomu Ogihara, Jyoetsu (JP);
Toshiharu Yano, Jyoetsu (JP);
Takafumi Ueda, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 384 days.

(21) Appl. No.: 12/662,582

(22) Filed: Apr. 23, 2010

(65) Prior Publication Data
US 2010/0285407 A1 Nov. 11, 2010

(30) Foreign Application Priority Data

May 11, 2009 (JP) ................... 2009-114666

(51) Int. Cl.
*G03F 7/09* (2006.01)
*G03F 7/11* (2006.01)
*C08G 77/04* (2006.01)

(52) U.S. Cl.
CPC . *G03F 7/91* (2013.01); *C08G 77/04* (2013.01)
USPC .................... 430/270.1; 430/273.1

(58) Field of Classification Search
CPC .................. G03F 7/91; C08G 77/04
USPC ............... 430/270.1, 273.1; 528/43
See application file for complete search history.

(56) References Cited

U.S. PATENT DOCUMENTS

| | | | |
|---|---|---|---|
| 5,886,119 A | 3/1999 | Schaedeli et al. | |
| 5,972,560 A | 10/1999 | Kaneko et al. | |
| 6,013,416 A | 1/2000 | Nozaki et al. | |
| 6,280,898 B1 | 8/2001 | Hasegawa et al. | |
| 6,309,796 B1 | 10/2001 | Nakashima et al. | |
| 6,420,088 B1 | 7/2002 | Angelopoulos et al. | |
| 6,506,497 B1 | 1/2003 | Kennedy et al. | |
| 7,335,455 B2 * | 2/2008 | Kim et al. ................ | 430/270.1 |
| 2001/0026901 A1 | 10/2001 | Maeda et al. | |
| 2002/0012871 A1 | 1/2002 | Hatakeyama et al. | |
| 2003/0091929 A1 | 5/2003 | Nishi et al. | |
| 2005/0106499 A1 | 5/2005 | Harada et al. | |
| 2006/0019195 A1 | 1/2006 | Hatakeyama et al. | |
| 2007/0148586 A1 | 6/2007 | Uh et al. | |
| 2007/0238300 A1 | 10/2007 | Ogihara et al. | |
| 2008/0026322 A1 * | 1/2008 | Ogihara et al. ............ | 430/270.1 |
| 2008/0274432 A1 | 11/2008 | Ogihara et al. | |
| 2008/0312400 A1 | 12/2008 | Yamashita et al. | |
| 2009/0011372 A1 * | 1/2009 | Ogihara et al. ............ | 430/323 |
| 2009/0087799 A1 | 4/2009 | Tachibana et al. | |
| 2009/0136869 A1 * | 5/2009 | Ogihara et al. ............ | 430/270.1 |
| 2010/0086870 A1 * | 4/2010 | Ogihara et al. ............ | 430/270.1 |
| 2010/0086872 A1 * | 4/2010 | Ogihara et al. ............ | 430/272.1 |

FOREIGN PATENT DOCUMENTS

| | | |
|---|---|---|
| JP | A-6-118651 | 4/1994 |
| JP | A-8-12626 | 1/1996 |
| JP | A-9-73173 | 3/1997 |
| JP | A-9-110938 | 4/1997 |
| JP | A-10-324748 | 12/1998 |
| JP | A-11-302382 | 11/1999 |
| JP | A-2000-159758 | 6/2000 |
| JP | A-2002-55456 | 2/2002 |
| JP | A-2003-84438 | 3/2003 |
| JP | A-2005-114921 | 4/2005 |
| JP | A-2005-128509 | 5/2005 |
| JP | A-2005-146252 | 6/2005 |
| JP | A-2007-178974 | 7/2007 |
| JP | A-2007-226170 | 9/2007 |
| JP | A-2007-302873 | 11/2007 |
| JP | A-2008-083668 | 4/2008 |
| JP | A-2008-203364 | 9/2008 |
| JP | A-2008-216530 | 9/2008 |
| JP | A-2008-309929 | 12/2008 |
| JP | A-2009-14816 | 1/2009 |
| JP | A-2009-30007 | 2/2009 |
| JP | A-2009-098639 | 5/2009 |
| JP | A-2010-085878 | 4/2010 |
| WO | WO 00/01684 | 1/2000 |

OTHER PUBLICATIONS

Brunsvold et al., "Evaluation of a Deep UV Bilayer Resist for Sub-Half Micron Lithography," SPIE, vol. 1925 (1993); pp. 377-387.
Hatekeyama et al., "Investigation of Discrimination Enhancement in Polysilsesquioxane Based Positive Resist for ArF Lithography," SPIE, vol. 3333 (1998), pp. 62-72.

(Continued)

*Primary Examiner* — John Chu
(74) *Attorney, Agent, or Firm* — Oliff PLC

(57) ABSTRACT

There is disclosed a thermosetting silicon-containing antireflection film-forming composition, to form a silicon-containing antireflection film in a multilayer resist process used in a lithography, wherein the composition is at least capable of forming—on an organic film that is an underlayer film having a naphthalene skeleton—a silicon-containing antireflection film whose refractive index "n" and extinction coefficient "k" at 193 nm satisfy the following relationship: $2n-3.08 \leq k \leq 20n-29.4$ and $0.01 \leq k \leq 0.5$. There can be provided, in a multilayer resist process used in a lithography, a thermosetting silicon-containing antireflection film-forming composition to form a silicon-containing antireflection film which can form an excellent pattern having depressed reflection of an exposing light at the time when a photoresist film is formed on the silicon-containing antireflection film formed on an organic film having a naphthalene skeleton as a resist underlayer film and subsequently a resist pattern is formed; has excellent dry etching properties between the photoresist film—which is the upperlayer of the silicon-containing antireflection film—and the organic film—which is the underlayer—; and has an excellent storage stability, and a substrate having the silicon-containing antireflection film from the composition for forming the silicon-containing antireflection film, and a patterning process using the same.

10 Claims, 1 Drawing Sheet

(56) References Cited

OTHER PUBLICATIONS

Schaedeli et al., "Evaluation of Materials for 193-nm Lithography," Journal of Photopolymer Science and Technology, vol. 9, No. 3 (1996), pp. 435-446.

Moran et al., "High Resolution, Steep Profile Resist Pattenrs," J. Vac. Sci. Technol., 16(6), Nov./Dec. 1979, pp. 1620-1624.

Japanese Office Action issued in Application No. 2009-114666; Dated Jan. 17, 2012 (With Partial Translation).

* cited by examiner

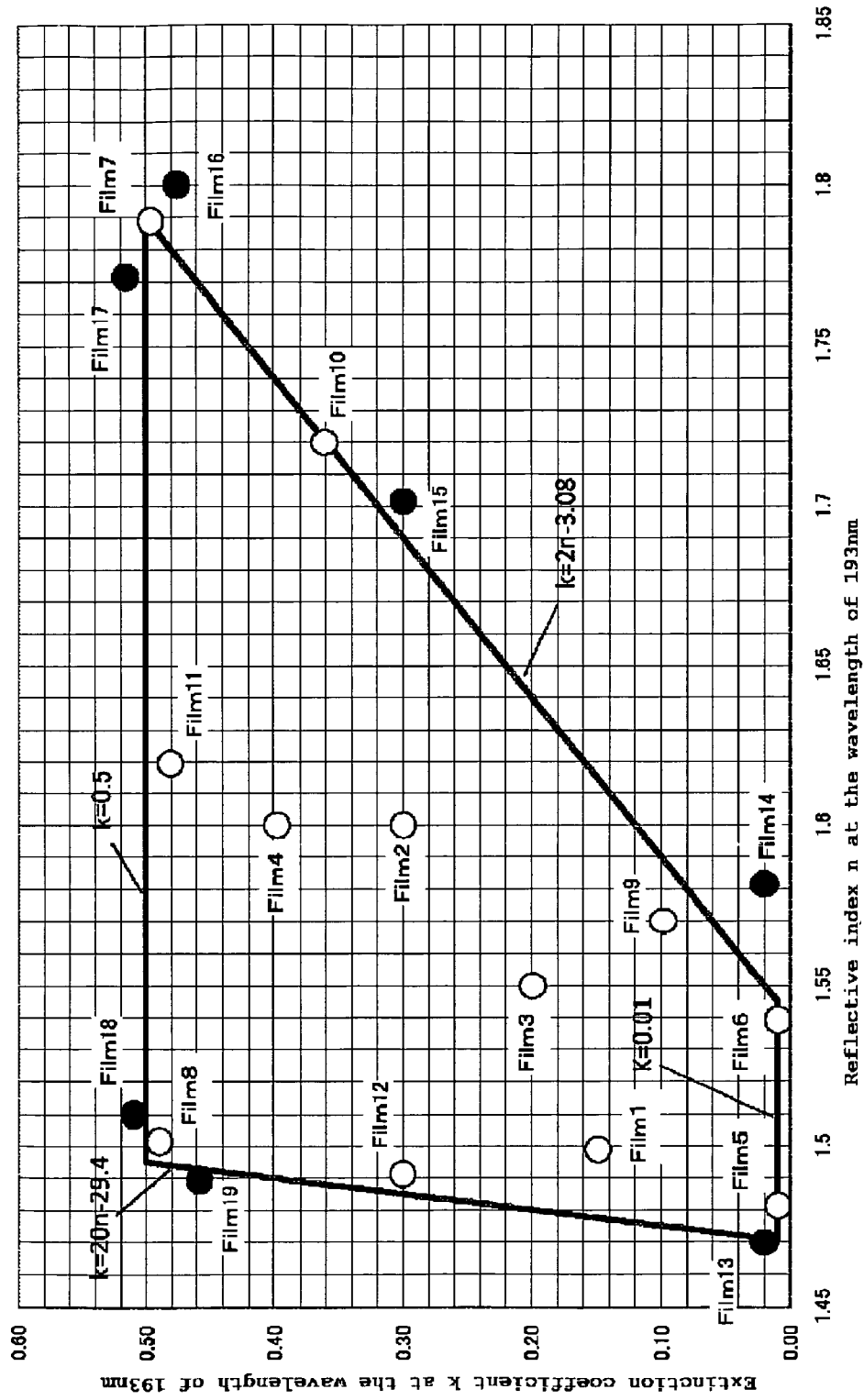

COMPOSITION FOR FORMING A SILICON-CONTAINING ANTIREFLECTION FILM, SUBSTRATE HAVING THE SILICON-CONTAINING ANTIREFLECTION FILM FROM THE COMPOSITION AND PATTERNING PROCESS USING THE SAME

BACKGROUND OF THE INVENTION

1. Field of the Invention

The present invention relates to a thermosetting silicon-containing antireflection film-forming composition to form a silicon-containing antireflection film used as an intermediate layer of a multilayer resist process used in a fine processing of a semiconductor device manufacturing and the like; a substrate having the silicon-containing antireflection film from the composition; and a patterning process using the same.

2. Description of the Related Art

With highly integrated LSI's providing highly increased speeds, finer pattern rules are being rapidly promoted. Commensurately with the fineness, the lithography technique has attained formation of fine patterns, by virtue of light sources of shorter wavelengths and resist compositions appropriately selected therefor. The main role thereof was played by positive photoresist compositions to be each used as a monolayer. The monolayer positive photoresist composition is configured to possess, in a resist resin, a frame having an etching resistance against dry etching by chlorine-based or fluorine-based gas plasma, and to possess such a resist mechanism that an exposed portion is made dissolvable, so that the exposed portion is dissolved to thereby form a pattern, and the remaining resist pattern is used as an etching mask to dry etch a processing substrate coated with the resist composition.

However, when a pattern is made finer, i.e., pattern rules are further narrowed while keeping a thickness of a used photoresist film as it is, the photoresist film is deteriorated in resolution performance. Further, when the photoresist film is to be developed by a developer to form a pattern, a so-called aspect ratio thereof is made excessively large, thereby resultingly causing a pattern collapse. Thus, the fineness has been accompanied by decrease in photoresist film thickness.

Meanwhile, although for processing of a processing substrate, there is typically used a method for processing the substrate by dry etching by adopting a patterned photoresist film as an etching mask, practically no dry etching methods exist to exhibit a complete etching selectivity between a photoresist film and a processing substrate, so that the resist film is also damaged during processing of the substrate and the resist film is collapsed, thereby failing to accurately transfer a resist pattern onto the processing substrate. Thus, with finer patterns, resist compositions have been required to have higher dry etching resistances.

Further, since shortened wavelengths of exposure have demanded that resins having lower light absorption at exposure wavelengths are used for photoresist compositions, such resins have been subjected to a transitional history from a novolak resin, through polyhydroxystyrene, and to a resin having an aliphatic polycyclic frame, commensurately with a transitional history from i-beam, through KrF, and to ArF. However, etching speeds under the dry etching condition have been practically made higher, so that recent photoresist compositions having higher resolutions practically tend to be rather lowered in etching resistance.

This kind of thing inevitably obliges a processing substrate to be dry etched by a photoresist film which is thinner and weaker in etching resistance, thereby making it urgent to ensure a material and a process in this processing state.

As one method to solve such a problem, multi-layer resist process have been used. The methods are configured to: interpose an intermediate film having an etching selectivity different from that of a photoresist film, i.e., a resist upper layer film, between the resist upper layer film and a processing substrate; obtain a pattern in the resist upper layer film; thereafter transfer the pattern to the resist intermediate film by dry etching by using the obtained resist upper layer film pattern as a dry etching mask; and further transfer the pattern onto the processing substrate by dry etching by using the obtained pattern of the intermediate film as a dry etching mask.

Several process are known as to the multilayer resist process. For example, in the case that a pattern with a high aspect ratio is formed on a substrate having steps, a two-layer resist process is known to be excellent. In this two-layer resist process, it is necessary to use a silicone polymer having a hydrophilic group such as a hydroxyl group and a carboxyl group as the resist material in order to develop a formed two-layer resist film by a generally used alkaline developer.

As the silicone-type chemically amplified positive resist used in this two-layer resist process, a silicone-type chemically amplified positive resist composition for a KrF excimer laser, for example, the composition using a base resin—obtained by protecting a part of the phenolic hydroxide group of a polyhydroxybenzyl silsesquioxane (a stable alkaline-soluble silicone polymer) by a t-Boc group—in combination with an acid generator, has been proposed (see for example, Japanese Patent Laid Open (kokai) No. H6-118651, SPIE vol. 1925 (1993) P. 377, and so on). As for an ArF excimer laser, a positive resist composition based on a type of a silsesquioxane whose cyclohexyl carboxylic acid is substituted with an acid labile group has been proposed (see for example, Japanese Patent Laid Open (kokai) No. H10-324748, Japanese Patent Laid Open (kokai) No. H11-302382, SPIE vol. 3333 (1998), and so on). As for a $F_2$ laser, a positive resist composition based on silsesquioxane having a hexafluoro isopropanol as the soluble group has been proposed (see for example, Japanese Patent Laid Open (kokai) No. 2002-55456 and so on). The foregoing polymer contains as a main chain a polysilsesquioxane having a ladder skeleton obtained by polycondensation of trialkoxy silane or trihalogenated silane. On the other hand, as a base polymer for the resist having a silicon pendant in a side chain, a silicon-containing (meta) acrylate ester polymer has been proposed (see for example, Japanese Patent Laid Open (kokai) No. H9-110938, J. Photopolymer Sci. and Technol. Vol. 9 No. 3 (1996) p. 435-446, and so on).

As the underlayer film of a two-layer resist process, it needs to be a hydrocarbon compound that can be etched by an oxygen gas, while it needs to have a high etching resistance because it serves as a mask when a substrate thereunder is etched. In etching by an oxygen gas, it is necessary to be composed of only a hydrocarbon not containing a silicon atom. Further, in order to improve control of the line width of the upperlayer silicon-containing resist film and to reduce a concavity and a convexity of a pattern side wall formed by a standing wave and collapsing of a pattern as well, an antireflection function is also necessary; specifically the reflection rate from an underlayer film into a resist upperlayer film needs to be depressed to 1% or lower.

A three-layer process—the lamination process of forming, a resist upperlayer film of a monolayer resist not containing a silicon atom, thereunder a resist intermediate layer film containing a silicon atom, and further thereunder a resist underlayer film of an organic film—is proposed as the other multilayer resist process (see, for example, J. Vac. Sci. Technol., 16(6), November/December 1979). In general, a monolayer resist not containing a silicon atom has a higher resolution than a silicon-containing resist, and a resist having a high resolution can be used as an exposure imaging layer in a three-layer process; therefore this is suitable for a fine processing.

As the resist intermediate layer film used immediately underneath the resist upperlayer film, a CVD hard mask and a spin-on-glass (SOG) film are used. Many process for the SOG film have been proposed.

In any of the multilayer resist process, an antireflection function is necessary in order to prohibit formation of a concavity and a convexity formed by a standing wave on a pattern wall and collapsing of a pattern from occurring. For example, an optimum optical constant of the underlayer film to depress a substrate reflection in the three-layer resist process is different from that in the two-layer resist process. Although the object to depress the substrate reflection as low as possible, specifically to 1% or less, is the same in the two-layer resist process and the three-layer resist process, the antireflection effect is given only to the underlayer film in the two-layer resist process while the antireflection effect can be given to any one or both of the intermediate layer film and the underlayer film in the three-layer resist process. For example, a material for silicon-containing layer having the antireflection effect is proposed in U.S. Pat. No. 6,506,497 and U.S. Pat. No. 6,420,088. Generally, the antireflection effect is higher in the antireflection film of a multilayer than in the antireflection film of a monolayer, and thus the former is widely used industrially as the antireflection film of an optical material. Accordingly, a high antireflection effect can be expected by giving the antireflection effect to both of the resist intermediate layer film and the resist underlayer film.

Especially, because the underlayer film used in a most advanced process of semiconductor manufacturing serves as a mask at the time of forming a fine pattern by dry etching, precision pattern-transformation properties and an excellent etching selectivity are necessary. In addition, a material without deformation by an etching gas (a material without a so-called pattern deformation) during serving as a mask at the time of the etching process has been required, and thus the compounds shown in Japanese Patent Laid Open (kokai) No. 2009-14816, and so on, have been proposed. The common feature among these materials is that they have a naphthalene derivative in the main chain.

However, in a multilayer resist process, when a conventional material was used as the material to form the intermediate layer film above the underlayer film having these naphthalene skeletons, the antireflection function could not be expressed fully, thereby failed to satisfactorily depress the reflection of an exposing light. Accordingly, optimization of optical properties of a material for a silicon-containing intermediate layer film has been waited, so that it can be used most appropriately even on the underlayer film having a naphthalene skeleton.

SUMMARY OF THE INVENTION

The present invention was made in view of the situation as mentioned above and has an object, in a multilayer resist process used in a lithography, to provide;

a thermosetting silicon-containing antireflection film-forming composition to form a silicon-containing antireflection film which (1) can form an excellent pattern having depressed reflection of an exposing light at the time when a photoresist film is formed on the silicon-containing antireflection film formed on an organic film having a naphthalene skeleton as a resist underlayer film and subsequently a resist pattern is formed, (2) has excellent dry etching properties between the photoresist film—which is the upperlayer of the silicon-containing antireflection film—and the organic film—which is the underlayer—, and (3) has an excellent storage stability;

a substrate having the silicon-containing antireflection film from the composition for forming the silicon-containing antireflection film; and a patterning process using the same.

The present invention was made to solve the foregoing problems, and provides a thermosetting silicon-containing antireflection film-forming composition, the thermosetting silicon-containing antireflection film-forming composition to form a silicon-containing antireflection film in a multilayer resist process used in a lithography, wherein the composition is at least capable of forming—on an organic film that is an underlayer film having a naphthalene skeleton—a silicon-containing antireflection film whose refractive index "n" and extinction coefficient "k" at 193 nm satisfy the following relationship:

$$2n-3.08 \leq k \leq 20n-29.4 \text{ and } 0.01 \leq k \leq 0.5$$

As mentioned above, when the thermosetting silicon-containing antireflection film-forming composition capable of forming the silicon-containing antireflection film satisfying the following relationship between the refractive index of "n" and the extinction coefficient of "k" at the wavelength of 193 nm is used as the intermediate layer film used on the underlayer film having a naphthalene skeleton in a multilayer resist process, the antireflection function becomes maximum: namely the amount of the reflected light becomes minimum. Accordingly, the reflection of the exposing light can be sufficiently depressed and a wide exposure margin can be obtained; and, in addition, a convex and a convexity of a pattern surface can be made as small as possible.

$$2n-3.08 \leq k \leq 20n-29.4 \text{ and } 0.01 \leq k \leq 0.5$$

In the present invention, it is preferable that the thermosetting silicon-containing antireflection film-forming composition contain a silicon-containing compound obtained by a hydrolysis-condensation of hydrolyzable silicon-containing compounds comprising one or more kinds of a compound represented by the following general formula (A-1) and one or more kinds of a compound represented by the following general formula (A-2).

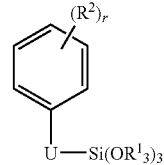

(A-1)

(In the formula, $R^1$ represents an organic group having 1 to 6 carbon atoms; each $R^2$ represents a monovalent organic group having 1 to 30 carbon atoms or a silicon-containing organic group; U represents a single bond or a divalent organic group having 1 to 6 carbon atoms; and "r" represents 1 to 3.)

$$R^{11}{}_{m11}R^{12}{}_{m12}R^{13}{}_{m13}Si(OR)_{(4-m11-m12-m13)} \quad (A\text{-}2)$$

(In the formula, R represents an alkyl group having 1 to 6 carbon atoms; $R^{11}$, $R^{12}$, and $R^{13}$ may be the same or different with each other and represent a hydrogen atom or a monovalent organic group having 1 to 30 carbon atoms; "m11", "m12", and "m13" represent 0 or 1; m11+m12+m13 is 0 to 3; and the formula (A-2) is different from the formula (A-1).)

When the compound like this is used, the thermosetting silicon-containing antireflection film-forming composition of the present invention can be obtained easily.

In addition, when one or more kinds of a compound represented by the general formula (A-2) is contained, a silicon-containing film having excellent properties as an etching mask can be provided. Accordingly, a composition that gives a film not only having an antireflection function but also not causing pattern collapse at the time of pattern transformation by dry etching in a multilayer resist process can be obtained.

In the present invention, it is preferable that the composition contain a silicon-containing compound obtained by mixing the hydrolyzable silicon-containing compound further with one or more kinds of a hydrolyzable compound represented by the following general formula (A-3), and then carrying out a hydrolysis-condensation of the mixture thus obtained.

$$D(OR^3)_{m3}(OR^4)_{m4} \quad (A\text{-}3)$$

(In the formula, $R^3$ and $R^4$ represent an organic group having 1 to 30 carbon atoms; m3+m4 is a valency that can be determined by the kind of D; "m3" and "m4" represent an integer of 0 or more; and D represents an element belonging to a group of III, IV, or V, except for a silicon atom and a carbon atom.)

When a cured film is formed by using a composition containing a silicon-containing compound obtained by a hydrolysis-condensation of a mixture of a silicon compound selected from (A-1) and (A-2) with a compound represented by (A-3), a silicon-containing film having excellent properties as an etching mask can be provided. Accordingly, a composition that gives a film not only having an antireflection function but also causing no pattern collapse at the time of pattern transformation by dry etching in a multilayer resist process can be obtained.

The present invention further provides a substrate comprising at least an organic film having a naphthalene skeleton formed on a processing substrate, a silicon-containing antireflection film formed on the organic film by using the thermosetting silicon-containing antireflection film-forming composition, and a photoresist film formed on the silicon-containing antireflection film. In addition, provided is a substrate, wherein a resist top coat is further formed on the photoresist film.

As mentioned above, when a substrate—having a three-layered resist film comprising an organic film having a naphthalene skeleton, a silicon-containing antireflection film formed from the thermosetting silicon-containing antireflection film-forming composition of the present invention, and a photoresist film—is used to form a pattern by a lithography, a fine pattern with a high precision can be formed on the substrate. In addition, when a resist top coat is formed further on the photoresist film, a surface of the resist film can be protected at the time of an immersion exposure; thus a pattern with a higher precision can be formed.

The present invention provides a patterning process, on a substrate by a lithography, wherein forming a silicon-containing antireflection film from the thermosetting silicon-containing antireflection film-forming composition is formed on an organic film having a naphthalene skeleton formed on a processing substrate;

forming a photoresist film on the silicon-containing antireflection film, and subsequently exposing a pattern circuit region in the photoresist film;

a resist film pattern is formed on the photoresist film by developing by a developer;

dry-etching the silicon-containing antireflection film by using the obtained resist film pattern as an etching mask;

etching the organic film by using the obtained silicon-containing antireflection film pattern as an etching mask; and etching the substrate by using the organic film having the formed pattern as a mask, to form the pattern on the substrate.

With the patterning process that uses a three-layer resist process like this, a fine pattern with a high precision can be formed on a substrate.

In the foregoing patterning process, it is preferable that, after a photoresist film is formed on the silicon-containing antireflection film, a top coat be formed further on the photoresist film.

When a top coat is formed further on a photoresist film, a pattern with a higher precision can be formed because a surface of the resist film can be protected at the time of an immersion exposure.

As explained above, by using the thermosetting silicon-containing antireflection film-forming composition of the present invention, a silicon-containing antireflection film, which (1) can form an excellent pattern because of depressed reflection of an exposure light at the time when a photoresist film is formed on a silicon-containing antireflection film formed on an organic film having a naphthalene skeleton as the resist underlayer film and subsequently the resist pattern is formed, (2) has excellent dry etching properties between the photoresist film—which is the upperlayer of the silicon-containing antireflection film—and the organic film—which is the underlayer—, and (3) has an excellent storage stability, can be formed in a multilayer resist process used in a lithography.

BRIEF DESCRIPTION OF THE DRAWINGS

FIG. 1 is a drawing which shows a relationship between refractive index "n" and extinction coefficient "k" at the wavelength of 193 nm in Examples and Comparative Examples of the present invention.

DETAILED DESCRIPTION OF THE PREFERRED EMBODIMENTS

Hereinafter, the present invention will be described more specifically.

As mentioned above, in an underlayer film used in the most advanced semiconductor processing, a material having a naphthalene derivative in a main chain is used as the material having high precision pattern-transformation properties and an excellent etching selectivity, and, in addition, not causing deformation by an etching gas (pattern deformation) while functioning as a mask at the time of etching process. However, a conventional silicon-containing material for an intermediate layer did not assume a simultaneous use with the underlayer film having a naphthalene skeleton like this; and thus, when a conventional silicon-containing material for an intermediate layer is applied to a multi-layer resist process, the antireflection function could not be fully expressed, thereby failed in depressing the reflection of an exposing light fully.

Therefore, inventors of the present invention investigated extensively the lithography properties and a stability of a thermosetting silicon-containing antireflection film-forming composition to form a silicon-containing antireflection film on an underlayer film having a naphthalene skeleton in a multilayer resist process used in a lithography. As a result, the present inventors found optical properties of a resist intermediate film that can express a maximum antireflection function even on the underlayer film having a naphthalene skeleton, and further found a composition capable of realizing these optical properties, thereby succeeded in accomplishing the present invention.

Namely, the present invention provides a thermosetting silicon-containing antireflection film-forming composition, to form a silicon-containing antireflection film in a multilayer resist process used in a lithography, wherein the composition is at least capable of forming—on an organic film as an underlayer film having a naphthalene skeleton—a silicon-containing antireflection film whose refractive index "n" and extinction coefficient "k" at 193 nm satisfy the following relationship:

$2n-3.08 \leq k \leq 20n-29.4$ and $0.01 \leq k \leq 0.5$

The following relationship of the present invention will be explained by using a figure.

$2n-3.08 \leq k \leq 20n-29.4$ and $0.01 \leq k \leq 0.5$

In FIG. 1 is shown the relationship between the refractive index "n" and the extinction coefficient "k" at 193 nm of an intermediate layer film formed on an organic film as an underlayer film having a naphthalene skeleton.

White plots in FIG. 1 show the refractive index "n" and the extinction coefficient "k" at the wavelength of 193 nm of the intermediate layer film whose antireflection function is fully expressed even when the organic film having a naphthalene skeleton is used as the underlayer film. Black plots show the refractive index "n" and the extinction coefficient "k" at the wavelength of 193 nm of the intermediate layer film whose antireflection function is not fully expressed thereby failing in depressing the reflection of an exposing light fully when the organic film having a naphthalene skeleton is used as the underlayer film.

In the present invention, a trapezoidal relationship as shown in FIG. 1, namely the following relationship of the present invention, was derived from critical points of these white and black plots.

$2n-3.08 \leq k \leq 20n-29.4$ and $0.01 \leq k \leq 0.5$

In other words, inventors of the present invention found that, —in the case that an organic film having a naphthalene skeleton is used as the underlayer film in a multilayer resist process—, when an intermediate layer film whose refractive index "n" and extinction coefficient "k" at 193 nm satisfy the following relationship, the antireflection function becomes maximum, namely the amount of the reflecting light becomes minimum.

$2n-3.08 \leq k \leq 20n-29.4$ and $0.01 \leq k \leq 0.5$

When the refractive index "n" and the extinction coefficient "k" at the wavelength of 193 nm are in this area ($2n-3.08 \leq k \leq 20n-29.4$), the reflection of an exposing light is fully depressed as mentioned above; and thus a wide exposure margin can be obtained and the concavity and the convexity of the pattern surface can be made as small as possible. It is also possible to prevent the pattern fall or the pattern collapse from occurring. When the extinction coefficient is 0.01 or more, the exposing light can be absorbed efficiently; thus an antireflection effect can be obtained. When the extinction coefficient is 0.5 or less, the amount of an organic substituent group introduced as a light-absorbing group is not excessively large, and so is the amount of the carbon component in a silicon-containing film. Accordingly, there is also no deterioration of the etching selectivity, which is a property necessary to the silicon-containing film.

The thermosetting silicon-containing antireflection film-forming composition to form a silicon-containing antireflection film whose refractive index and extinction coefficient at 193 nm satisfy the following relationship can be obtained easily by using a silicon-containing compound obtained by a hydrolysis-condensation of a monomer (hydrolyzable silicon compound) having a certain light-absorbing group.

$2n-3.08 \leq k \leq 20n-29.4$ and $0.01 \leq k \leq 0.5$

The manufacturing process of a preferable silicon-containing compound can be exemplified by the following process, though not limited to them.

A compound represented by the following general formula (A-1) can be exemplified as one of the monomer.

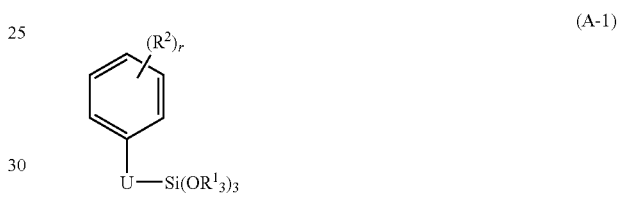

(A-1)

(In the formula, $R^1$ represents an organic group having 1 to 6 carbon atoms; each $R^2$ represents a monovalent organic group having 1 to 30 carbon atoms or a silicon-containing organic group; U represents a single bond or a divalent organic group having 1 to 6 carbon atoms; and "r" represents 1, 2 or 3.)

Herein, the term "organic group" means a group which includes carbon and which may additionally include hydrogen, as well as nitrogen, oxygen, sulfur, silicon and the like (hereinafter, this term means the same).

As a compound represented by the general formula (A-1), following compounds are specifically exemplified.

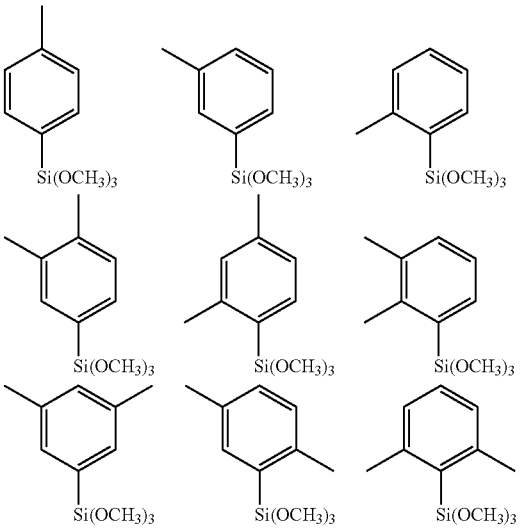

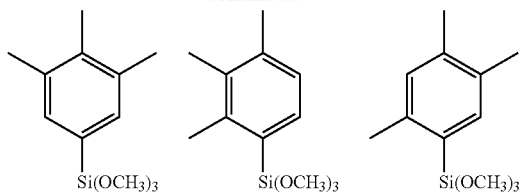
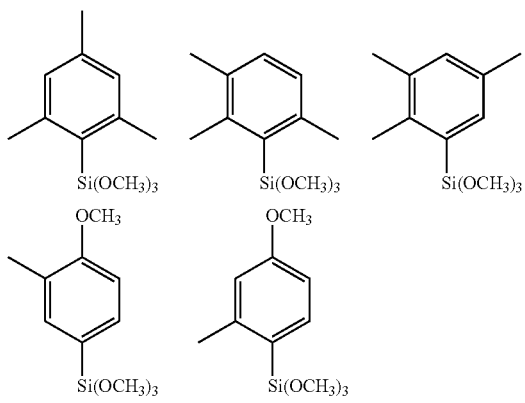
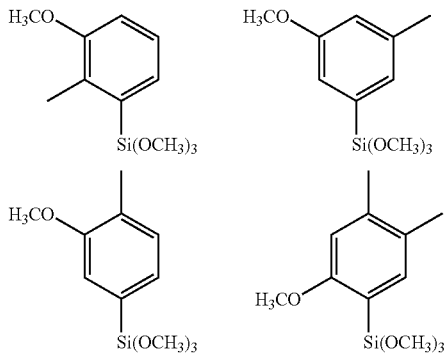
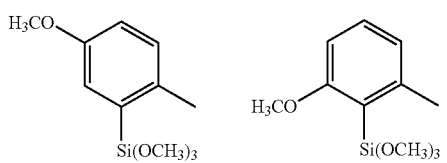
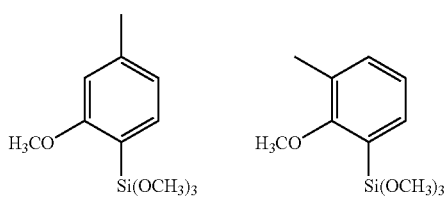
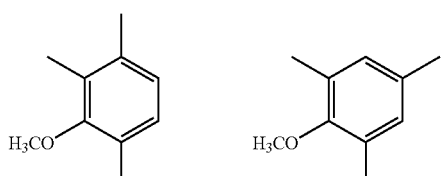
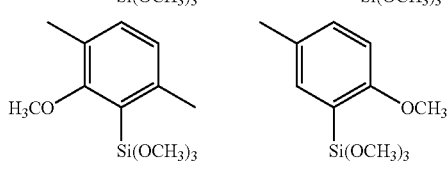
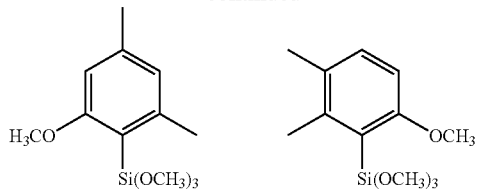
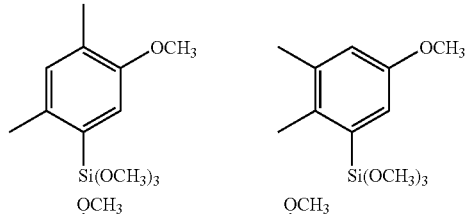
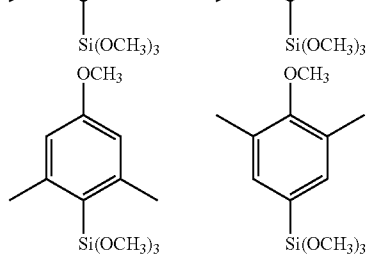
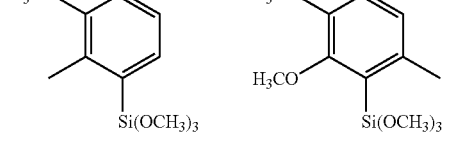
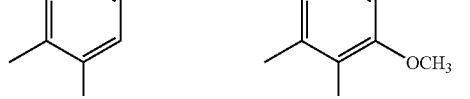
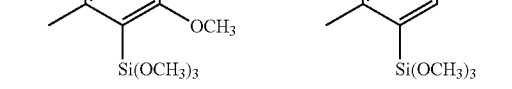

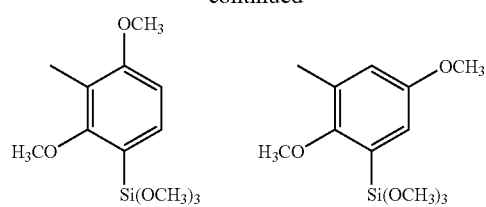
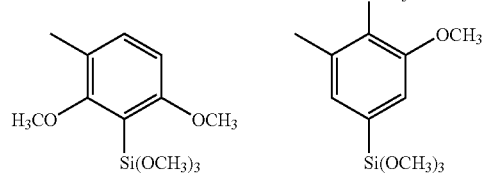
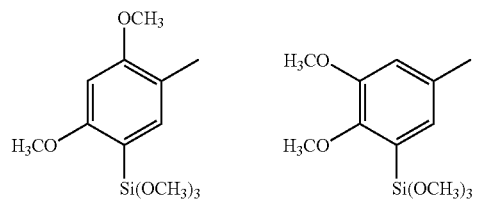
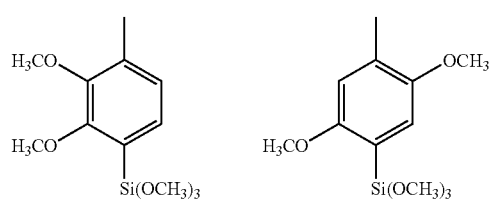
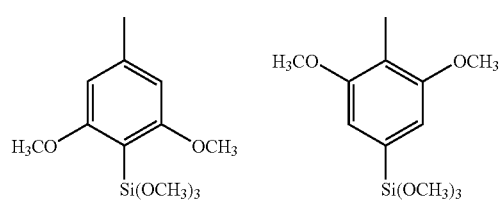
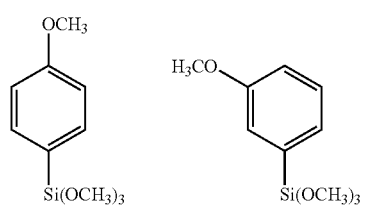
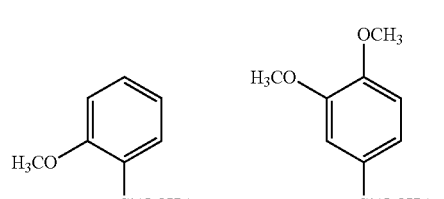
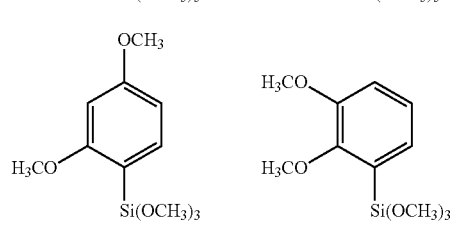
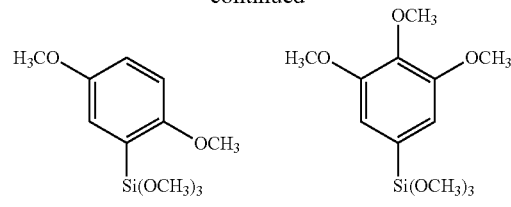
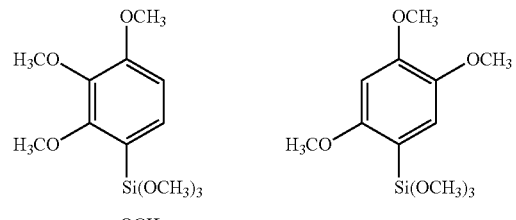
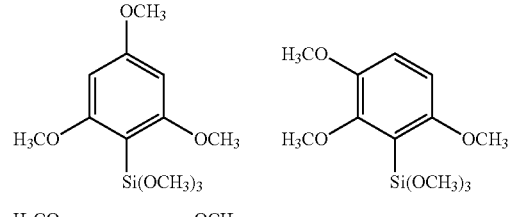
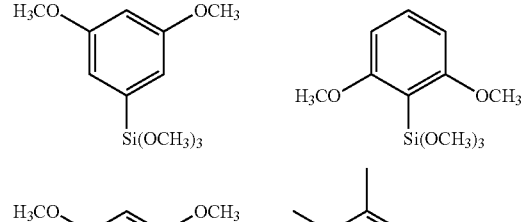
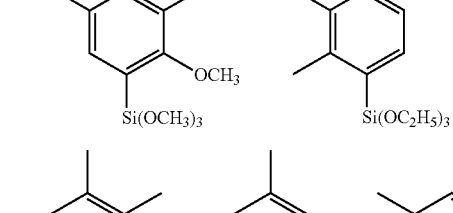
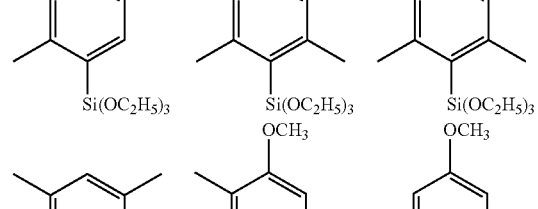
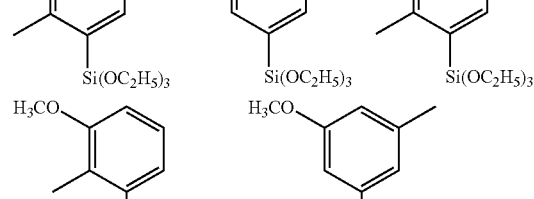
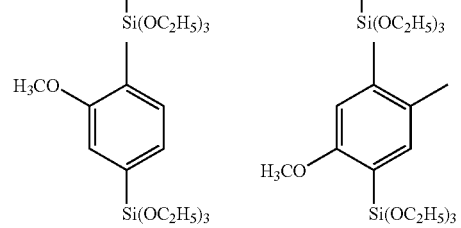

-continued
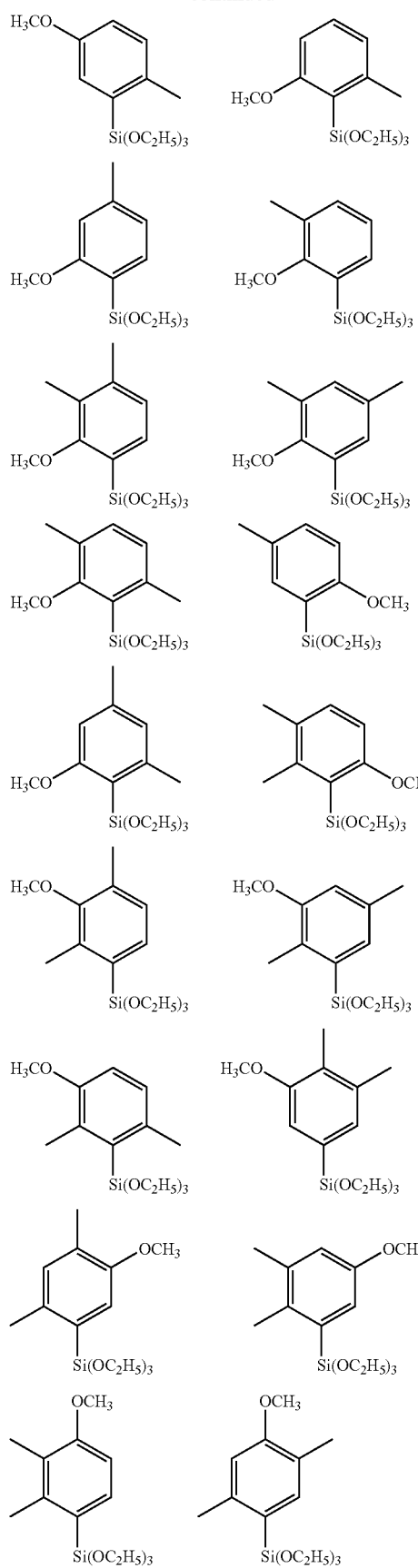
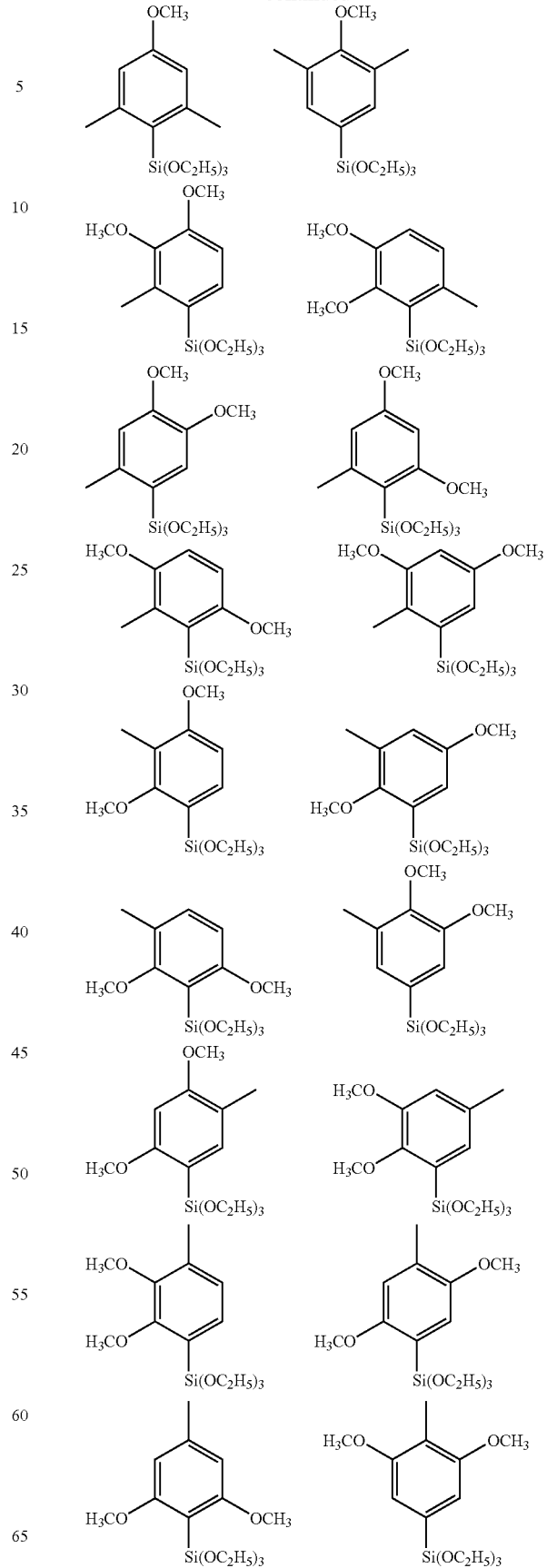

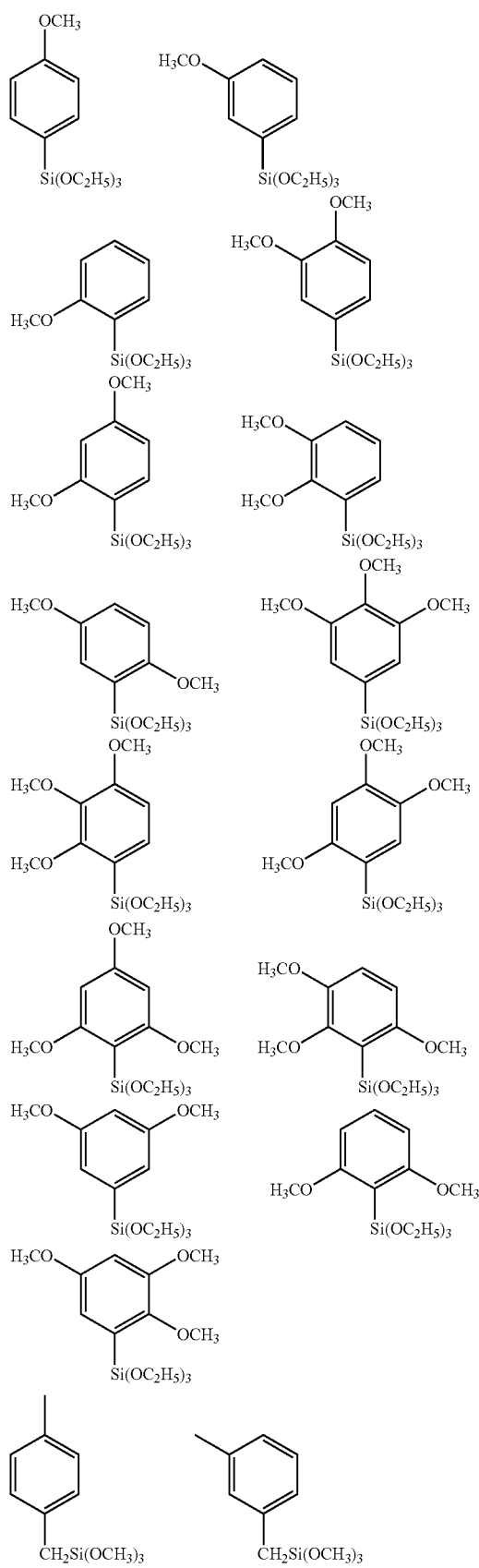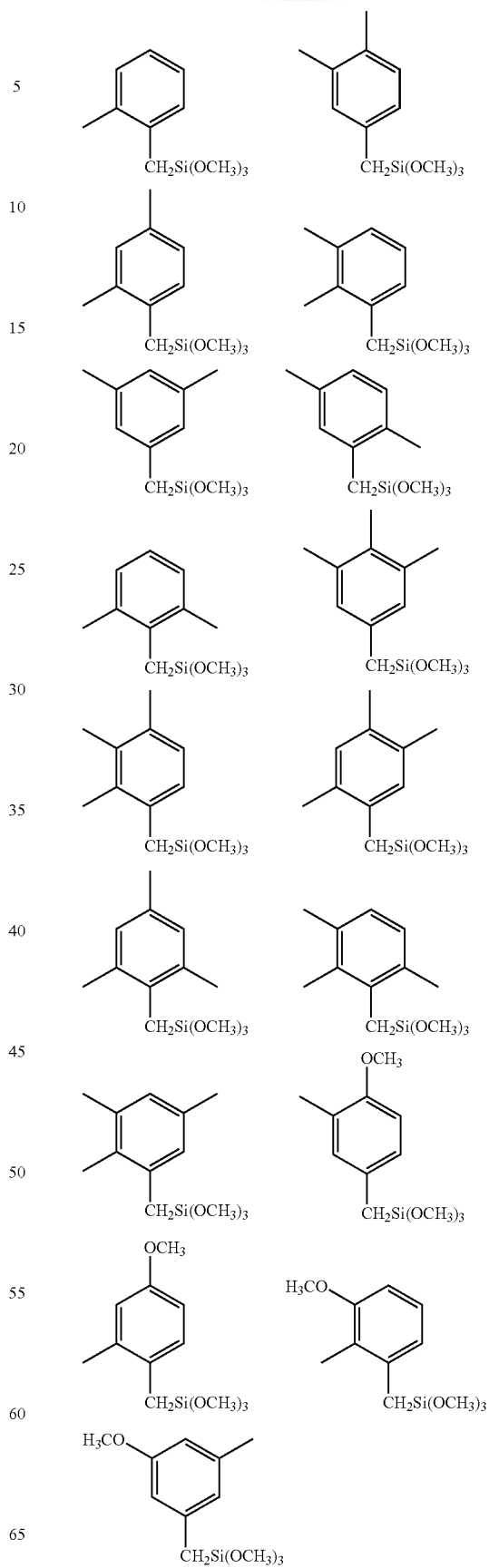

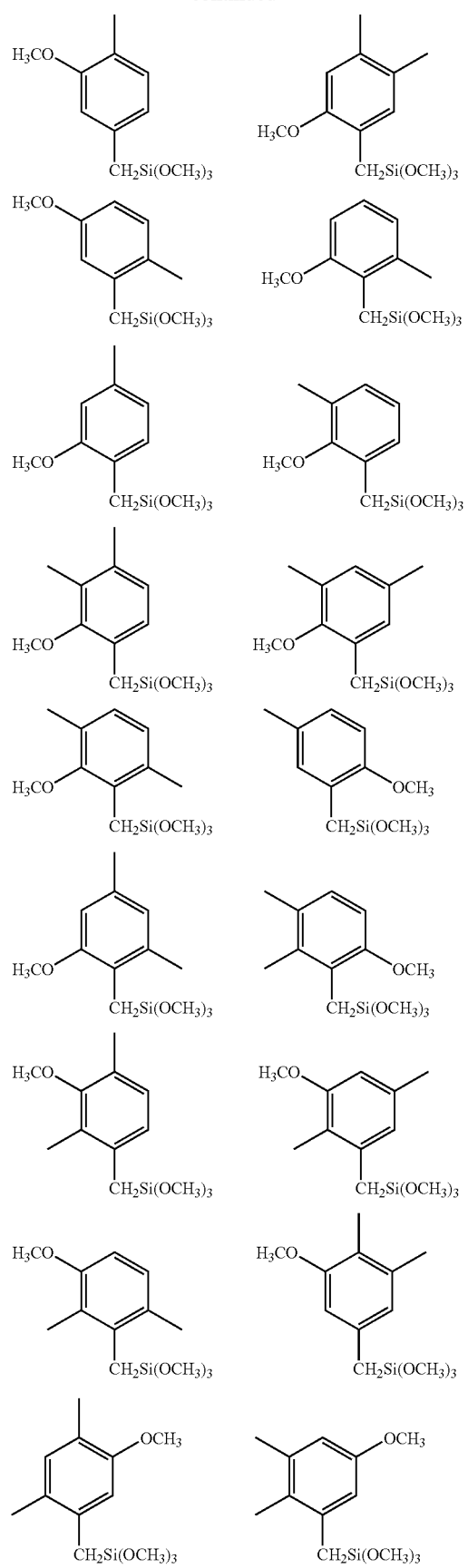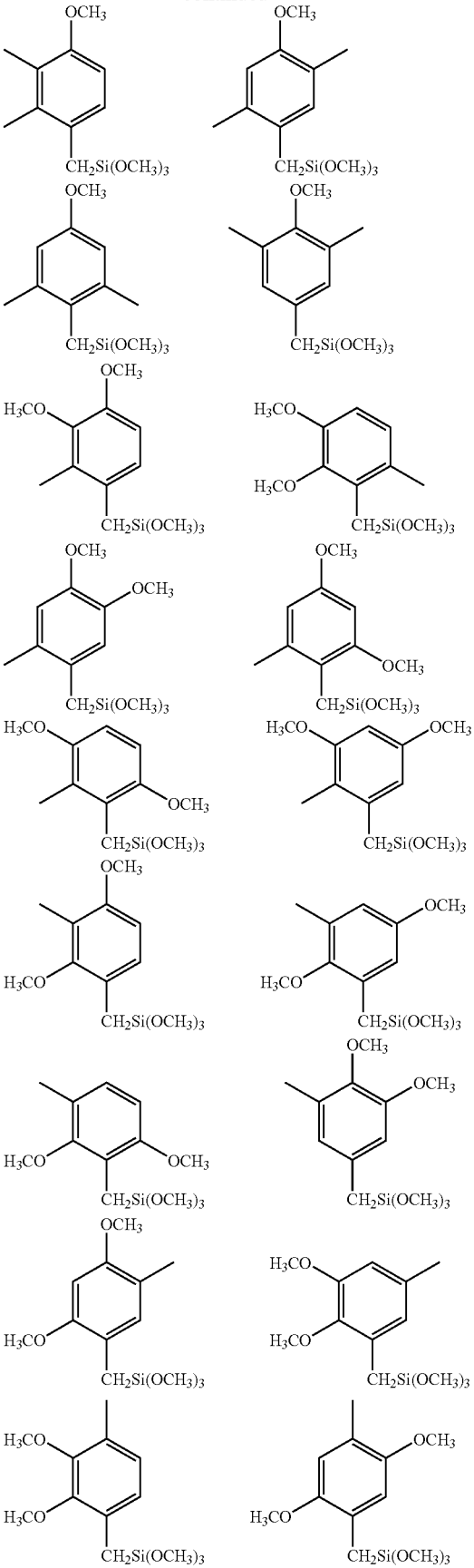

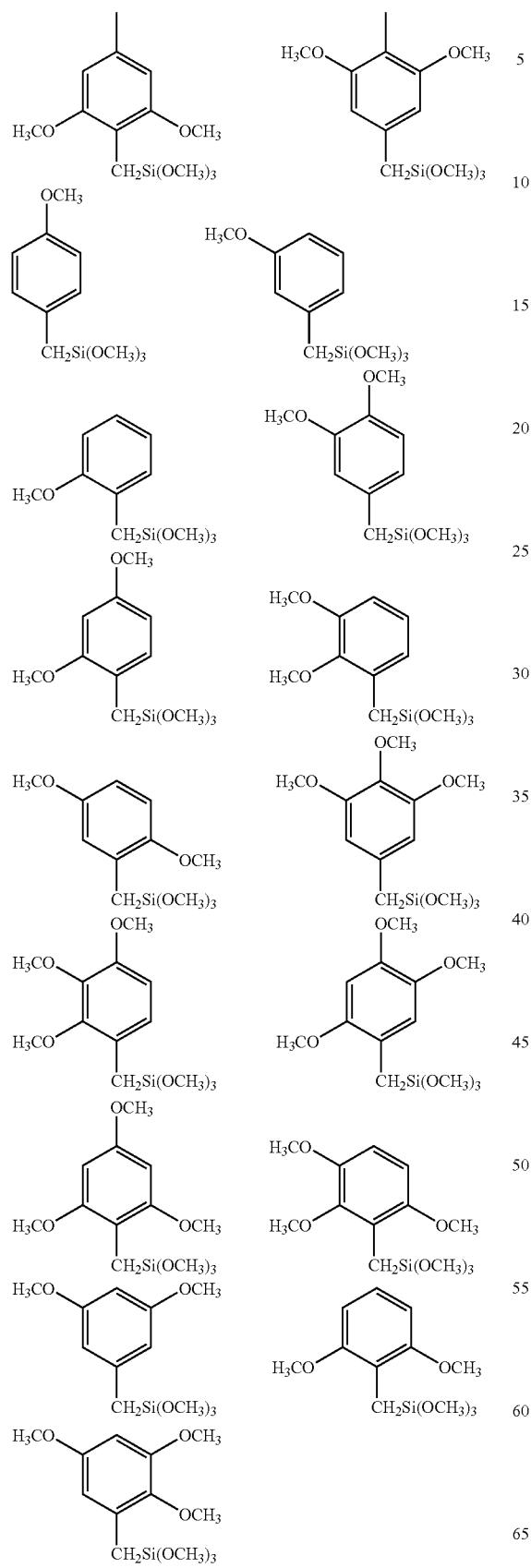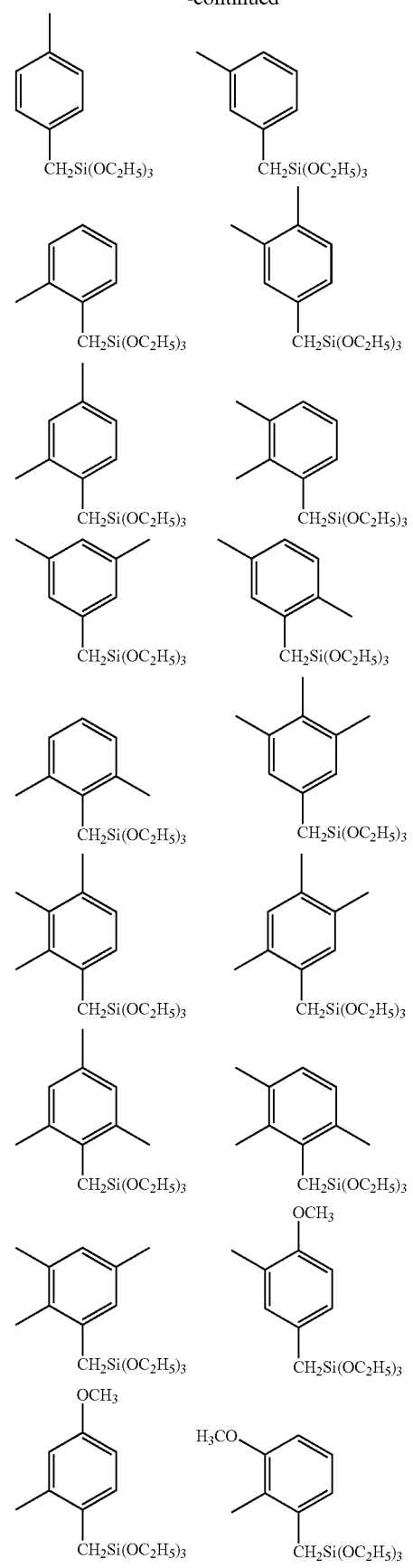

-continued
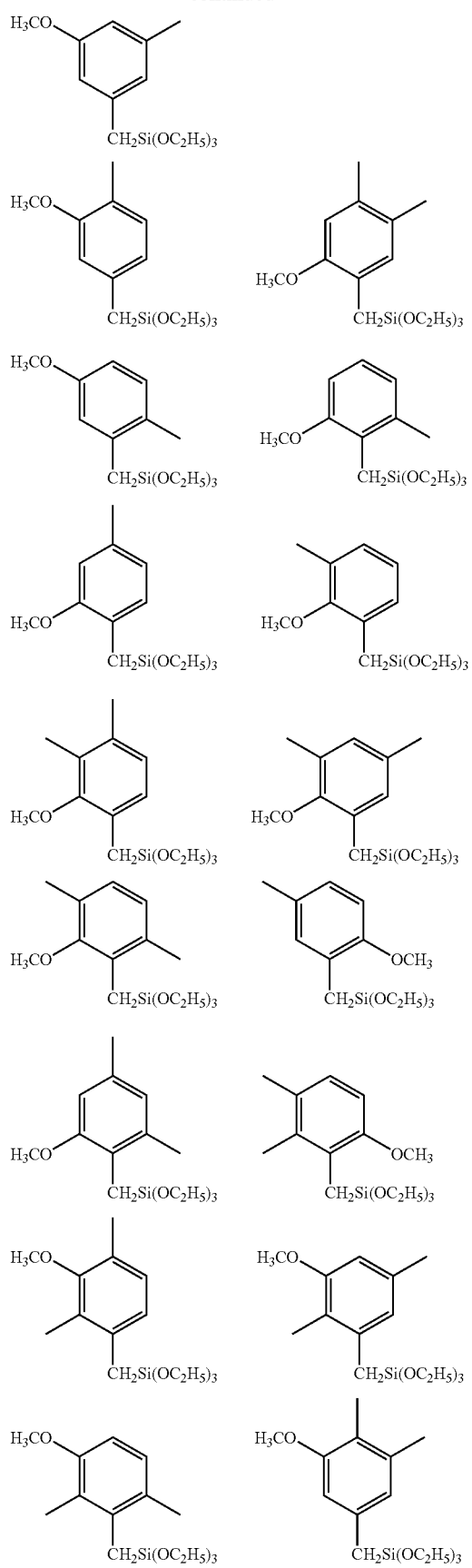
-continued
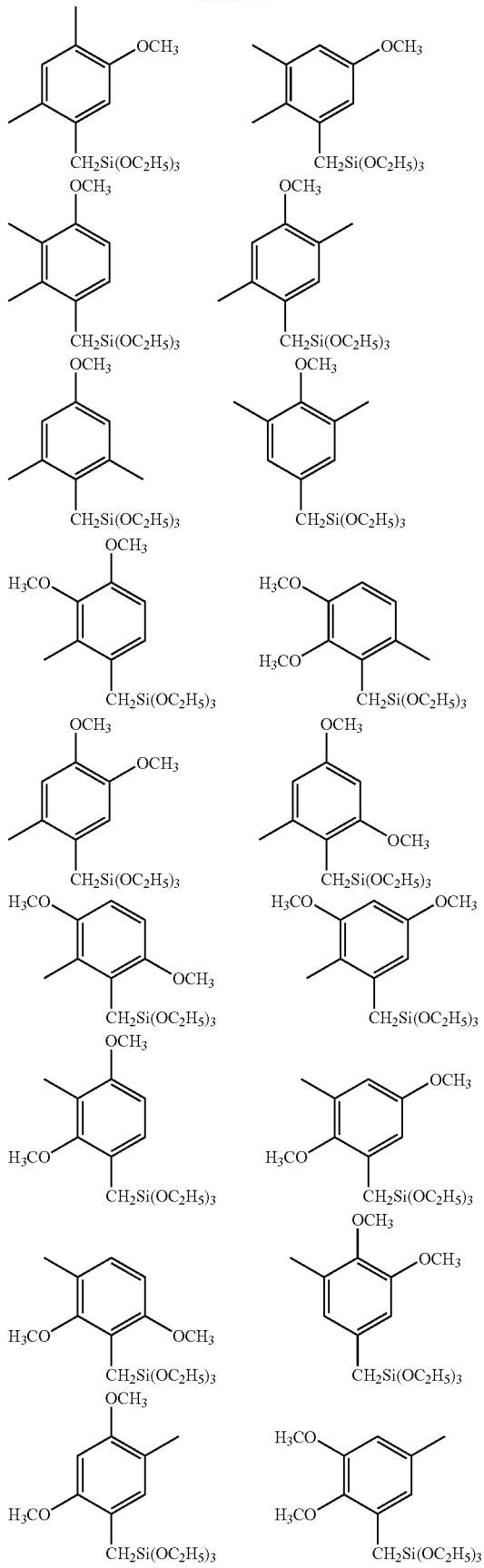

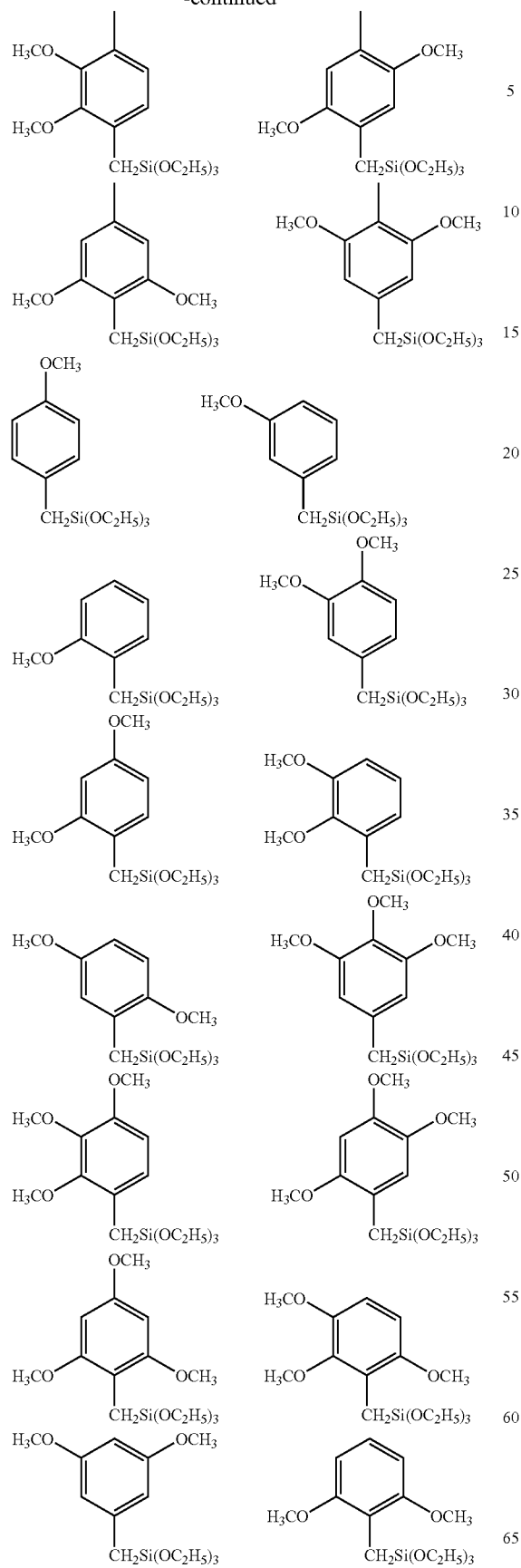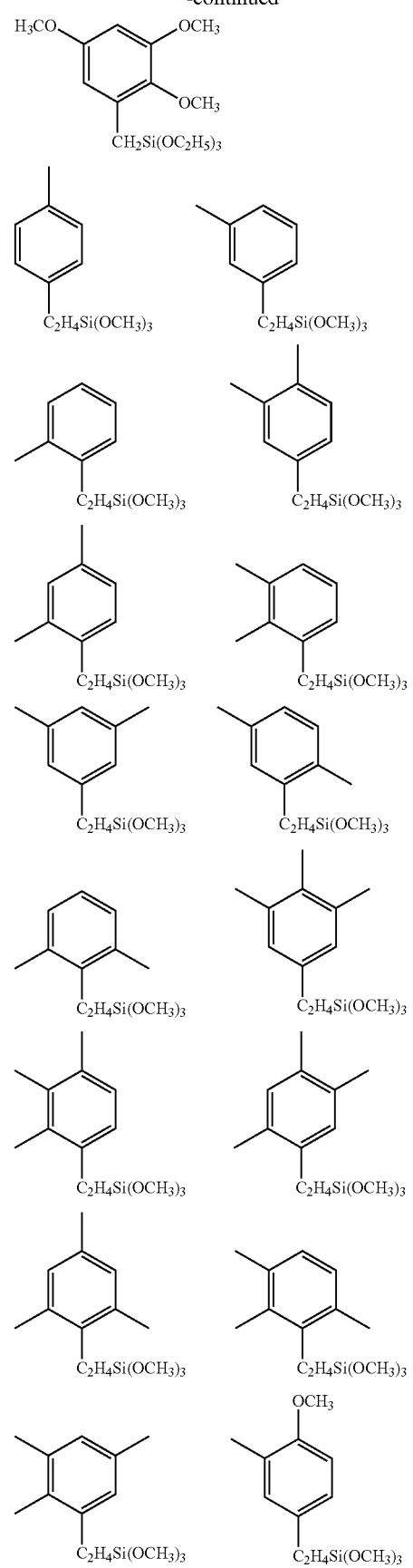

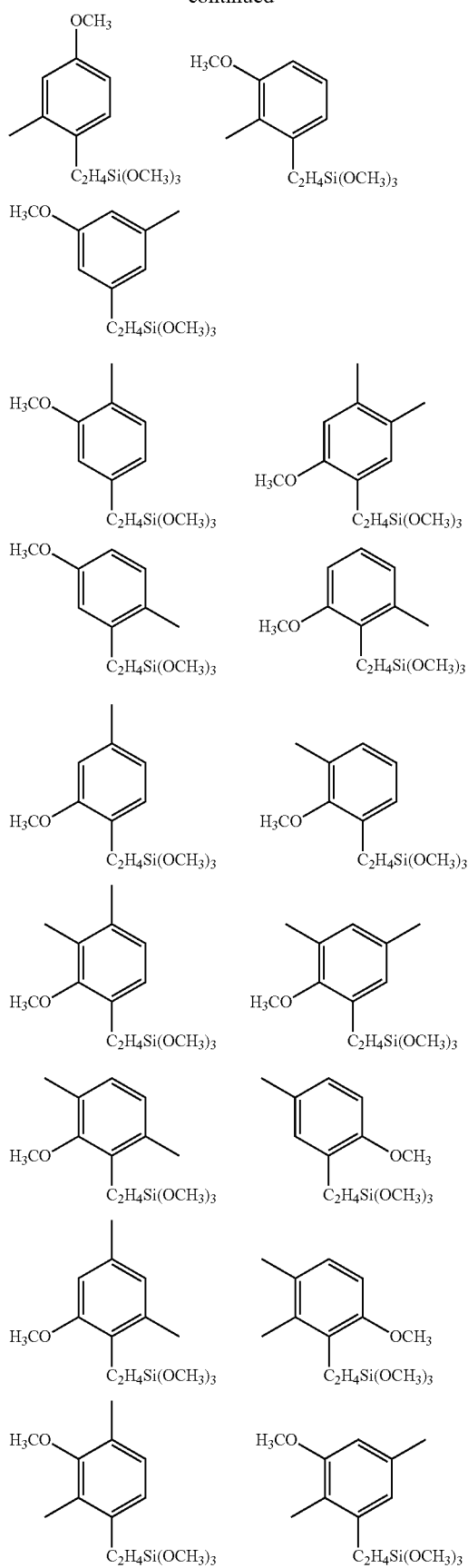
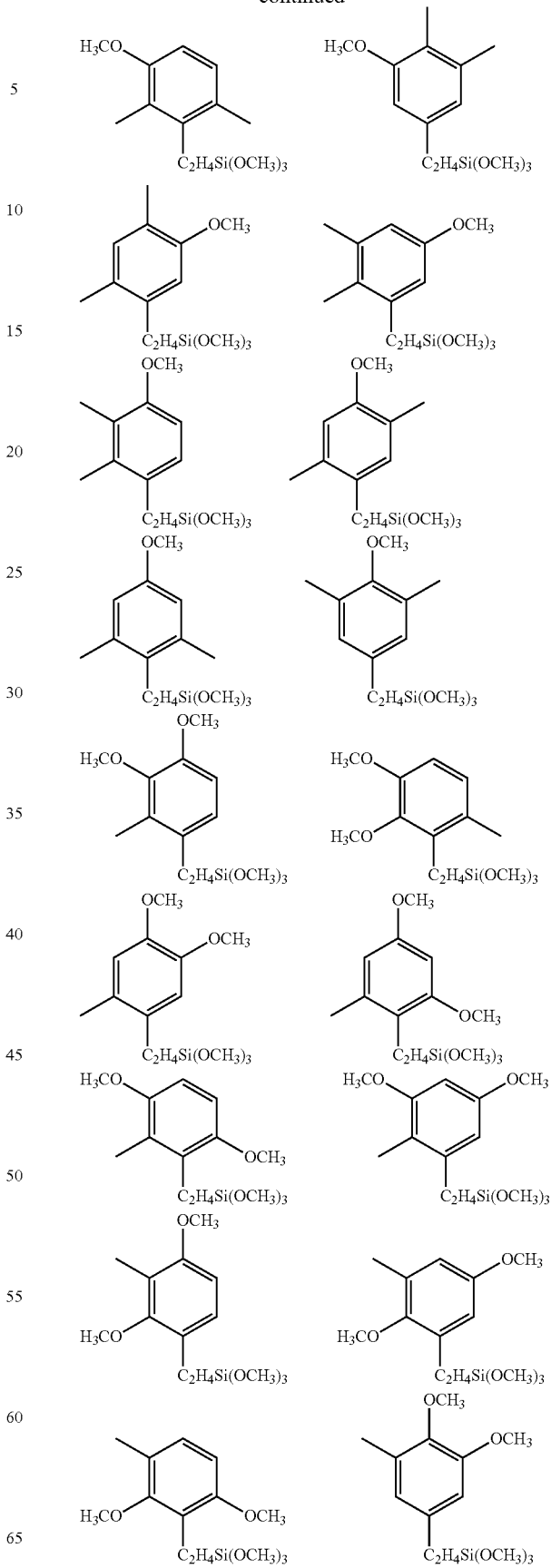

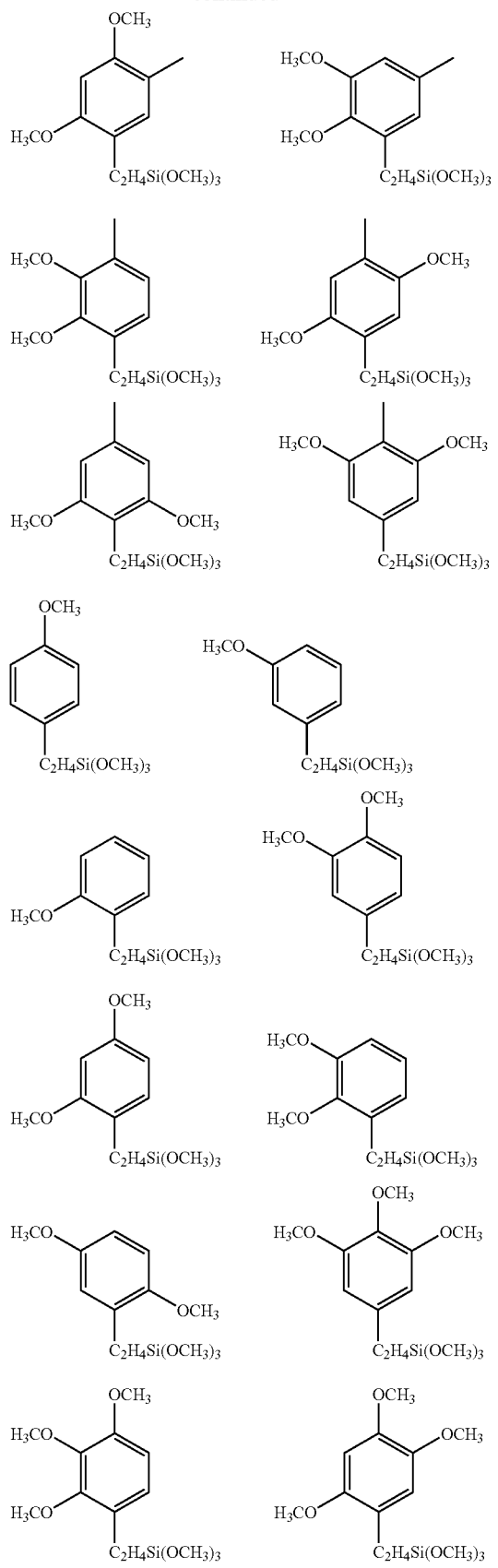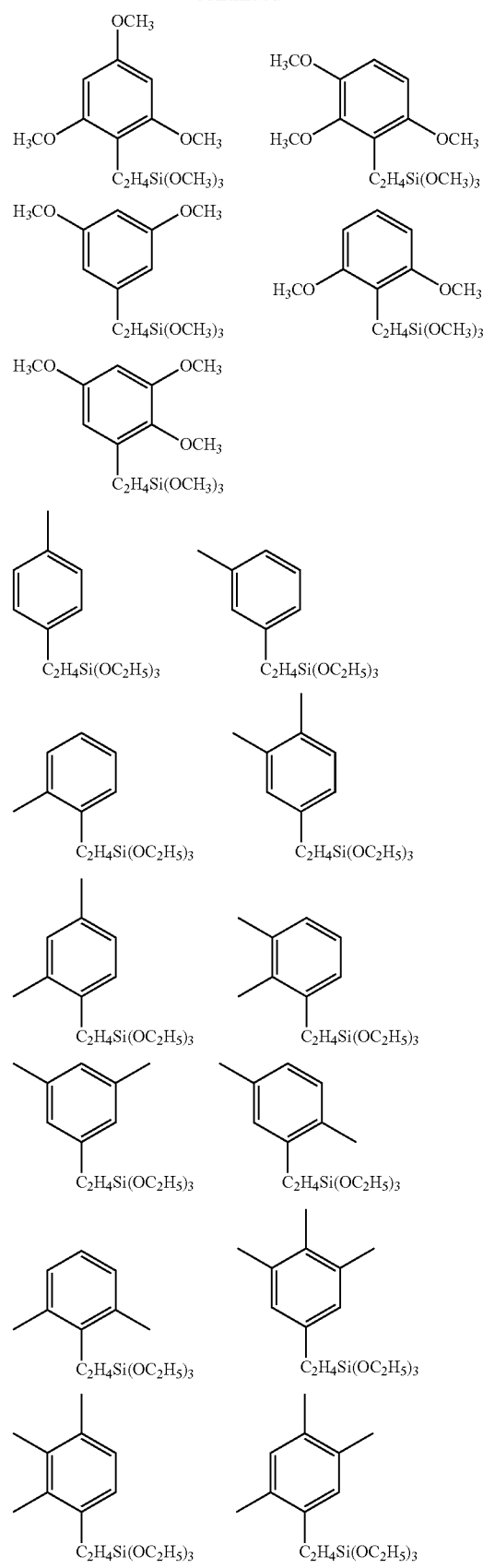

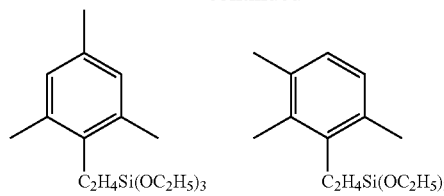
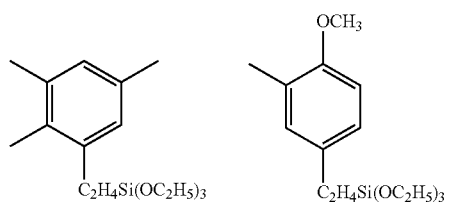
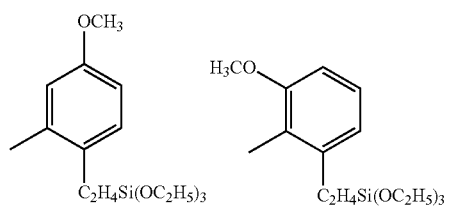
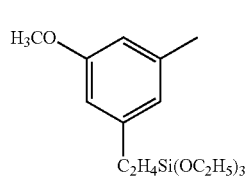
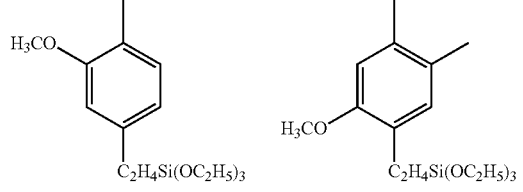
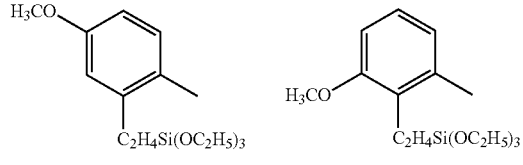
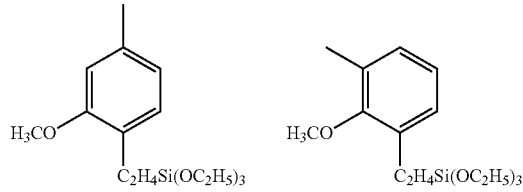
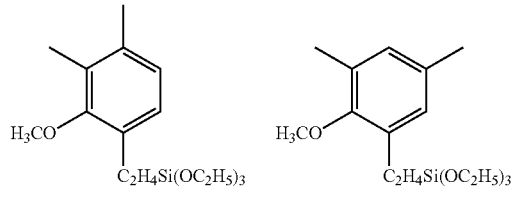
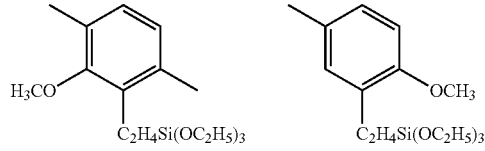
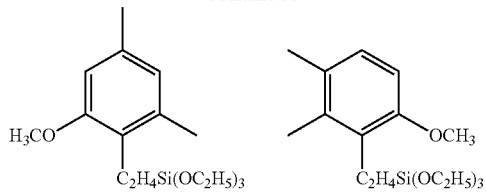
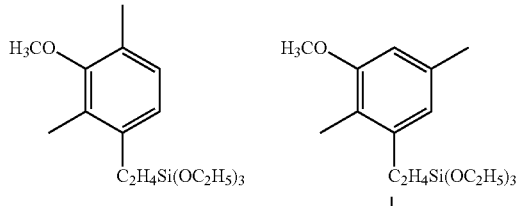
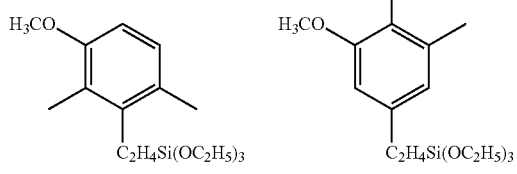
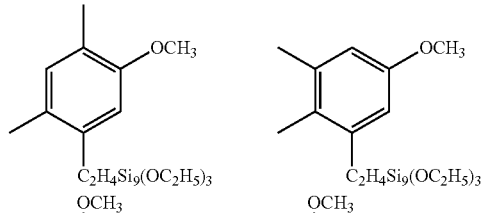
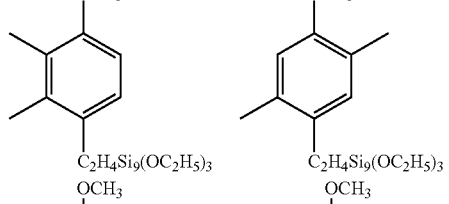
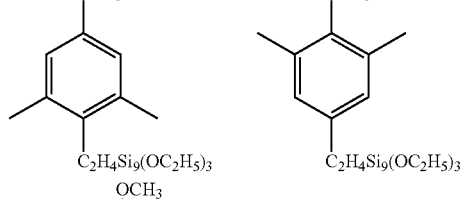
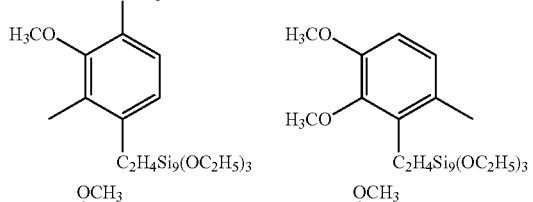
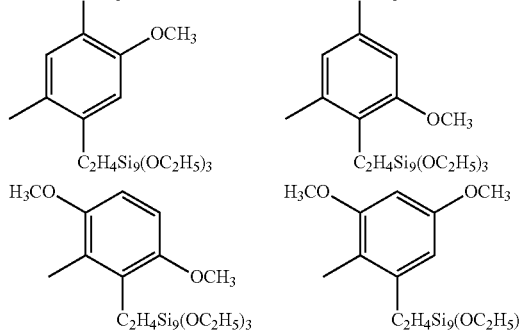

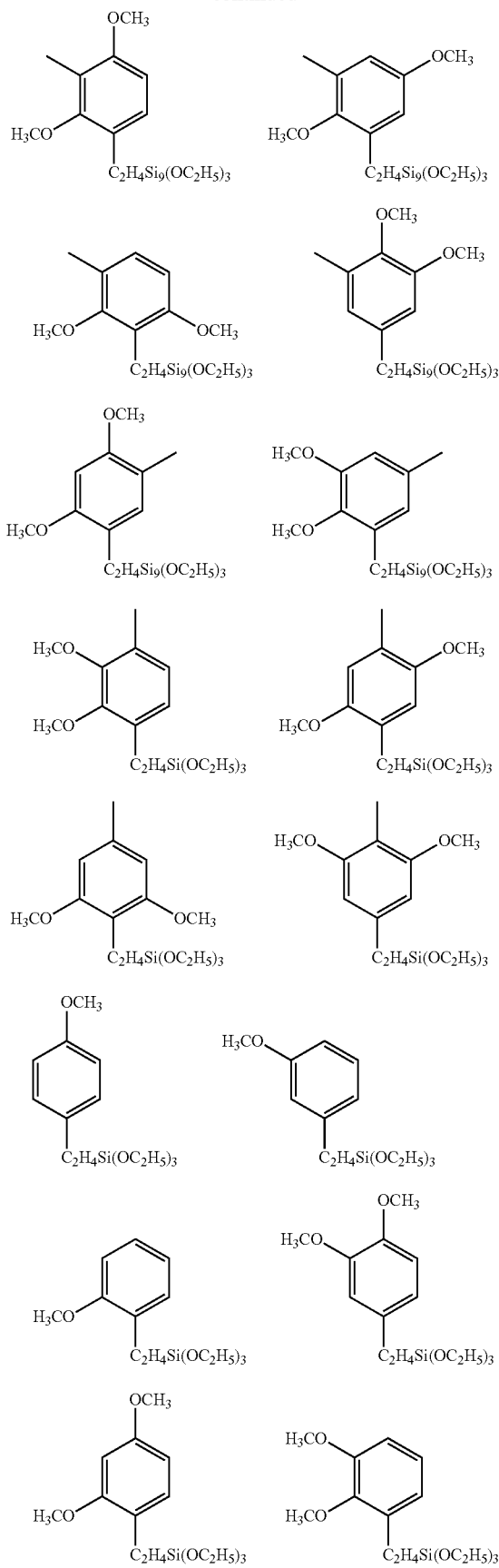
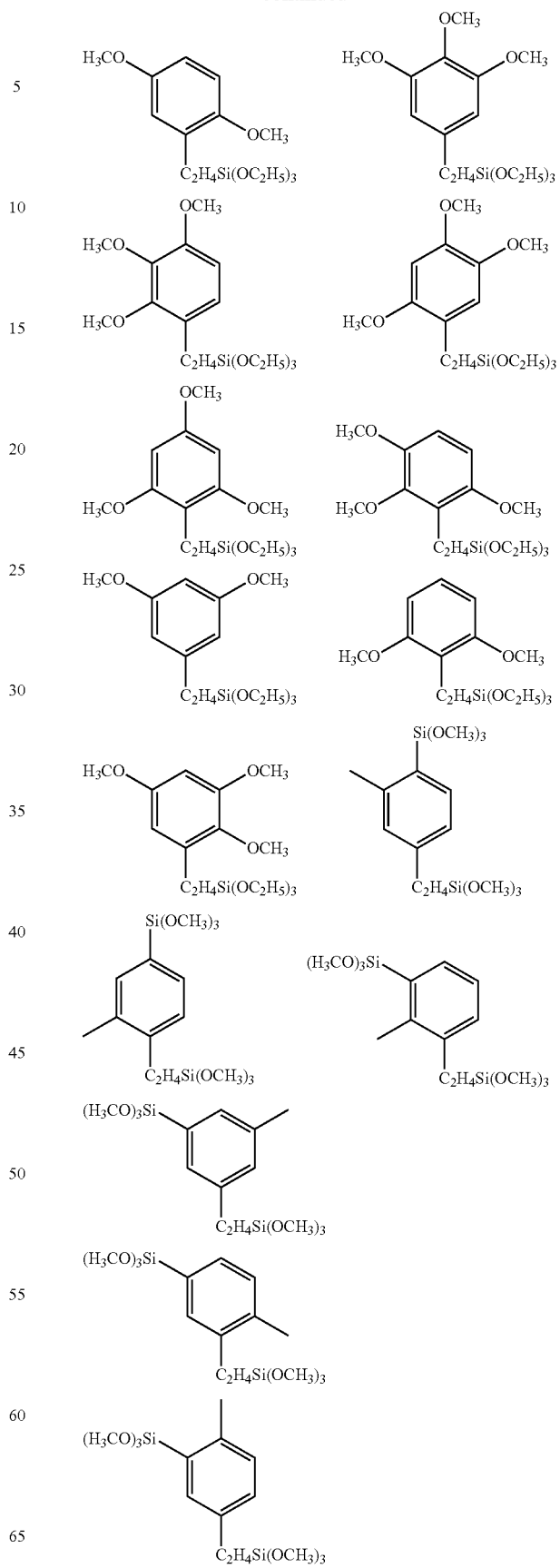

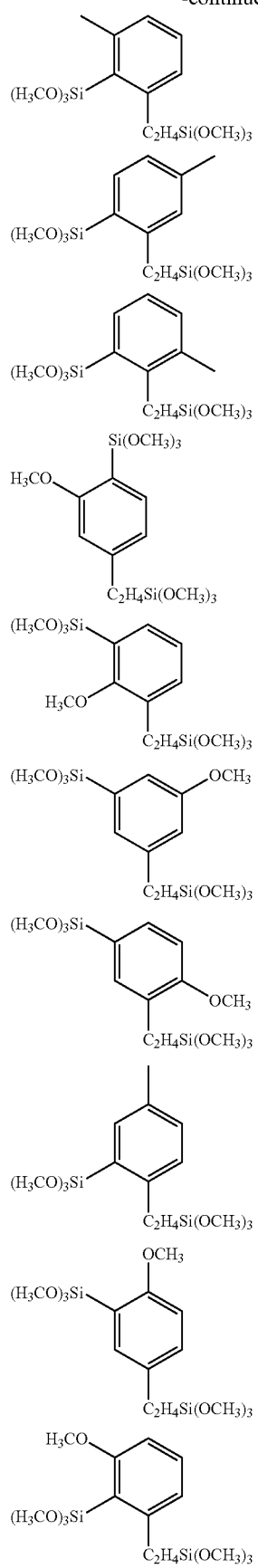
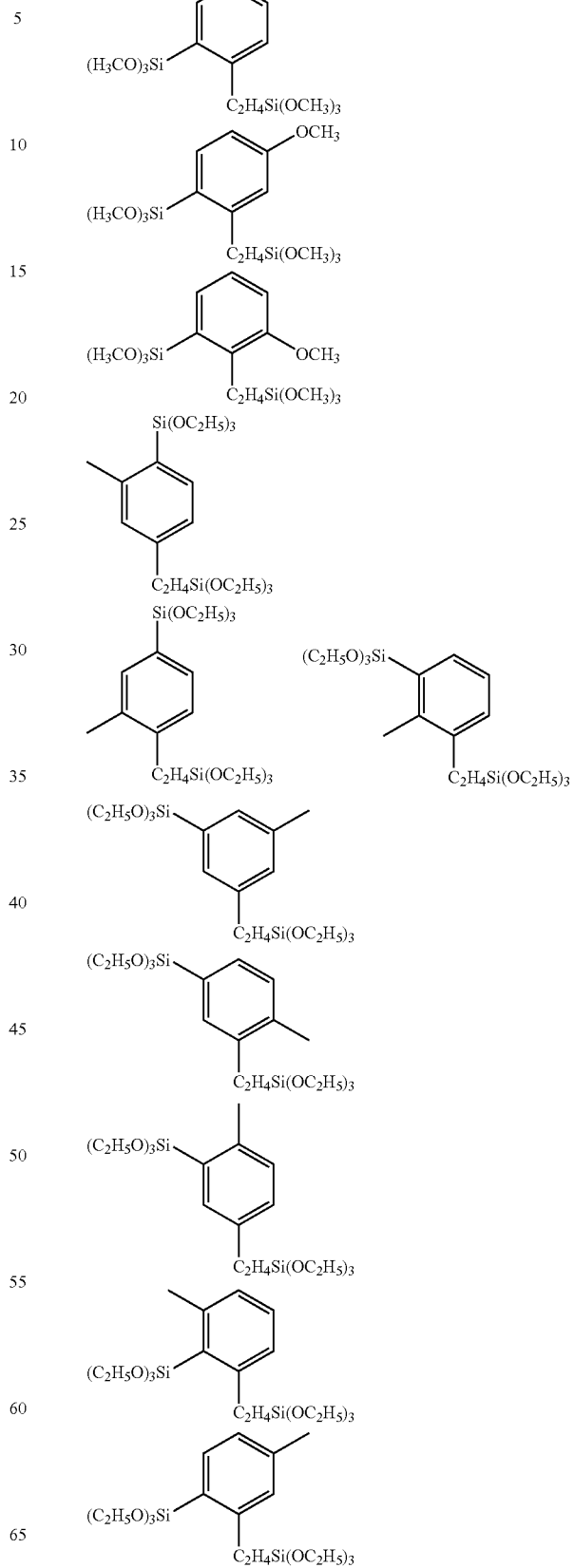

35
-continued
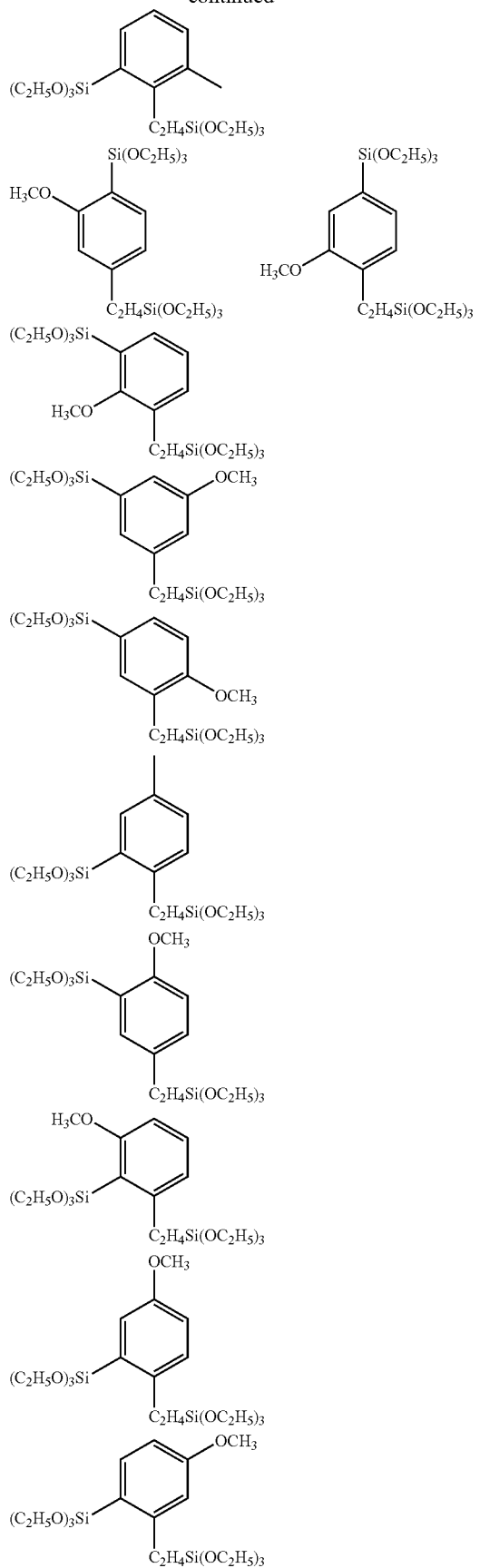
36
-continued
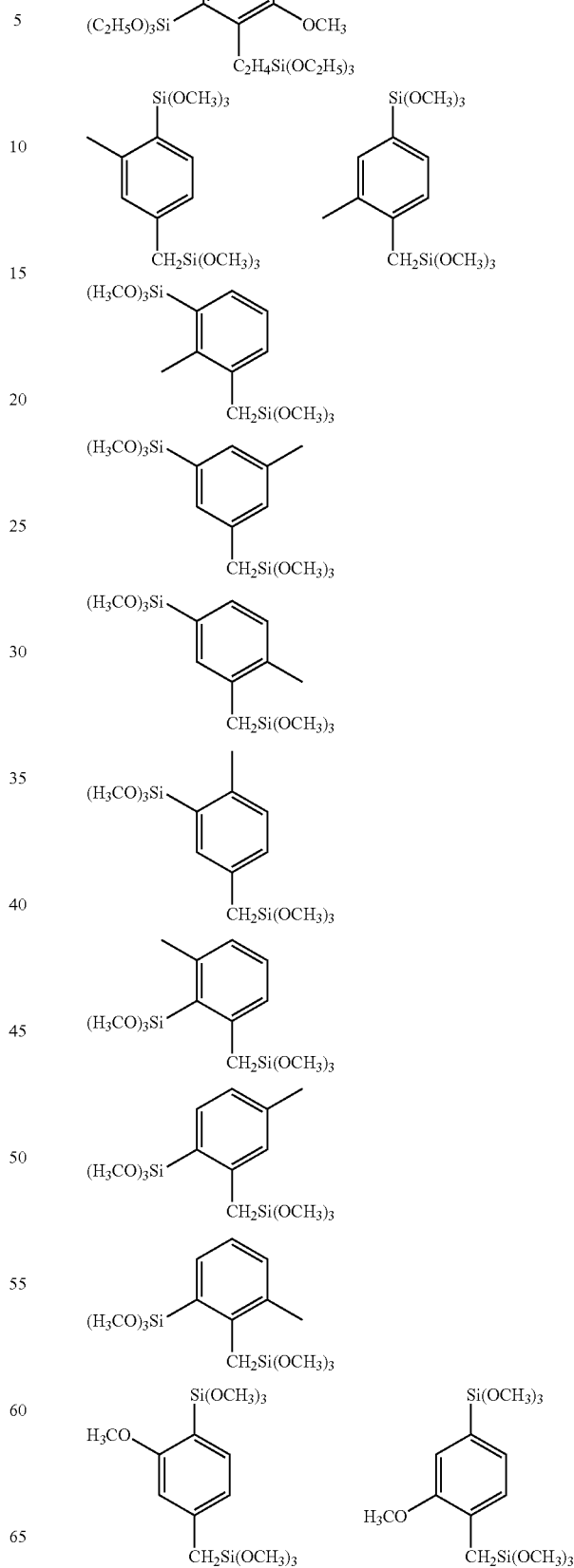

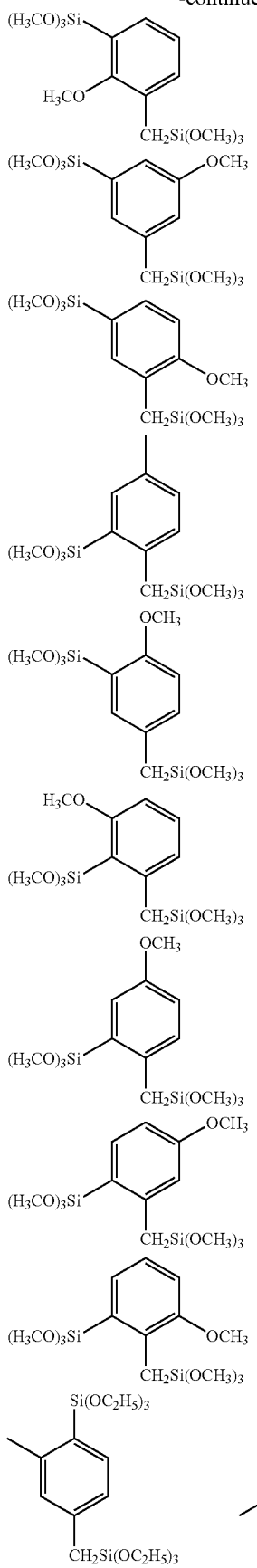
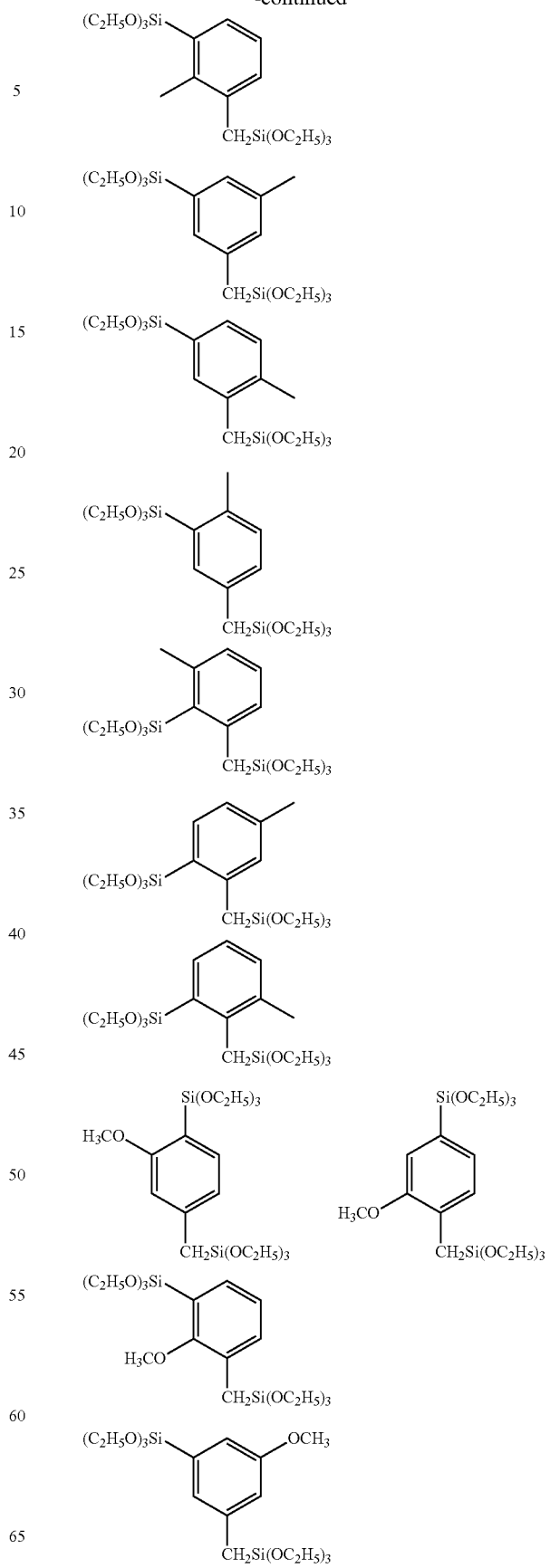

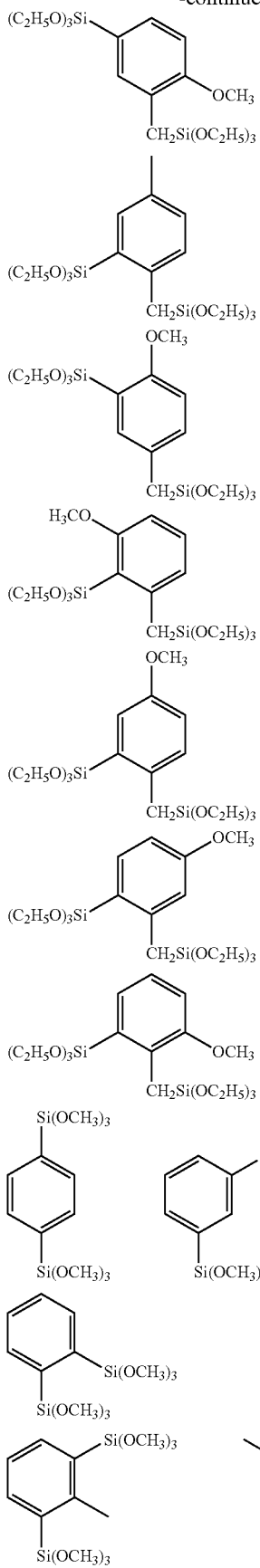
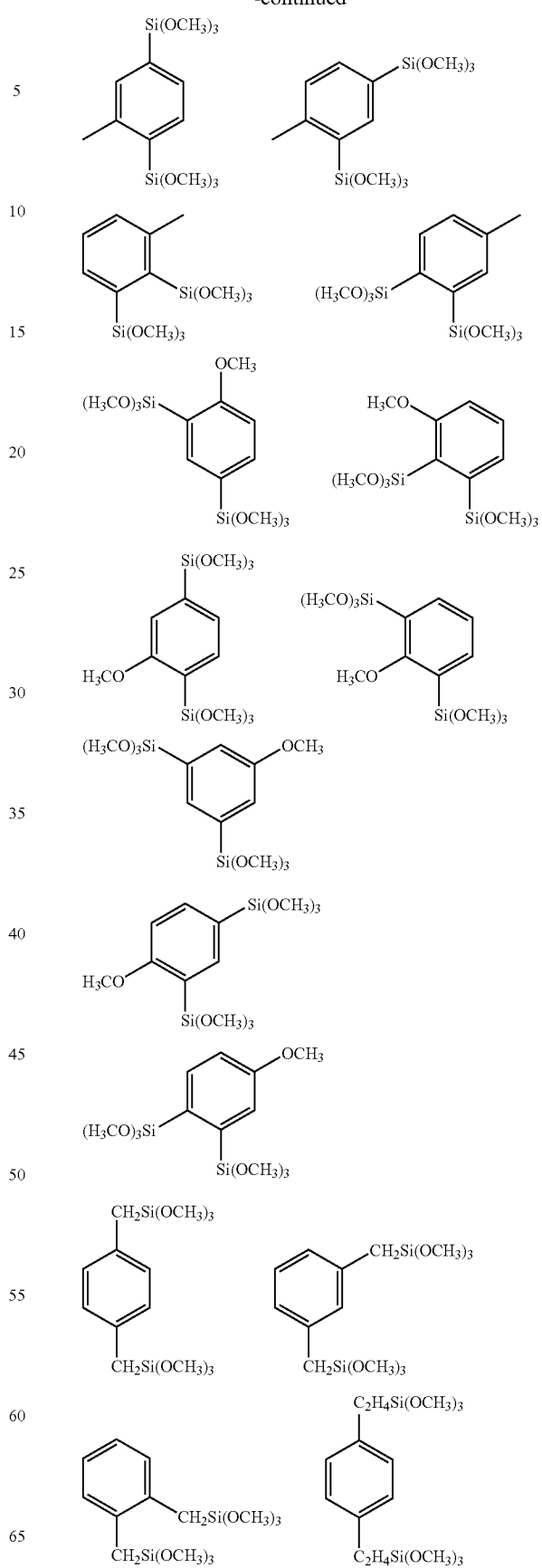

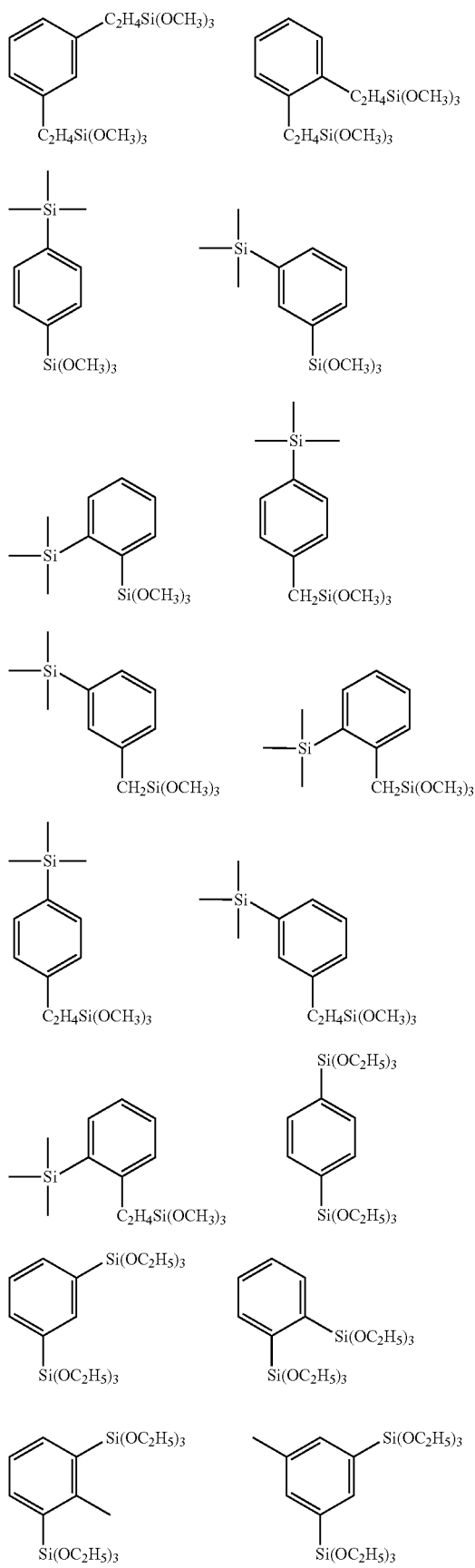
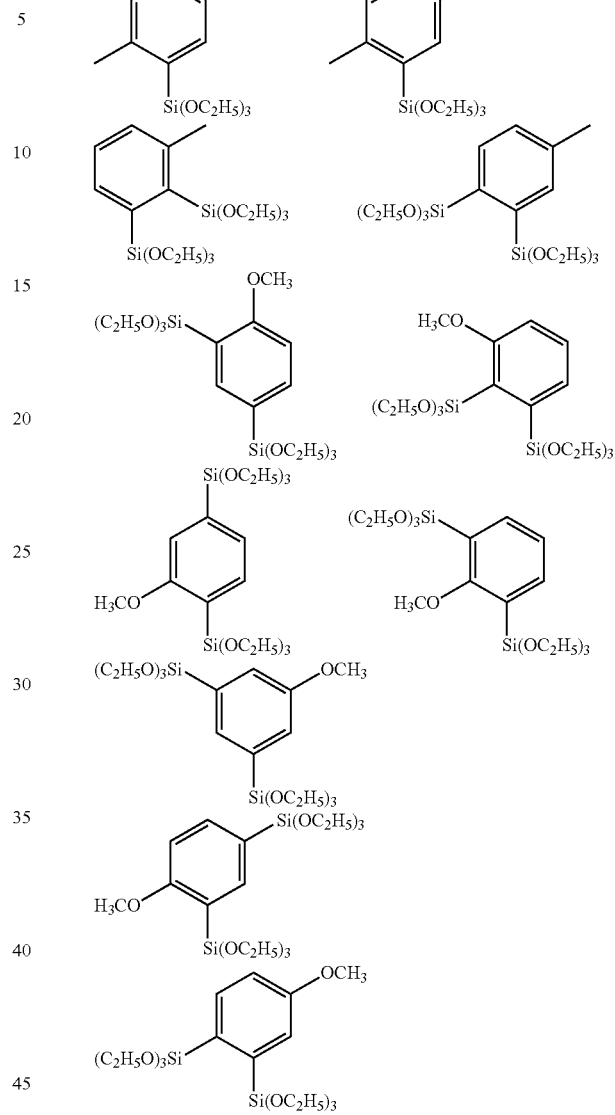

Further, a compound represented by the following general formula (A-2) can be exemplified as the monomer.

$$R^{11}{}_{m11}R^{12}{}_{m12}R^{13}{}_{m13}Si(OR)_{(4-m11-m12-m13)} \quad (A-2)$$

(In the formula, R represents an alkyl group having 1 to 6 carbon atoms;

$R^{11}$, $R^{12}$, and $R^{13}$ may be same or different each other, and represent a hydrogen atom or a monovalent organic group having 1 to 30 carbon atoms;

m11, m12, and m13 are 0 or 1; and m11+m12+m13 is an integer of 0 to 3, preferably 0 or 1.

Herein, the term "organic group" means a group which includes carbon and which may additionally include hydrogen, as well as nitrogen, oxygen, sulfur, silicon and the like. Examples of the organic groups represented by $R^{11}$, $R^{12}$ and $R^{13}$ include: unsubstituted monovalent hydrocarbon groups, such as a linear, a branched or a cyclic alkyl, alkenyl, alkynyl, aryl and aralkyl groups; groups that one or more hydrogen atoms of the above groups are substituted with an epoxy group, alkoxy group, hydroxy group, and the like; groups represented by the general formula (A-4) to be shown later, including intervening groups such as —O—, —CO—, —OCO—, —COO— and —OCOO—; and organic groups including a silicon-silicon bond.

Suitable as $R^{11}$, $R^{12}$, and $R^{13}$ in the hydrolyzable silicon-containing compound represented by the general formula (A-2) are: a hydrogen atom; alkyl groups such as methyl, ethyl, n-propyl, iso-propyl, n-butyl, iso-butyl, sec-butyl, t-butyl, n-pentyl, 2-ethylbutyl, 3-ethylbutyl, 2,2-diethylpropyl, cyclopentyl, n-hexyl, and cyclohexyl groups; alkenyl groups such as vinyl and allyl groups; alkynyl groups such as ethynyl group; aryl groups such as phenyl and tolyl groups; and aralkyl groups such as benzyl and phenethyl groups.

Examples of tetraalkoxysilanes as monomers where m11=0, m12=0 and m13=0 include tetramethoxysilane, tetraethoxysilane, tetra-n-propoxysilane, and tetraisopropoxysilane. Tetramethoxysilane and tetraethoxysilane are preferable among them.

Examples of trialkoxysilanes where m11=1, m12=0 and m13=0 include trimethoxysilane, triethoxysilane, tri-n-propoxysilane, triisopropoxysilane, methyltrimethoxysilane, methyltriethoxysilane, methyltri-n-propoxysilane, methyltriisopropoxysilane, ethyltrimethoxysilane, ethyltriethoxysilane, ethyltri-n-propoxysilane, ethyltriisopropoxysilane, vinyltrimethoxysilane, vinyltriethoxysilane, vinyltri-n-propoxysilane, vinyltriisopropoxysilane, n-propyltrimethoxysilane, n-propyltriethoxysilane, n-propyltri-n-propoxysilane, n-propyltriisopropoxysilane, i-propyltrimethoxysilane, i-propyltriethoxysilane, i-propyltri-n-propoxysilane, i-propyltriisopropoxysilane, n-butyltrimethoxysilane, n-butyltriethoxysilane, n-butyltri-n-propoxysilane, n-butyltriisopropoxysilane, sec-butyltrimethoxysilane, sec-butyltriethoxysilane, sec-butyltri-n-propoxysilane, sec-butyltriisopropoxysilane, t-butyltrimethoxysilane, t-butyltriethoxysilane, t-butyltri-n-propoxysilane, t-butyltriisopropoxysilane, cyclopropyltrimethoxysilane, cyclopropyltriethoxysilane, cyclopropyltri-n-propoxysilane, cyclopropyltriisopropoxysilane, cyclobutyltrimethoxysilane, cyclobutyltriethoxysilane, cyclobutyltri-n-propoxysilane, cyclobutyltriisopropoxysilane, cyclopentyltrimethoxysilane, cyclopentyltriethoxysilane, cyclopentyltri-n-propoxysilane, cyclopentyltriisopropoxysilane, cyclohexyltrimethoxysilane, cyclohexyltriethoxysilane, cyclohexyltri-n-propoxysilane, cyclohexyltriisopropoxysilane, cyclohexenyltrimethoxysilane, cyclohexenyltriethoxysilane, cyclohexenyltri-n-propoxysilane, cyclohexenyltriisopropoxysilane, cyclohexenylethyltrimethoxysilane, cyclohexenylethyltriethoxysilane, cyclohexenylethyltri-n-propoxysilane, cyclohexenylethyltriisopropoxysilane, cyclooctanyltrimethoxysilane, cyclooctanyltriethoxysilane, cyclooctanyltri-n-propoxysilane, cyclooctanyltriisopropoxysilane, cyclopentadienylpropyltrimethoxysilane, cyclopentadienylpropyltriethoxysilane, cyclopentadienylpropyltri-n-propoxysilane, cyclopentadienylpropyltriisopropoxysilane, bicycloheptenyltrimethoxysilane, bicycloheptenyltriethoxysilane, bicycloheptenyltri-n-propoxysilane, bicycloheptenyltriisopropoxysilane, bicycloheptyltrimethoxysilane, bicycloheptyltriethoxysilane, bicycloheptyltri-n-propoxysilane, bicycloheptyltriisopropoxysilane, adamantyltrimethoxysilane, adamantyltriethoxysilane, adamantyltri-n-propoxysilane, adamantyltriisopropoxysilane, phenyltrimethoxysilane, phenyltriethoxysilane, phenyltri-n-propoxysilane, phenyltriisopropoxysilane, benzyltrimethoxysilane, benzyltriethoxysilane, benzyltri-n-propoxysilane, benzyltriisopropoxysilane, phenethyltrimethoxysilane, phenethyltriethoxysilane, phenethyltri-n-propoxysilane, phenethyltriisopropoxysilane, naphthyltrimethoxysilane, naphthyltriethoxysilane, naphthyltri-n-propoxysilane, and naphthyltriisopropoxysilane.

Preferable examples of trialkoxysilanes include methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, and phenethyltriethoxysilane.

Examples of dialkoxysilanes where m11=1, m12=1 and m13=0 include dimethyldimethoxysilane, dimethyldiethoxysilane, methylethyldimethoxysilane, methylethyldiethoxysilane, dimethyldi-n-propoxysilane, dimethyldiisopropoxysilane, diethyldimethoxysilane, diethyldiethoxysilane, diethyldi-n-propoxysilane, diethyldiisopropoxysilane, di-n-propyldimethoxysilane, di-n-propyldiethoxysilane, di-n-propyl-di-n-propoxysilane, di-n-propyldiisopropoxysilane, diisopropyldimethoxysilane, diisopropyldiethoxysilane, diisopropyldi-n-propoxysilane, diisopropyldiisopropoxysilane, di-n-butyldimethoxysilane, di-n-butyldiethoxysilane, di-n-butyldi-n-propoxysilane, di-n-butyldiisopropoxysilane, di-sec-butyldimethoxysilane, di-sec-butyldiethoxysilane, di-sec-butyldi-n-propoxysilane, di-sec-butyldiisopropoxysilane, di-t-butyldimethoxysilane, di-t-butyldiethoxysilane, di-t-butyldi-n-propoxysilane, di-t-butyldiisopropoxysilane, dicyclopropyldimethoxysilane, dicyclopropyldiethoxysilane, dicyclopropyldi-n-propoxysilane, dicyclopropyldiisopropoxysilane, dicyclobutyldimethoxysilane, dicyclobutyldiethoxysilane, dicyclobutyldi-n-propoxysilane, dicyclobutyldiisopropoxysilane, dicyclopentyldimethoxysilane, dicyclopentyldiethoxysilane, dicyclopentyldi-n-propoxysilane, dicyclopentyldiisopropoxysilane, dicyclohexyldimethoxysilane, dicyclohexyldiethoxysilane, dicyclohexyldi-n-propoxysilane, dicyclohexyldiisopropoxysilane, dicyclohexenyldimethoxysilane, dicyclohexenyldiethoxysilane, dicyclohexenyldi-n-propoxysilane, dicyclohexenyldiisopropoxysilane, dicyclohexenylethyldimethoxysilane, dicyclohexenylethyldiethoxysilane, dicyclohexenylethyldi-n-propoxysilane, dicyclohexenylethyldiisopropoxysilane, dicyclooctanyldimethoxysilane, dicyclooctanyldiethoxysilane, dicyclooctanyldi-n-propoxysilane, dicyclooctanyldiisopropoxysilane, dicyclopentadienylpropyldimethoxysilane, dicyclopentadienylpropyldiethoxysilane, dicyclopentadienylpropyldi-n-propoxysilane, dicyclopentadienylpropyldiisopropoxysilane, bisbicycloheptenyldimethoxysilane, bisbicycloheptenyldiethoxysilane, bisbicycloheptenyldi-n-propoxysilane, bisbicycloheptenyldiisopropoxysilane, bisbicycloheptyldimethoxysilane, bisbicycloheptyldiethoxysilane, bisbicycloheptyldi-n-propoxysilane, bisbicycloheptyldiisopropoxysilane, bisadamantyldimethoxysilane, bisadamantyldiethoxysilane, bisadamantyldi-n-propoxysilane, and bisadamantyldiisopropoxysilane. Further, examples of light-absorbing monomers in this respect include diphenyldimethoxysilane, diphenyldiethoxysilane, methylphenyldimethoxysilane, methylphenyldiethoxysilane, diphenyldi-n-propoxysilane, and diphenyldiisopropoxysilane.

Preferable examples of dialkoxysilanes include dimethyldimethoxysilane, dimethyldiethoxysilane, diethyldimethoxysilane, diethyldiethoxysilane, methylethyldimethoxysilane, methylethyldiethoxysilane, di-n-propyldimethoxysilane, di-n-butyldimethoxysilane, methylphenyldimethoxysilane, and methylphenyldiethoxysilane.

Examples of monoalkoxysilanes where m11=1, m12=1 and m13=1 include trimethylmethoxysilane, trimethylethoxysilane, dimethylethylmethoxysilane, and dimethylethylethoxysilane. Further, examples of light-absorbing monomers in this respect include dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Preferable examples of monoalkoxysilanes include trimethylmethoxysilane, dimethylethylmethoxysilane, dimethylphenylmethoxysilane, dimethylbenzylmethoxysilane, and dimethylphenethylmethoxysilane.

Other examples of the organic groups represented by $R^{11}$, $R^{12}$ and $R^{13}$ mentioned above include organic groups having one or more carbon-oxygen single bonds or carbon-oxygen double bonds. Concrete examples include organic groups having one or more groups selected from a group consisting of epoxy, ester, alkoxy, and hydroxyl groups. Examples of organic groups are those represented by the following general formula (A-4).

$$(P-Q_1-(S_1)_{v1}-Q_2-)_u-(T)_{v2}-Q_3-(S_2)_{v3}-Q_4-) \quad (A-4)$$

(In the formula, P represents a hydrogen atom, hydroxyl group, epoxy ring

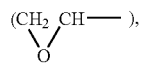

an alkoxy group having 1 to 4 carbon atoms, alkylcarbonyloxy group having 1 to 6 carbon atoms, or alkylcarbonyl group having 1 to 6 carbon atoms;

$Q_1$, $Q_2$, $Q_3$ and $Q_4$ represent independently $-C_qH_{(2q-p)}P_p-$ (where P represents the same as the above, "p" is an integer of 0 to 3, and "q" is an integer of 0 to 10 (q=0 means a single bond));

u is an integer of 0 to 3;

$S_1$ and $S_2$ independently represent $-O-$, $-CO-$, $-OCO-$, $-COO-$, or $-OCOO-$; and v1, v2, and v3 independently represent 0 or 1.

Simultaneously with the above, T is a divalent group comprising an alicycle or aromatic ring which may contain a heteroatom, and examples of the alicycles or the aromatic rings which may include a heteroatom such as oxygen atoms in T are listed below. Those sites in T which are bonded to $Q_2$ and $Q_3$ are not particularly limited, and such sites may be appropriately selected in view of reactivities based on steric factors and availabilities of commercial reagents to be used in the reaction).

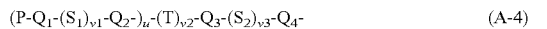

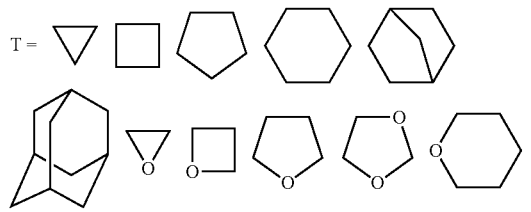

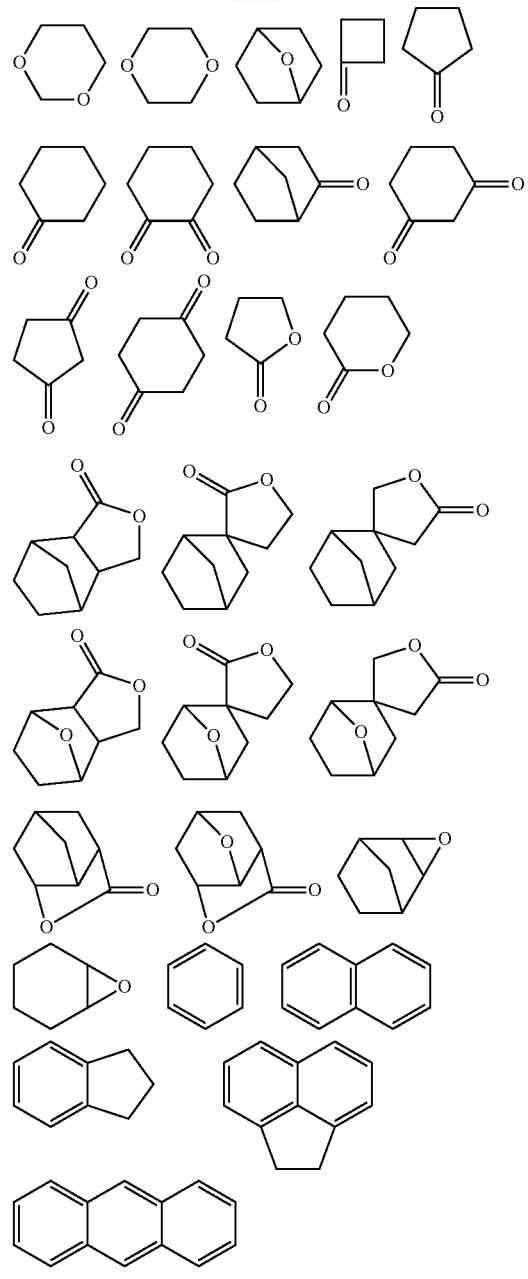

Preferable examples of organic groups in the general formula (A-2) having one or more carbon-oxygen single bonds or carbon-oxygen double bonds, include the following. Note that the following formulae include a symbol "(Si)" depicted to show a bonding site to Si.

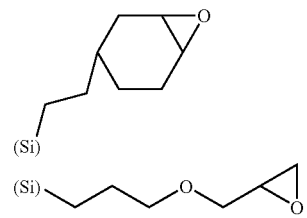

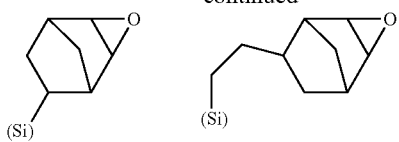
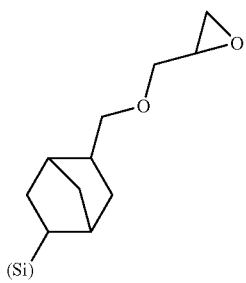
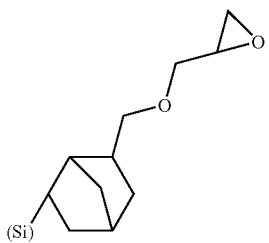
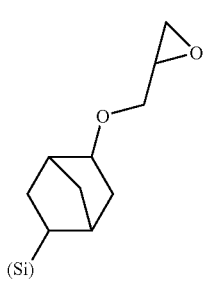
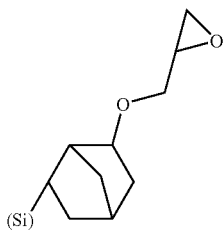
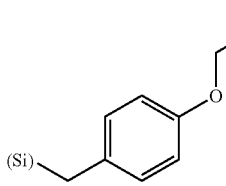
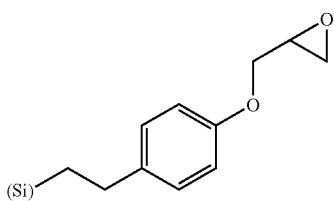
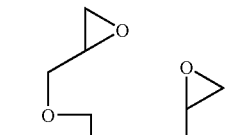
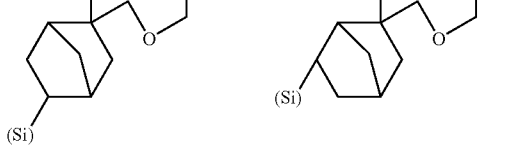
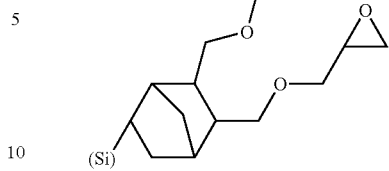
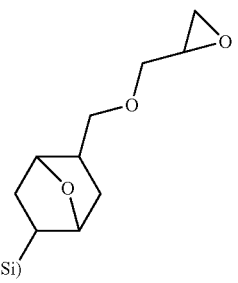
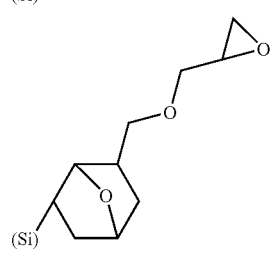
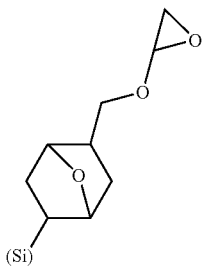
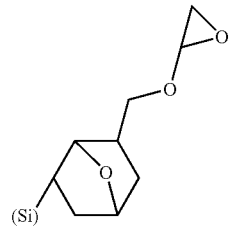
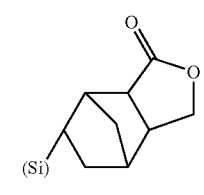
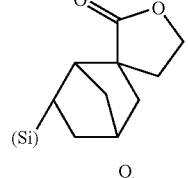
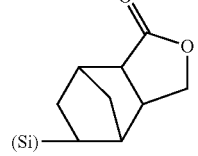
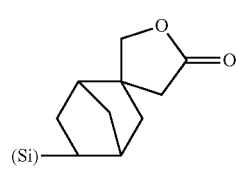
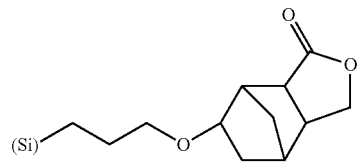

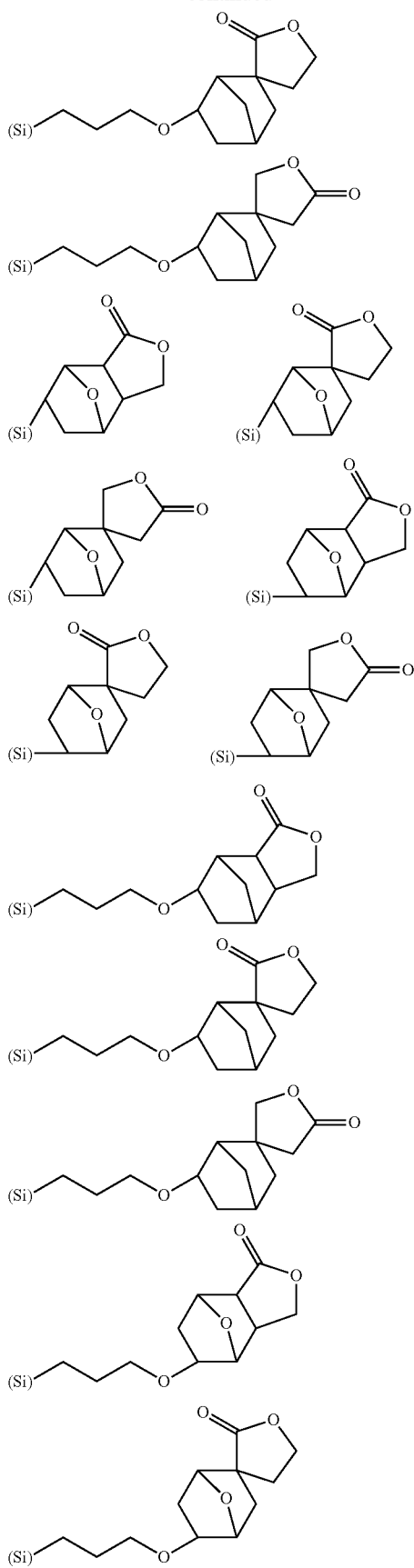
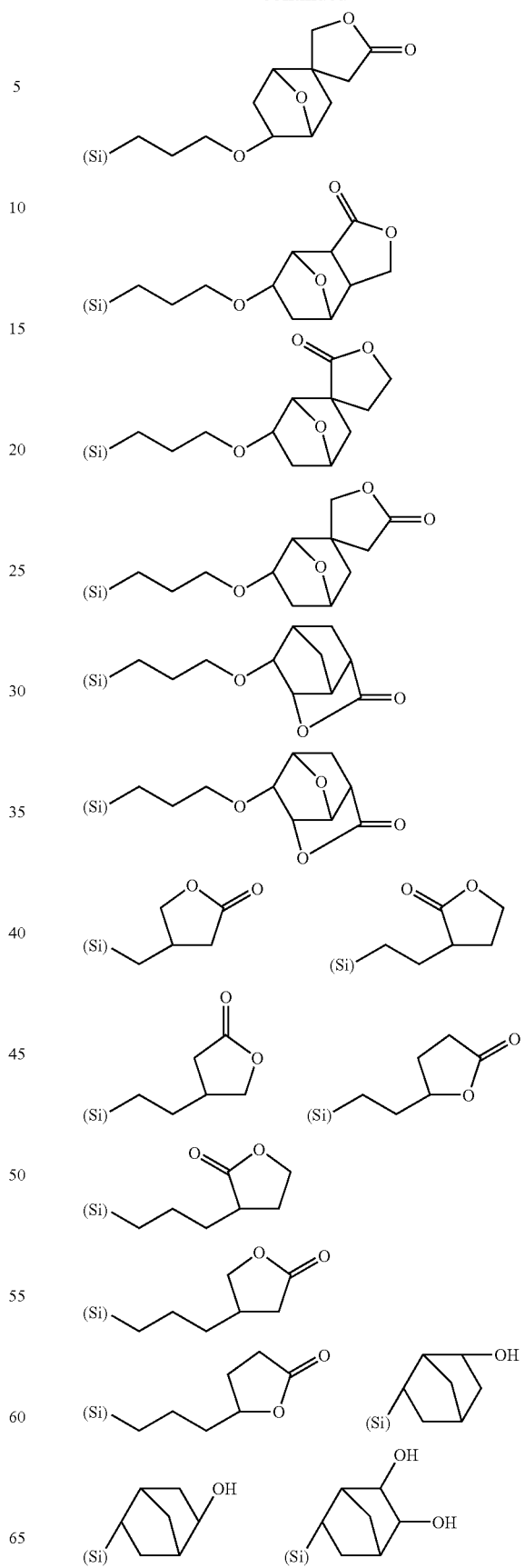

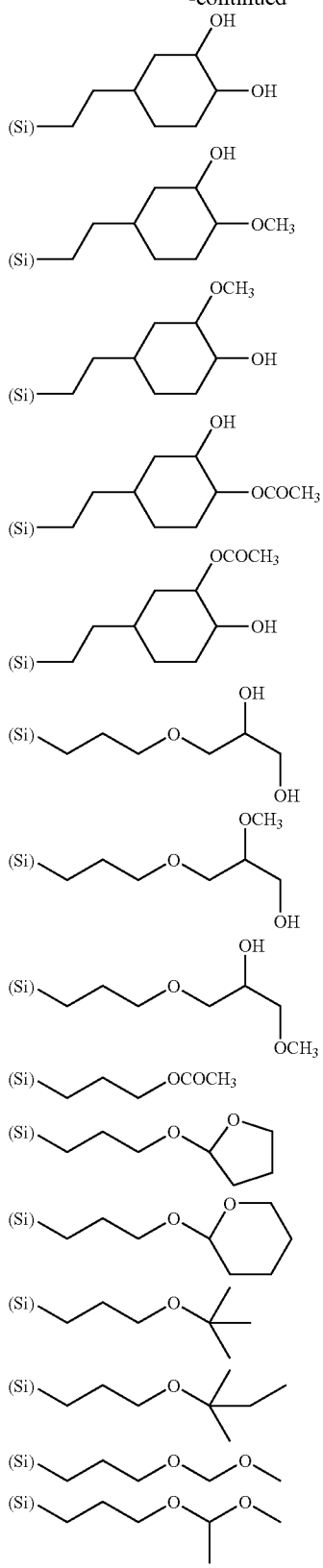

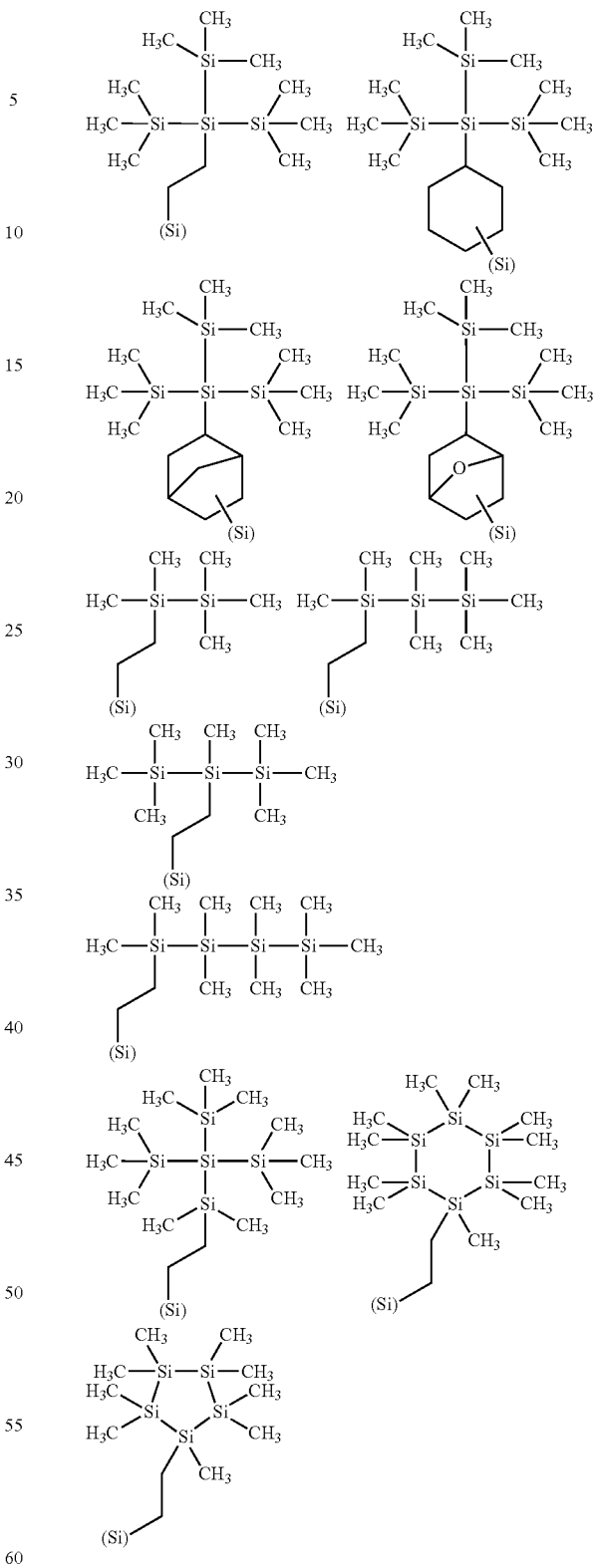

Further, usable examples of organic groups represented by $R^{11}$, $R^{12}$ and $R^{13}$ include organic groups including silicon-silicon bonds. Concrete examples include the following.

Further, a mixture including a compound represented by the general formula (A-3) can be used as a starting material:

$$D(OR^3)_{m3}(OR^4)_{m4} \quad (A-3)$$

(In the formula, $R^3$ and $R^4$ are an organic group having 1 to 30 carbon atoms;

m3+m4 is a valence to be determined by a kind of D;
m3 and m4 are an integer of 0 or more; and
D is an element belonging to group III, group IV or group V in the periodic table, except for silicon and carbon.)

Examples of $R^3$ and $R^4$ include: unsubstituted monovalent hydrocarbon groups such as linear, branched or cyclic alkyl, alkenyl, alkynyl, aryl and aralkyl groups; groups that one or more hydrogen atoms of the above groups is substituted with an epoxy group, alkoxy group, hydroxy group, and the like; and groups including intramolecular intervening groups such as —O—, —CO—, —OCO—, —COO— and —OCOO—.

When D is boron, examples of the compounds represented by the formula (A-3) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, and boron methoxyethoxide.

When D is aluminum, examples of the compounds represented by the formula (A-3) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl-acetoacetate, aluminum dibutoxyethyl-acetoacetate, aluminum propoxy-bis-ethyl-acetoacetate, aluminum butoxy-bis-ethyl-acetoacetate, aluminum 2,4-pentanedionate, and aluminum 2,2,6,6-tetramethyl-3,5-heptanedionate.

When D is gallium, examples of the compounds represented by the formula (A-3) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl-acetoacetate, gallium dibutoxyethyl-acetoacetate, gallium propoxy-bis-ethyl-acetoacetate, gallium butoxy-bis-ethyl-acetoacetate, gallium 2,4-pentanedionate, and gallium 2,2,6,6-tetramethyl-3,5-heptanedionate.

When D is yttrium, examples of the compounds represented by the formula (A-3) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl-acetoacetate, yttrium dibutoxyethyl-acetoacetate, yttrium propoxy-bis-ethyl-acetoacetate, yttrium butoxy-bis-ethyl-acetoacetate, yttrium 2,4-pentanedionate, and yttrium 2,2,6,6-tetramethyl-3,5-heptanedionate.

When D is germanium, examples of the compounds represented by the formula (A-3) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

When D is titanium, examples of the compounds represented by the formula (A-3) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy-bisethyl-acetoacetate, titanium dibutoxy-bisethyl-acetoacetate, titanium dipropoxy-bis-2,4-pentanedionate, and titanium dibutoxy-bis-2,4-pentanedionate.

When D is hafnium, examples of the compounds represented by the formula (A-3) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy-bisethyl-acetoacetate, hafnium dibutoxy-bisethyl-acetoacetate, hafnium dipropoxy-bis-2,4-pentanedionate, and hafnium dibutoxy-bis-2,4-pentanedionate.

When D is tin, examples of the compounds represented by the formula (A-3) include, as monomers, methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

When D is arsenic, examples of the compounds represented by the formula (A-3) include, as monomers, methoxy arsenic, ethoxy arsenic, propoxy arsenic, butoxy arsenic, and phenoxy arsenic.

When D is antimony, examples of the compounds represented by the formula (A-3) include, as monomers, methoxy antimony, ethoxy antimony, propoxy antimony, butoxy antimony, phenoxy antimony, antimony acetate, and antimony propionate.

When D is niobium, examples of the compounds represented by the formula (A-3) include, as monomers, methoxy niobium, ethoxy niobium, propoxy niobium, butoxy niobium, and phenoxy niobium.

When D is tantalum, examples of the compounds represented by the formula (A-3) include, as monomers, methoxy tantalum, ethoxy tantalum, propoxy tantalum, butoxy tantalum, and phenoxy tantalum.

When D is bismuth, examples of the compounds represented by the formula (A-3) include, as monomers, methoxy bismuth, ethoxy bismuth, propoxy bismuth, butoxy bismuth, and phenoxy bismuth.

When D is phosphorus, examples of the compounds represented by the formula (A-3) include, as monomers, trimethyl phosphite, triethyl phosphite, tripropyl phosphite, trimethyl phosphate, triethyl phosphate, and tripropyl phosphate.

When D is vanadium, examples of the compounds represented by the formula (A-3) include, as monomers, vanadium oxide-bis(2,4-pentanedionate), vanadium 2,4-pentanedionate, vanadium tributoxide oxide, and vanadium tripropoxide oxide.

When D is zirconium, examples of the compounds represented by the formula (A-3) include, as monomers, methoxy zirconium, ethoxy zirconium, propoxy zirconium, butoxy zirconium, phenoxy zirconium, zirconium dibutoxide-bis(2,4-pentanedionate), and zirconium dipropoxide-bis(2,2,6,6-tetramethyl-3,5-heptanedionate).

It is possible to select one kind or two or more kinds of monomers represented by the above general formula (A-1), one kind or two or more kinds of monomers represented by the above general formula (A-2), and in some cases, one kind or two or more kinds of monomers represented by the above general formula (A-3) from these monomers (hydrolyzable silicon-containing compounds), and to mix them before or during the reaction, to prepare a reaction starting material for forming a silicon-containing compound.

The silicon-containing compound can be produced, by conducting hydrolytic condensation between monomers (hydrolyzable silicon-containing compounds), while adopting, as a catalyst, one or more kinds of compounds preferably selected from inorganic acids, aliphatic sulfonic acids, aromatic sulfonic acids, organic amines, organic ammonium hydroxides, alkali metal hydroxides and alkaline earth metal hydroxides.

Specific examples of the catalyst to be used at this time include hydrofluoric acid, hydrochloric acid, hydrobromic acid, sulfuric acid, nitric acid, perchloric acid, phosphoric acid, methanesulfonic acid, benzenesulfonic acid, toluenesulfonic acid, and tetramethylammonium hydroxide. The catalyst is used in an amount of $10^{-6}$ to 10 moles, preferably $10^{-5}$ to 5 moles, more preferably $10^{-4}$ to 1 mole, relative to 1 mole of silicon monomers.

The amount of water upon obtainment of the silicon-containing compound from these monomers by hydrolytic condensation, is 0.01 to 100 moles, preferably 0.05 to 50 moles, and more preferably 0.1 to 30 moles, per mole of hydrolyzable substitutional groups bonded to the monomers. Addition amounts exceeding 100 moles are uneconomical, due to merely large-sized apparatuses to be used for reactions.

As a manipulation manner, the monomers are added into an aqueous catalyst solution, to cause initiation of a hydrolytic condensation reaction. At this time, the organic solvent may be added into the aqueous catalyst solution, or monomers may have been diluted with the organic solvent, or both procedures may be performed. The reaction temperature is to be 0 to 100° C., preferably 5 to 80° C. It is a preferable manner to keep the temperature at 5 to 80° C. upon dropping of the monomers, and subsequently mature them at 20 to 80° C.

Examples of organic solvents, which can be added into the aqueous catalyst solution or which can dilute the monomers, include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures of them.

Water-soluble ones are preferable among them. Examples thereof include: alcohols such as methanol, ethanol, 1-propanol, and 2-propanol; polyvalent alcohols such as ethylene glycol and propylene glycol; polyvalent alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether; acetone; acetonitrile; and tetrahydrofuran.

Those having boiling points of 100° C. or lower are preferable among them.

Note that the usage amount of the organic solvent is preferably to be 0 to 1,000 ml, particularly preferably 0 to 500 ml, relative to 1 mole of monomers. Excessive usage amounts of the organic solvent uneconomically lead to excessively large reaction vessels.

Thereafter, a neutralization reaction of the catalyst is conducted if necessary, and the alcohol produced by the hydrolytic condensation reaction is removed under reduced pressure, thereby obtaining an aqueous solution of a reaction product mixture. At this time, the amount of an acid or an alkaline substance usable for neutralization is preferably 0.1 to 2 equivalents relative to the acid or the alkali used as the catalyst. This substance for neutralization is arbitrary, insofar as that exhibits acidity or alkalinity in water.

Subsequently, alcohols produced by the hydrolytic condensation reaction must be removed from the reaction product mixture. Although the temperature for heating the reaction product mixture at this time depends on the kinds of the added organic solvent and alcohols produced by the reaction, the temperature is preferably 0 to 100° C., more preferably 10 to 90° C., and even more preferably 15 to 80° C. Further, although the reduced pressure varies depending on the types of organic solvent and alcohol to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure. Although it is difficult at this time to accurately determine amounts of alcohols to be removed, it is desirable to remove 80 mass % or more of produced alcohols.

Next, it is possible to remove the acid catalyst used for the hydrolytic condensation, from the reaction product mixture. As a procedure for removing the catalyst, the silicon-containing compound is mixed with water, and the silicon-containing compound is extracted with an organic solvent. Suitable as an organic solvent to be used then, is one which allows for dissolution of the silicon-containing compound therein and which is separated in a two-layered manner from water upon mixing therewith. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also possible to use a mixture of a water-soluble organic solvent and a water hardly-soluble organic solvent. Examples of preferable mixtures include, without limited thereto, combinations of methanol+ethyl acetate, ethanol+ethyl acetate, 1-propanol+ethyl acetate, 2-propanol+ethyl acetate, butane diol monomethyl ether+ethyl acetate, propylene glycol monomethyl ether+ethyl acetate, ethylene glycol monomethyl ether+ethyl acetate, butane diol monoethyl ether+ethyl acetate, propylene glycol monoethyl ether+ethyl acetate, ethylene glycol monoethyl ether+ethyl acetate, butane diol monopropyl ether+ethyl acetate, propylene glycol monopropyl ether+ethyl acetate, ethylene glycol monopropyl ether+ethyl acetate, methanol+methyl isobutyl ketone, ethanol+methyl isobutyl ketone, 1-propanol+methyl isobutyl ketone, 2-propanol+methyl isobutyl ketone, propylene glycol monomethyl ether+methyl isobutyl ketone, ethylene glycol monomethyl ether+methyl isobutyl ketone, propylene glycol monoethyl ether+methyl isobutyl ketone, ethylene glycol monoethyl ether+methyl isobutyl ketone, propylene glycol monopropyl ether+methyl isobutyl ketone, ethylene glycol monopropyl ether+methyl isobutyl ketone, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate, ethanol+propylene glycol methyl ether acetate, 1-propanol+propylene glycol methyl ether acetate, 2-propanol+propylene glycol methyl ether acetate, propylene glycol monomethyl ether+propylene glycol methyl ether acetate, ethylene glycol monomethyl ether+propylene glycol methyl ether acetate, propylene glycol monoethyl ether+propylene glycol methyl ether acetate, ethylene glycol monoethyl ether+propylene glycol methyl ether acetate, propylene glycol monopropyl ether+propylene glycol methyl ether acetate, and ethylene glycol monopropyl ether+propylene glycol methyl ether acetate.

Note that although the mixing ratio of the water-soluble organic solvent and the water hardly-soluble organic solvent is to be appropriately selected, the water-soluble organic solvent is selected to be 0.1 to 1,000 parts by mass, preferably 1 to 500 parts by mass, more preferably 2 to 100 parts by mass, relative to 100 parts by mass of the water-hardly soluble organic solvent.

The procedure is followed by washing by neutral water. Usable as such water is so-called deionized water or ultrapure water. The amount of such water is to be 0.01 to 100 L, preferably 0.05 to 50 L, and more preferably 0.1 to 5 L, relative to 1 L of the silicon-containing compound solution. The washing procedure may be conducted by introducing both liquids into one vessel, stirring them, and then leaving them to stand still, followed by separation of a water layer. It is enough for the number of washing steps to be one or more, preferably one to about five, because commensurate effects are not obtained even by washing of ten or more times.

Other examples of methods for removing the catalyst include a method based on an ion-exchange resin, and, when the acid catalyst is used, a method for conducting neutralization by epoxy compounds such as ethylene oxide and propylene oxide followed by removal. These methods can be appropriately selected in conformity to the catalyst for the reaction.

Since a part of the silicon-containing compound is sometimes migrated into a water layer by the washing operation at this time to provide an effect substantially equivalent to a fractionation, the number of washing times and the amount of washing water may be appropriately selected in view of the catalyst removal effect and fractionation effect.

In both cases of a silicon-containing compound solution including the catalyst left therein and a silicon-containing compound solution from which the catalyst has been removed, a final solvent is added thereto, and solvent exchange is conducted under reduced pressure, to obtain a resultant silicon-containing compound solution. Although the temperature for solvent exchange depends on the types of reaction solvent, extraction solvent and the like to be removed, the temperature is preferably 0 to 100° C., more preferably 10 to 90° C., and even more preferably 15 to 80° C. Further, although the reduced pressure varies depending on the type of extraction solvent to be removed, types of evacuating apparatus and condensation apparatus, and the heating temperature, the reduced pressure is preferably at the atmospheric pressure or lower, more preferably 80 kPa or lower in absolute pressure, and even more preferably 50 kPa or lower in absolute pressure.

At this time, the silicon-containing compound is sometimes made unstable, due to exchange of solvents. This phenomenon is caused depending on the compatibility between the final solvent and the silicon-containing compound, and it is possible to add the component (C) to be described later as a stabilizer, so as to prevent the phenomenon. The amount to be added is 0 to 25 parts by mass, preferably 0 to 15 parts by mass, and more preferably 0 to 5 parts by mass relative to 100 parts by mass of the silicon-containing compound in the solution before solvent exchange, and 0.5 or more parts by mass are preferable in case of addition. If necessary, it is possible to add the component (C) to the solution before solvent exchange and to subsequently conduct a solvent exchange operation.

When the silicon-containing compound is concentrated to a certain concentration or denser, condensation reaction is progressed, so that the compound is changed into a state incapable of being re-dissolved in an organic solvent. As such, the compound is to be preferably kept in a solution state at an appropriate concentration. Thus, the suitable concentration in this case is 50 mass % or less, preferably 40 mass % or less and more preferably 30 mass % or less.

Suitable as a final solvent to be added to the silicon-containing compound solution is an alcohol-based solvent, and particularly desirable examples thereof include monoalkyl ether of ethylene glycol, diethylene glycol, triethylene glycol, and the like, and monoalkyl ether of propylene glycol, dipropylene glycol, and the like. Preferable examples concretely include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

As another operation for reaction, water or water-containing organic solvent is added to the monomers or an organic solution of monomers, to initiate a hydrolysis reaction. At this time, the catalyst may be added to the monomers or the organic solution of monomers, or may have been added into water or the water-containing organic solvent. The reaction temperature is to be 0 to 100° C., preferably 10 to 80° C. It is a preferable procedure to conduct heating to 10 to 50° C. upon dropping of water, and to subsequently raise the temperature to 20 to 80° C. for maturation.

In case of using organic solvents, water-soluble ones are preferable, and examples thereof include methanol, ethanol, 1-propanol, 2-propanol, 1-butanol, 2-butanol, 2-methyl-1-propanol, acetone, tetrahydrofuran, acetonitrile; and polyvalent alcohol condensate derivatives such as: butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and mixtures thereof.

The usage amount of the organic solvent may be the same as the above. The obtained reaction product mixture is post-treated in the same manner as the above, to obtain a resultant silicon-containing compound.

The molecular weight of the obtained silicon-containing compound can be adjusted not only by selection of monomers but also by control of reaction condition upon polymerization, but a compound having weight-average molecular weights of 100,000 or less, preferably 200 to 50,000, and more preferably 300 to 30,000 is used preferably because occurrence of extraneous substances or coating patch can be prevented. Note that the data concerning the weight-average molecular weight is obtained as a molecular weight determined by gel permeation chromatography (GPC) using an RI detector and polystyrene standards.

The thermosetting silicon-containing antireflection film-forming composition of the present invention is allowed to contain two or more kinds of silicon-containing compounds which are mutually different in composition and/or reaction condition, insofar as produced under acidic conditions, respectively.

The thermosetting silicon-containing antireflection film-forming composition can be prepared by further blending the thermal crosslinking accelerator (B), the acid (C), and the organic solvent (D) into the silicon-containing compound.

In this way, the thermal crosslinking accelerator as the component (B) may be contained in the composition of the present invention so as to further promote a cross-linking reaction upon formation of the silicon-containing antireflection film. Examples of such a thermal crosslinking accelerator include compounds represented by the following general formula (B-1) or (B-2).

$$L_a H_b X \quad (B\text{-}1)$$

(In the formula, L represents lithium, sodium, potassium, rubidium, or cesium;

X represents a hydroxyl group, or a monovalent, divalent or higher organic acid group having 1 to 30 carbon atoms;

"a" is an integer of 1 or more;

"b" is 0 or an integer of 1 or more; and a+b is a valence of the hydroxyl group or the organic acid group.)

$$M_a H_b A \quad (B\text{-}2)$$

(In the formula, M represents sulfonium, iodonium, or ammonium, preferably tertiary sulfonium, secondary iodonium, or quaternary ammonium, especially preferably a photo-degradable compound, i.e., a triphenylsulfonium compound, or a diphenyliodonium compound;

A represents the same as X mentioned above or a non-nucleophilic counter ion;

"a" and "b" are the same as mentioned above; and a+b is a valence of the hydroxyl group, the organic acid group, or non-nucleophilic counter ion.

More specifically, for example, the thermal crosslinking accelerator as the component (B) can be advantageously selected from those exemplified in Japanese Patent Laid-open (kokai) No. 2007-302873.

Note that the thermal crosslinking accelerators can be used solely in one kind or combinedly in two or more kinds. The addition amount of the thermal crosslinking accelerators is preferably 0.01 to 50 parts by mass, and more preferably 0.1 to 40 parts by mass, relative to 100 parts by mass of the base polymer (i.e., the silicon-containing compound obtained by the above procedure).

To ensure stability of the thermosetting silicon-containing antireflection film-forming composition of the present invention, a monovalent, a divalent or higher organic acid having 1 to 30 carbon atoms may be added as the component (C). Examples of the acid to be added include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Particularly preferable examples include oxalic acid, maleic acid, formic acid, acetic acid, propionic acid, and citric acid. It is possible to mixingly use two or more kinds of acids, so as to keep the stability. The addition amount is 0.001 to 25 parts by mass, preferably 0.01 to 15 parts by mass, and more preferably 0.1 to 5 parts by mass, relative to 100 parts by mass of the silicon-containing compounds contained in the composition.

Alternatively, the organic acid is preferably blended in a manner to achieve $0 \leq pH \leq 7$, more preferably $0.3 \leq pH \leq 6.5$, and even more preferably $0.5 \leq pH \leq 6$, when evaluated as a pH of the composition.

To be used as the component (D) for the composition of the present invention containing the silicon-containing compound, is the same organic solvent as used upon production of the silicon-containing compound as described above, and preferable examples to be used include water-soluble organic solvents, particularly monoalkyl ether of ethylene glycol, diethylene glycol, triethylene glycol, and the like, and monoalkyl ether of propylene glycol, dipropylene glycol, butanediol, pentanediol, and the like. Concretely used are organic solvents selected from among butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

Moreover, in the present invention, water may be added to the said composition as required. Addition of water causes the silicon-containing compound to be hydrated, thereby improving lithography performance thereof. The content rate of water in the solvent components of the composition is preferably more than 0 mass % and less than 50 mass %, more preferably 0.3 to 30 mass %, and even more preferably 0.5 to 20 mass %.

Excessively large amounts of the respective components result in a deteriorated uniformity of a coated film, and causing eye holes at the worst. Contrary, excessively small amounts disadvantageously deteriorate the lithography performance.

The usage amount of all the solvents including water is preferably 500 to 100,000 parts by mass, and particularly 400 to 50,000 parts by mass, relative to 100 parts by mass of the base polymer.

In the present invention, a photoacid generator may be added into the thermosetting silicon-containing antireflection film-forming composition as necessary. In the case that a thermal crosslinking accelerator (B) is not fully evaporated at the time of the thermal cure and the light exposure, there is a possibility that the component (B), remained in a silicon-containing antireflection film, affects a pattern form. In order to prevent this from occurring, an acid is generated in the silicon-containing antireflection film at the time of the pattern formation of the resist film so that deterioration of the pattern form of the resist film can be prevented from occurring. Many are heretofore known as to the photoacid generator usable in the present invention, and a suitable one may be advantageously selected from the photoacid generators disclosed, for example, in Japanese Patent Laid-Open No. 2009-30007.

The photoacid generators can be used solely in one kind or combinedly in two or more kinds. The addition amount of the photoacid generator is preferably 0.01 to 50 parts by mass, more preferably 0.05 to 40 parts by mass relative to 100 parts by mass of the base polymer (i.e., the silicon-containing compound obtained by the above procedure).

In the present invention, it is possible to blend a surfactant, as required. Here, the surfactant is preferably nonionic, and examples thereof include perfluoroalkyl polyoxyethylene ethanols, fluorinated alkyl esters, perfluoroalkylamine oxides, perfluoroalkyl ethylene oxide adducts, and fluorine-containing organosiloxanes. Examples thereof include Fluorad "FC-430", "FC-431", and "FC-4430" (all produced by Sumitomo 3M Co., Ltd.), Surflon "S-141", "S-145", "KH-10", "KH-20", "KH-30", and "KH-40" (all produced by Asahi Glass Co., Ltd.), Unidain "DS-401", "DS-403", and "DS-451" (all produced by Daikin Industries Ltd.), Megafac "F-8151" (produced by Dainippon Ink And Chemicals, Incorporated), and "X-70-092" and "X-70-093" (both produced by Shin-Etsu Chemical Co., Ltd.). Preferable examples include Fluorad "FC-4430", "KH-20", "KH-30", and "X-70-093".

Note that the addition amount of the surfactant may be a typical amount within such a range not to obstruct the effect of the present invention, and the addition amount is preferably 0 to 10 parts by mass, particularly 0 to 5 parts by mass relative to 100 parts by mass of the base polymer.

Further, in the present invention, as a stabilizer, a monovalent or divalent or higher alcohol having a cyclic ether as a substitutional group, particularly ether compounds represented by the following formulae can be added, as required. Examples thereof include the following compounds.

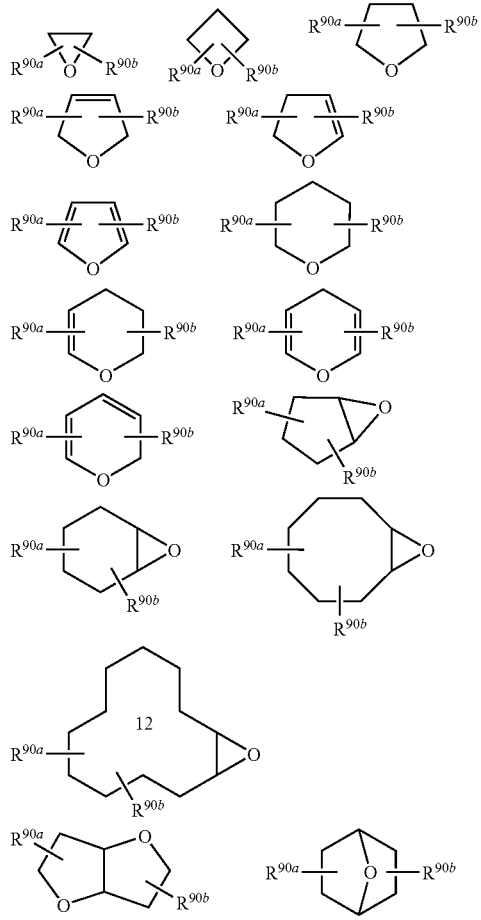

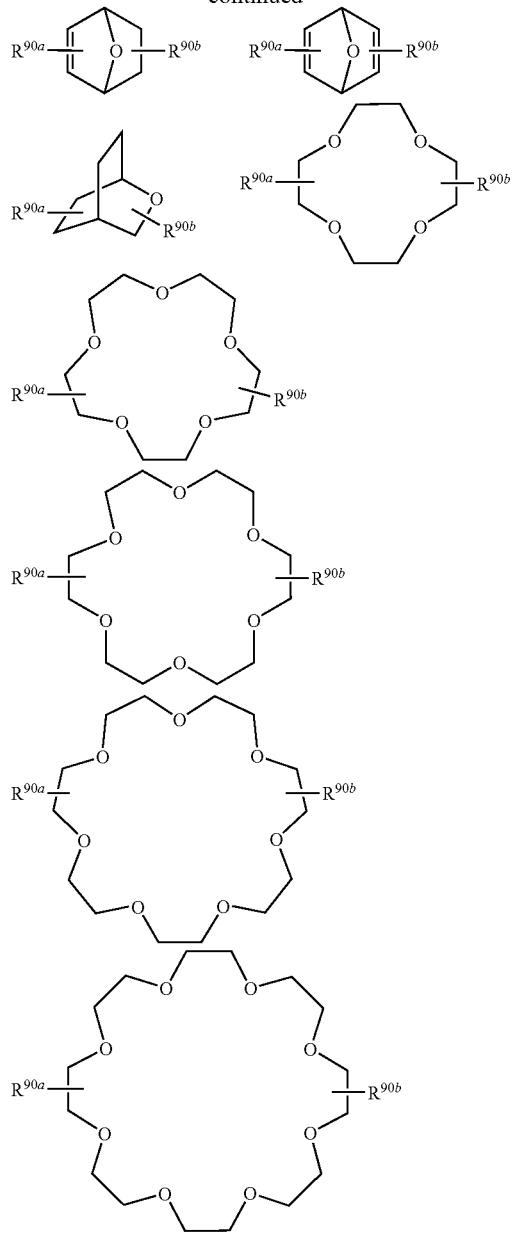

Wherein $R^{90a}$ is: a hydrogen atom; a linear, branched or cyclic monovalent hydrocarbon group having 1 to 10 carbon atoms; $R^{91}O-(CH_2CH_2O)_{n1}-(CH_2)_{n2}-$ (where $0 \le n1 \le 5$, $0 \le n2 \le 3$, and $R^{91}$ is a hydrogen atom or methyl group); or $R^{92}O-[CH(CH_3)CH_2O]_{n3}-(CH_2)_{n4}-$ (where $0 \le n3 \le 5$, $0 \le n4 \le 3$, and $R^{92}$ is a hydrogen atom or methyl group); and $R^{90b}$ is: a hydroxyl group; a linear, branched or cyclic monovalent hydrocarbon group having 1 to 10 carbon atoms having one or two or more hydroxyl groups; $HO-(CH_2CH_2O)_{n5}-(CH_2)_{n6}-$ (where $1 \le n5 \le 5$, and $1 \le n6 \le 3$); or $HO-[CH(CH_3)CH_2O]_{n7}-(CH_2)_{n8}-$ (where $1 \le n7 \le 5$, and $1 \le n8 \le 3$).

The silicon-containing antireflection film in the present invention useful as an etching mask can be formed on a substrate from the thermosetting silicon-containing antireflection film-forming composition of the present invention by spin coating or the like. After spin coating, the composition is desirably baked, so as to evaporate the solvent therein, and to promote crosslinking reaction for preventing the film from being mixed with the overlying resist film. Baking is to be preferably conducted within a temperature range of 50 to 500° C. and within a time range of 10 to 300 seconds. Particularly preferably, the temperature range is 400° C. or lower for decreased thermal damage against a device to be produced, depending on the structure thereof.

Here, it is possible in the present invention to form the silicon-containing antireflection film on a processing portion of a processing substrate by interposing a lower layer film therebetween, and to form a photoresist film on the silicon-containing antireflection film, thereby conducting pattern formation.

In this case, examples of processing portions of a processing substrate include a low-dielectric constant insulating film having a k value of 3 or less, a primarily processed low-dielectric constant insulating film, a nitrogen and/or oxygen-containing inorganic film, and a metal film.

More specifically, the processing substrate may be a base substrate formed thereon with a processing layer (processing portion). The base substrate is not particularly limited, and may be made of a material such as Si, amorphous silicon (α-Si), p-Si, SiO$_2$, SiN, SiON, W, TiN, Al, and the like, which is different from that of a processing layer. Usable as processing layers are Si, SiO$_2$, SiN, SiON, p-Si, α-Si, W, W—Si, Al, Cu, Al—Si, etc., various low dielectric films, and etching stopper films therefor, and each processing layer can be typically formed to have a thickness of 50 to 10,000 nm, particularly 100 to 5,000 nm.

In a multilayer resist process using the silicon-containing antireflection film according to the present invention, an organic film (underlayer film) having a naphthalene skeleton is formed between the silicon-containing antireflection film of the present invention and the substrate to be processed.

As to the organic film having a naphthalene skeleton, specifically many are heretofore known as the underlayer film; but, in the present invention, a resin having a naphthalene compound, a bisnaphthol compound, an acenaphthylene compound, or a naphthol compound is preferable.

For example, a resin having a bisnaphthol compound may be exemplified by the following general formulae (1) to (4).

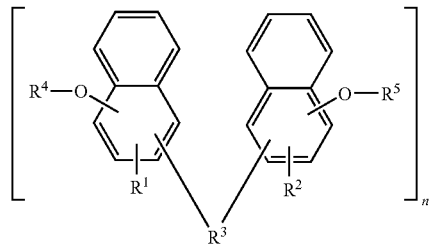
(1)

(In the above general formula (1), regardless of the foregoing descriptions, $R^1$ and $R^2$ independently represent a group, which is same or different each other, selected from a hydrogen atom, or a linear, a branched, or a cyclic alkyl group having 1 to 10 carbon atoms, an aryl group having 6 to 10 carbon atoms, or an alkenyl group having 2 to 10 carbon atoms;

$R^3$ represents a single bond, or a linear, a branched, or a cyclic alkylene group having 1 to 30 carbon atoms, which may optionally contain a bridged cyclic hydrocarbon group, a double bond, a hetero atom, or an aromatic group having 6 to 30 carbon atoms;

each $R^4$ and $R^5$ independently represents a hydrogen atom or a glycidyl group; and "n" represents an integer of 1 to 4.)

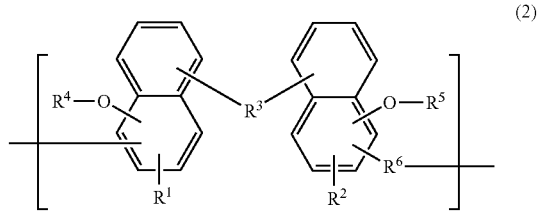
(2)

(In the above general formula (2), regardless of the foregoing descriptions, $R^1$ and $R^2$ independently represent a group, which is same or different each other, selected from a hydrogen atom, or a linear, a branched, or a cyclic alkyl group having 1 to 10 carbon atoms, an aryl group having 6 to 10 carbon atoms, or an alkenyl group having 2 to 10 carbon atoms;

$R^3$ represents a single bond, or a linear, a branched, or a cyclic alkylene group having 1 to 30 carbon atoms, which may optionally contain a bridged cyclic hydrocarbon group, a double bond, a hetero atom, or an aromatic group having 6 to 30 carbon atoms;

each $R^4$ and $R^5$ independently represents a hydrogen atom or a glycidyl group; and $R^6$ represents a single bond, or a linear or a branched alkylene group having 1 to 10 carbon atoms.)

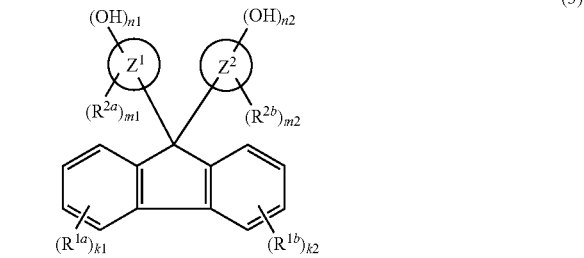
(3)

(In the above general formula (3), regardless of the foregoing descriptions, ring $Z^1$ and ring $Z^2$ represent a condensed polycyclic aromatic hydrocarbon ring, $R^{1a}$, $R^{1b}$, $R^{2a}$, and $R^{2b}$ represent a substituent which is same or different each other;

"k1" and "k2" represent 0 or an integer of 1 to 4 which is same or different each other;

"m1" and "m2" represent 0 or an integer of 1 or more respectively; and

"n1" and "n2" represent 0 or an integer of 1 or more respectively and n1+n2≥1.)

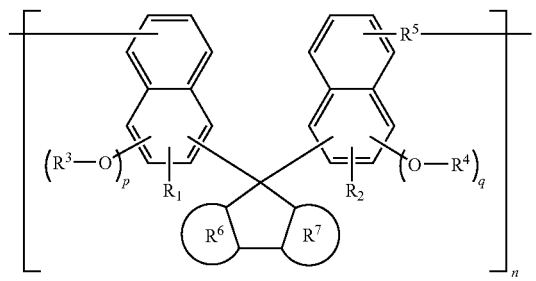
(4)

(In the above general formula (4), regardless of the foregoing descriptions, $R^1$ and $R^2$ independently represent a group, which is same or different each other, selected from a hydrogen atom, or a linear, a branched, or a cyclic alkyl group having 1 to 10 carbon atoms, an aryl group having 6 to 10 carbon atoms, or an alkenyl group having 2 to 10 carbon atoms;

each $R^3$ and $R^4$ independently represents a hydrogen atom or a glycidyl group;

$R^5$ represents a single bond, or a linear or a branched alkylene group having 1 to 10 carbon atoms;

each $R^6$ and $R^7$ represent a benzene ring or a naphthalene ring;

"p" and "q" are 1 or 2 respectively; and

"n" is a positive integer.)

For example, a resin having an acenaphthylene compound may be exemplified by the following general formulae (5) to (8).

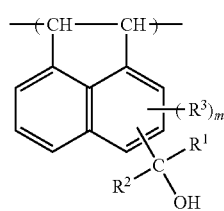

(5)

(In the above general formula (5), regardless of the foregoing descriptions, $R^1$ and $R^2$ represent a hydrogen atom, an alkyl group having 1 to 3 carbon atoms, or an aryl group;

$R^3$ represents an alkyl group having 1 to 3 carbon atoms, vinyl, allyl groups, or an aryl group which may be substituted; and "m" is 0, 1 or 2.)

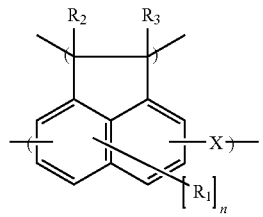

(6)

(In the above general formula (6), regardless of the foregoing descriptions, $R_1$ represents a monovalent atom or group except for a hydrogen atom, and "n" is 0 or an integer of 1 to 4. Note that plural $R_1$ may be same or different each other when "n" is in range of 2 to 4. $R_2$ and $R_3$ represent independently a monovalent atom or group. X represents a divalent group.)

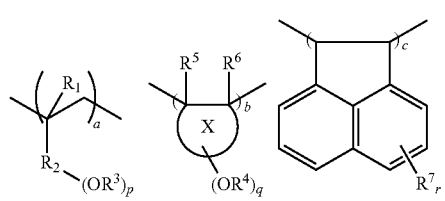

(7)

(In the above general formula (7), regardless of the foregoing descriptions, $R_1$ represents a hydrogen atom or a methyl group;

$R_2$ represents one of a single bond, a linear, a branched or a cyclic alkylene group having 1 to 20 carbon atoms, or an arylene group having 6 to 10 carbon atoms, which may optionally contain ether, ester, lactone or amide;

each $R^3$ and $R^4$ represents a hydrogen atom or a glycidyl group;

X represents a polymer of one of a hydrocarbon containing a indene skeleton, a cycloolefin having 3 to 10 carbon atoms, or a maleimide, which may optionally contain ether, ester, lactone or carboxylic acid anhydride;

each $R^5$ and $R^6$ represents one of a hydrogen atom, a fluorine atom, a methyl group or a trifluoromethyl group;

$R^7$ represents one of a hydrogen atom, a linear, a branched or a cyclic alkyl group having 1 to 6 carbon atoms, a hydroxyl group, or an alkoxycarbonyl group;

each "p" and "q" is an integer of 1 to 4;

"r" is an integer of 0 to 4; and

"a", "b" and "c" are in range of $0.5 \leq a+b+c \leq 1$, $0 \leq a \leq 0.8$, $0 \leq b \leq 0.8$, $0.1 \leq a+b \leq 0.8$, $0.1 \leq c \leq 0.8$ respectively.)

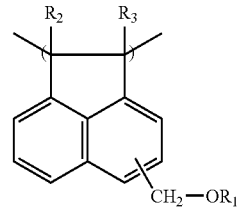

(8)

(In the above general formula (8), regardless of the foregoing descriptions, $R_1$ represents a hydrogen atom or a monovalent organic group; and $R_2$ and $R_3$ represent a monovalent atom or a monovalent organic group independently each other.)

For example, a resin having a naphthol compound may be exemplified by the following general formulae (9) to (12).

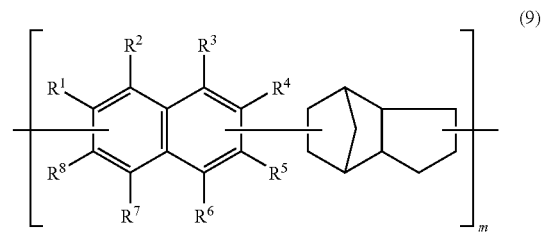

(9)

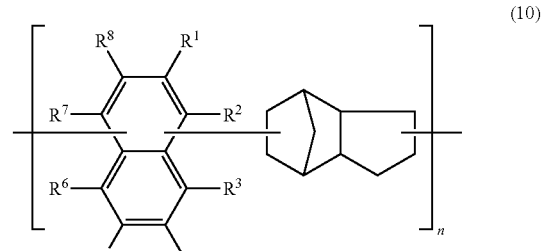

(10)

(In the above general formulae (9) and (10), regardless of the foregoing descriptions, $R^1$ to $R^8$ each independently represent a hydrogen atom, a hydroxyl group, an alkyl group which may be substituted, having 1 to 6 carbon atoms, an alkoxy group which may be substituted, having 1 to 6 carbon atoms, an alkoxycarbonyl group which may be substituted, having 2 to 6 carbon atoms, an aryl group which may be substituted, having 6 to 10 carbon atoms, a hydroxyalkyl group which may be substituted, having 1 to 6 carbon atoms, an isocyanate group or a glycidyl group; and each "m" and "n" is a positive integer.)

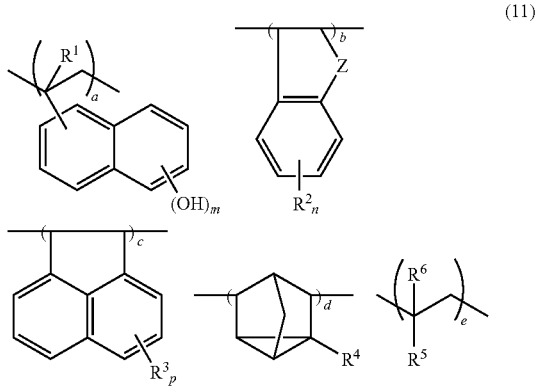

(11)

(In the above general formula (11), regardless of the foregoing descriptions, $R^1$ and $R^6$ represent a hydrogen atom or a methyl group;

$R^2$, $R^3$ and $R^4$ represent a hydrogen atom, an alkyl group having 1 to 4 carbon atoms, an alkoxy group, a hydroxyl group, an acetoxyl group, an alkoxycarbonyl group, or an aryl group having 6 to 10 carbon atoms;

$R^5$ represents one of a condensed polycyclic hydrocarbon group having 13 to 30 carbon atoms, $-O-R^7$, $-C(=O)-O-R^7$, $-O-C(=O)-R^7$ or $-C(=O)NR^8-R^7$;

Z represents one of a methylene group, an oxygen atom or a sulfur atom;

"m" is 1 or 2;

"n" is an integer of 0 to 4;

"p" is an integer of 0 to 6;

$R^7$ represents an organic group having 7 to 30 carbon atoms;

$R^8$ represents a hydrogen atom or a hydrocarbon group having 1 to 6 carbon atoms; and "a", "b", "c", "d" and "e" are in range of $0<a<1.0$, $0\leq b\leq 0.8$, $0\leq c\leq 0.8$, $0\leq d\leq 0.8$, $0\leq e\leq 0.8$, $0<b+c+d+e<1.0$ respectively.)

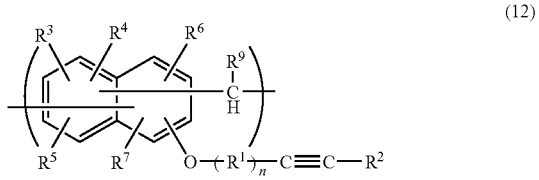

(12)

(In the above general formula (12), regardless of the foregoing descriptions, "n" is 0 or 1;

$R^1$ represents a methylene group which may be substituted, an alkylene group which may be substituted, having 2 to 20 carbon atoms, or an arylene group which may be substituted, having 6 to 20 carbon atoms;

$R^2$ represents a hydrogen atom, an alkyl group which may be substituted, having 1 to 20 carbon atoms or an aryl group which may be substituted, having 6 to 20 carbon atoms;

$R^3$ to $R^7$ represent a hydroxyl group, an alkyl group which may be substituted, having 1 to 6 carbon atoms, an alkoxyl group which may be substituted, having 1 to 6 carbon atoms, an alkoxycarbonyl group which may be substituted, having 2 to 10 carbon atoms, an aryl group which may be substituted having 6 to 14 carbon atoms or a glycidyl ether group which may be substituted, having 2 to 6 carbon atoms; and $R^9$ represents a hydrogen atom, a linear, a branched or a cyclic alkyl group having 1 to 10 carbon atoms, a linear, a branched or a cyclic alkyl ether group having 1 to 10 carbon atoms, or an aryl group group having 6 to 10 carbon atoms.)

In the case of a multilayer resist process in which the organic film having a naphthalene skeleton like this is used as the underlayer film which serves as an etching mask of the substrate to be processed, the organic film is the one that transforms—after a formed resist pattern is transformed to the silicon-containing antireflection film—the transformed pattern once more, wherein it has properties of capable of being processed by etching under the etching conditions in which the silicon-containing antireflection film shows a high etching resistance, while it has a high etching resistance and a pattern-deformation resistance under the conditions in which a processing substrate is processed by etching.

The foregoing organic film as the underlayer film can be formed on a substrate by such a process as spin coating by using a composition solution containing a resin that contains a compound having a naphthalene skeleton. After the resist underlayer film is formed by such a process as spin coating, it is preferable to bake it to evaporate an organic solvent. It is preferable that the baking be done at the temperature in a range of 80 to 500° C. and the time in a range of 10 to 3,000 seconds.

Meanwhile, the thickness of the underlayer film is preferably in a range of 10 nm or more, in particular 50 nm or more, and 50,000 nm or less, though not limited to them, depending on etching-process conditions. The thickness of the silicon-containing antireflection film of the present invention is preferably in a range of 1 nm or more and 200 nm or less, and the thickness of the photoresist film is preferably in a range of 1 nm or more and 300 nm or less.

Further, in the present invention, it is possible to form a commercially available organic antireflection film between the silicon-containing antireflection film and the overlying resist film. At this time, the organic antireflection film is made to have a structure of a compound having an aromatic substitutional group. Further, this organic antireflection film is required to impose no etching loads to an overlying resist film, upon transference of a pattern of the overlying resist film by dry etching. For example, film thicknesses of 80% or less, preferably 50% or less relative to an overlying resist film result in extremely small loads upon dry etching.

In this case, the organic antireflection film is preferably adjusted to exhibit a minimum reflectance of 2% or less, preferably 1% or less, and more preferably 0.5% or less.

When the silicon-containing antireflection film of the present invention is used in an exposure process based on ArF excimer laser light, the overlying photoresist film may be any of typical resist compositions for ArF excimer laser light. Numerous candidates are known for a resist composition for ArF excimer laser light, such that each of them includes as main components: in case of a positive resist type, a resin which is made soluble in an alkaline aqueous solution as a result of decomposition of acid labile groups by an action of an acid, a photoacid generator, and a basic substance for controlling acid diffusion; and in case of a negative resist type, a resin which is made insoluble in an alkaline aqueous solution as a result of reaction with a crosslinker by an action of an acid, a photoacid generator, a crosslinker, and a basic substance for controlling acid diffusion; such that the characteristics of the resist compositions differ depending on what types of resins are used. Already known resins are generally classified into poly(meth)acrylic, COMA (cycloolefin maleic anhydride), COMA-(meth)acrylic hybrid, ROMP (ring-opening metathesis polymerization), and polynorbornene systems. Among them, the resist composition adopting a poly(meth)acrylic resin has an alicycle skeleton introduced into a side-chain to ensure an etching resistance, to exhibit a resolution performance superior to other resin systems.

While many are known as resist compositions adopting poly(meth)acrylic resins for ArF excimer laser, the polymer in any of positive compositions is constituted of: a combination of units for ensuring an etching resistance as a main function, units which are decomposed by an action of an acid and turned to be alkali soluble, and units for ensuring adhesion; or a combination including one unit capable of providing two or more of the above functions, as the case may be. Particularly preferably used among them as the unit to be changed in alkali solubility by an acid, are (meth)acrylic acid esters having an acid labile group with an adamantane skeleton (Japanese Patent Laid-Open (kokai) No. H9-73173), and (meth)acrylic acid esters having an acid labile group with a norbornane or tetracyclododecane skeleton (Japanese Patent Laid-Open (kokai) No. 2003-84438), by virtue of higher resolution and etching resistance provided by them. Further, particularly preferably used as the units for ensuring adhesion, are (meth)acrylic acid esters having a norbornane side chain with a lactone ring (WO 00/01684), (meth)acrylic acid esters having an oxanorbornane side chain (Japanese Patent Laid-Open (kokai) No. 2000-159758), and (meth)acrylic acid esters having a hydroxyadamantyl side chain (Japanese Patent Laid-Open (kokai) No. H8-12626), by virtue of satisfactory etching resistance and higher resolution provided by them. However, it has become a problem that inclusion of fluorine in the polymer deteriorates an etching resistance. The silicon-containing antireflection film as an etching mask of the present invention can be particularly effectively used for the organic resist composition which is difficult to ensure an etching resistance as described above.

In a resist composition for an ArF excimer laser containing the foregoing polymer are contained additionally an acid generator, a basic compound, and so on, wherein almost the same acid generators as those usable in the thermosetting silicon-containing antireflection film-forming composition of the present invention can be used; while an onium salt is particularly advantageous in view of sensitivity and resolution. Further, as to the basic compound, many are heretofore known, and are exemplified in recently published Japanese Patent Laid-Open (kokai) No. 2005-146252; from them an appropriate compound can be advantageously selected.

After fabrication of the silicon-containing antireflection film layer as an etching mask by using the thermosetting silicon-containing antireflection film-forming composition of the present invention, there is created a photoresist layer by a photoresist composition solution on the silicon-containing antireflection film, and spin coating is preferably adopted similarly to the silicon-containing antireflection film layer as an etching mask. After spin coating of the resist composition, prebaking is to be conducted, preferably in ranges of 80 to 180° C. and 10 to 300 seconds. Exposure is conducted then, followed by post-exposure bake (PEB) and development, to obtain a resist film pattern.

In addition, a resist top coat may be formed further on the photoresist layer (film).

Etching of the silicon-containing antireflection film as an etching mask is conducted by adopting a fluorine-based gas, a nitrogen gas, or a carbonic acid gas. The silicon-containing antireflection film as an etching mask of the present invention is characterized to exhibit a faster etching speed to the above gas, and thus to realize a smaller amount of film decrease of the overlying photoresist film.

The three-layer resist process using the silicon-containing antireflection film as an etching mask of the present invention is configured as follows, for example. In this process, an organic film having a naphthalene skeleton is firstly created on a processing substrate, by spin coating or the like. The organic film is desirably high in etching resistance because the organic film acts as a mask upon etching of the processing substrate, and the organic film is to be desirably cross-linked by heat or acid after spin coating because the organic film is required not to be mixed with an overlying silicon-containing antireflection film as an etching mask. On the organic film, the silicon-containing antireflection film as an etching mask to be obtained from the composition of the present invention, the organic antireflection film, a photoresist film and a resist top coat are formed by the above-described procedures. According to a usual manner, the photoresist film is: pattern exposed by adopting a light source corresponding to the photoresist film such as KrF excimer laser light, ArF excimer laser light or $F_2$ laser light; heat-treated under the condition adapted to the individual resist film; and then subjected to a developing operation by a developer, to allow for obtainment of a resist pattern. Next, etching is conducted for the silicon-containing antireflection film, by using this resist film pattern as an etching mask, and under a dry etching condition such as dry etching by a fluorine-based gas plasma where the etching speed of the silicon-containing antireflection film is significantly higher than that of the organic film. When etching is conducted for the above-mentioned antireflection film and the silicon-containing antireflection film, the silicon-containing antireflection film pattern can be obtained, substantially without undergoing an affection of a pattern change due to side etching of the resist film. Next, the substrate carrying the silicon-containing antireflection film pattern having the above obtained resist pattern transferred thereto, is subjected to conduction of dry etching under a condition that the etching speed of the underlying organic film is significantly higher than that of the silicon-containing antireflection film, such as reactive dry etching by gas plasma containing oxygen, and reactive dry etching by gas plasma containing hydrogen-nitrogen, to thereby etching the underlying organic film. By this etching process, a pattern of the underlying organic film is obtained, and simultaneously therewith, the resist layer as the uppermost layer is typically lost. Further, the thus obtained underlying organic film pattern is used as an etching mask to conduct dry etching of the processing substrate such as fluorine-based dry etching, or chlorine-based dry etching, thereby enabling precise etching of the processing substrate. In the above example, the organic antireflective film and the resist top coat are formed, as required, and there is a case that these films are not always used.

EXAMPLE

Although the present invention will be concretely explained by describing Preparation Examples, Examples, and Comparative Examples, the present invention is not limited by the description.

Preparation Examples 1 to 19

Into a 1,000 mL glass flask were added 200 g of methanol, 200 g of ion-exchanged water, and 1 g of 35% hydrochloric acid; then an addition of a silane mixture was followed during one hour at room temperature with the amounts of each component as shown in Table 1. After the mixture was agitated, as it was, at room temperature for 8 hours, 400 g of propylene glycol monoethyl ether was added; then the resulting mixture was concentrated under reduced pressure to obtain a propylene glycol monoethyl ether solution of a silicon-containing compound. Molecular weight of this product relative to the polystyrene standard was measured. The results of these preparations are shown in Table 1.

TABLE 1

| | Composition of monomer mixture | | | | | | | | Mw | Weight of obtained solution | Polymer concentration |
|---|---|---|---|---|---|---|---|---|---|---|---|
| | Monomer | Weight | Monomer | Weight | Monomer | Weight | Monomer | Weight | | | |
| Preparation Example 1 | M1 | 100 g | M3 | 50 g | M5 | 11 g | | | 2000 | 350 g | 20% |
| Preparation Example 2 | M1 | 100 g | M3 | 50 g | M4 | 11 g | | | 3000 | 350 g | 21% |
| Preparation Example 3 | M2 | 60 g | M3 | 60 g | M6 | 11 g | | | 2500 | 350 g | 20% |
| Preparation Example 4 | M2 | 70 g | M3 | 25 g | M4 | 20 g | M7 | 25 g | 1800 | 350 g | 22% |
| Preparation Example 5 | M10 | 165 g | M3 | 25 g | M10 | 1 g | | | 2000 | 350 g | 20% |
| Preparation Example 6 | M3 | 125 g | M10 | 1 g | | 5 g | | | 3500 | 350 g | 19% |
| Preparation Example 7 | M1 | 130 g | M8 | 30 g | M11 | 5 g | | | 2200 | 350 g | 19% |
| Preparation Example 8 | M1 | 125 g | M10 | 35 g | | | | | 3000 | 350 g | 19% |
| Preparation Example 9 | M1 | 140 g | M4 | 1 g | M8 | 5 g | | | 2200 | 350 g | 20% |
| Preparation Example 10 | M1 | 150 g | M4 | 2 g | M8 | 25 g | | | 2500 | 350 g | 19% |
| Preparation Example 11 | M1 | 140 g | M4 | 21 g | M8 | 7 g | | | 2500 | 350 g | 20% |
| Preparation Example 12 | M1 | 155 g | M10 | 21 g | | | | | 2800 | 350 g | 19% |
| Preparation Example 13 | M2 | 100 g | M3 | 40 g | M9 | 10 g | | | 2100 | 350 g | 20% |
| Preparation Example 14 | M3 | 125 g | M8 | 1 g | | | | | 3500 | 350 g | 20% |
| Preparation Example 15 | M2 | 100 g | M3 | 20 g | M8 | 20 g | | | 2100 | 350 g | 21% |
| Preparation Example 16 | M3 | 80 g | M8 | 35 g | | | | | 3000 | 350 g | 20% |
| Preparation Example 17 | M2 | 90 g | M8 | 39 g | | | | | 1800 | 350g | 19% |
| Preparation Example 18 | M3 | 95 g | M5 | 45 g | | | | | 2000 | 350g | 20% |
| Preparation Example 19 | M1 | 10 g | M9 | 60 g | | | | | 1500 | 350g | 20% |

M1: tetraethoxysilane
M2: tetramethoxysilane
M3: methyltrimethoxysilane
M4: 3-trimethoxysilyltoluene
M5: 3-trimethoxysilylanisole
M6: 3,5-dimethylphenyltrimethoxysilane
M7:

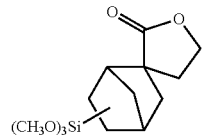

M8: phenyltrimethoxysilane
M9: 1-trimethoxynaphthalene
M10: 3-methyl-4-methoxyphenyltrimethoxysilane
M11: 3,4,5-trimethylphenyltrimethoxysilane Examples and Comparative Examples The polymers obtained in the Preparation Examples 1 to 19 and named silicon-containing compounds 1 to 19 respectively, an acid, a thermal crosslinking accelerator, a solvent, an additive were mixed with one another at ratios listed in Table 2, respectively, followed by filtration by a filter made of fluororesin of a 0.1 μm size, to prepare thermosetting silicon-containing antireflection film-forming composition solutions named Sol. 1 to 19, respectively.

TABLE 2

| No. | Silicon-containing compound (parts by mass) | Thermal cross-linking accelerator (parts by mass) | Acid (parts by mass) | Solvent (parts by mass) | Water (parts by mass) |
|---|---|---|---|---|---|
| Sol. 1 | Compound 1 (4.0) | TPSOAc (0.04) | Maleic acid (0.04) | Propylene glycol monoethyl ether (100) | water (10) |

TABLE 2-continued

| No. | Silicon-containing compound (parts by mass) | Thermal cross-linking accelerator (parts by mass) | Acid (parts by mass) | Solvent (parts by mass) | Water (parts by mass) |
|---|---|---|---|---|---|
| Sol. 2 | Compound 2 (4.0) | TPSOAc (0.04) | Acetic acid (0.06) | Propylene glycol monoethyl ether (100) | water (5) |
| Sol. 3 | Compound 3 (4.0) | TPSCl (0.04) TMAOAc (0.003) | Maleic acid (0.04) | Propylene glycol monoethyl ether (100) | water (5) |
| Sol. 4 | Compound 4 (4.0) | TPSMA (0.04) TMAOAc (0.003) | Maleic acid (0.02) Oxalic acid (0.02) | Propylene glycol monoethyl ether (100) | water (5) |
| Sol. 5 | Compound 5 (4.0) | | Maleic acid (0.02) Oxalic acid (0.02) | Propylene glycol monoethyl ether (100) | water (5) |
| Sol. 6 | Compound 6 (4.0) | | Maleic acid (0.04) | Propylene glycol monoethyl ether (100) | water (5) |
| Sol. 7 | Compound 7 (4.0) | TPSMA (0.04) | Maleic acid (0.04) | Propylene glycol monoethyl ether (100) | water (5) |
| Sol. 8 | Compound 8 (4.0) | TPSN (0.04) | Maleic acid (0.04) | Propylene glycol monoethyl ether (100) | |
| Sol. 9 | Compound 9 (4.0) | TPSMA (0.04) | Maleic acid (0.04) | Propylene glycol monoethyl ether (100) | water (5) |
| Sol. 10 | Compound 10 (4.0) | TPSMA (0.04) | Maleic acid (0.04) | Propylene glycol monoethyl ether (100) | water (5) |
| Sol. 11 | Compound 11 (4.0) | TPSMA (0.04) | Maleic acid (0.04) | Propylene glycol monoethyl ether (100) | water (5) |
| Sol. 12 | Compound 12 (4.0) | TPSMA (0.04) | Maleic acid (0.04) | Propylene glycol monoethyl ether (100) | water (5) |
| Sol. 13 | Compound 13 (4.0) | TPSMA (0.04) | Maleic acid (0.04) | Propylene glycol monoethyl ether (100) | |
| Sol. 14 | Compound 14 (4.0) | TPSMA (0.04) | Maleic acid (0.04) | Propylene glycol monoethyl ether (100) | water (5) |
| Sol. 15 | Compound 15 (4.0) | TPSOAc (0.04) | Maleic acid (0.04) | Propylene glycol monoethyl ether (100) | water (5) |
| Sol. 16 | Compound 16 (4.0) | TPSOAc (0.04) | Maleic acid (0.04) | Propylene glycol monoethyl ether (100) | water (5) |
| Sol. 17 | Compound 17 (4.0) | TPSOAc (0.04) | Maleic acid (0.04) | Propylene glycol monoethyl ether (100) | water (5) |
| Sol. 18 | Compound 18 (4.0) | TPSOAc (0.04) | Maleic acid (0.04) | Propylene glycol monoethyl ether (100) | water (5) |
| Sol. 19 | Compound 19 (4.0) | TPSOAc (0.04) | Maleic acid (0.04) | Propylene glycol monoethyl ether (100) | |

TPSOAc: triphenylsulfonium acetate (photo-degradable thermal crosslinking accelerator)
TPSCl: triphenylsulfonium chloride (photo-degradable thermal crosslinking accelerator)
TPSMA: mono(triphenylsulfonium) maleate (photo-degradable thermal crosslinking accelerator)
TPSN: triphenylsulfonium nitrate (photo-degradable thermal crosslinking accelerator)

Then, each of Sol. 1 to 19 was applied by spin-coating, and baked at 200° C. for one minute to form a silicon-containing antireflection film having the film thickness of 40 nm (referred to as Film 1 to 19, respectively). The optical constants (refractive index "n" and extinction coefficient "k") of the respective Film 1 to 19 at the wavelength of 193 nm were measured by a spectroscopic ellipsometer with a variable incidence angle (VASE, manufactured by J. A. Woollam Co., Inc.). The results are shown in Table 3.

TABLE 3

| | Optical constant | | condition expression | | |
|---|---|---|---|---|---|
| No. | Reflective index: n | Extinction coefficient: k | $2n - 3.08 \leq k$ | $k \leq 20n - 29.4$ | $0.01 \leq k \leq 0.5$ |
| Film 1 | 1.50 | 0.15 | True | True | True |
| Film 2 | 1.60 | 0.30 | True | True | True |
| Film 3 | 1.55 | 0.20 | True | True | True |

TABLE 3-continued

| | Optical constant | | condition expression | | |
|---|---|---|---|---|---|
| No. | Reflective index: n | Extinction coefficient: k | 2n − 3.08 ≤ k | k ≤ 20n − 29.4 | 0.01 ≤ k ≤ 0.5 |
| Film 4 | 1.60 | 0.40 | True | True | True |
| Film 5 | 1.48 | 0.01 | True | True | True |
| Film 6 | 1.54 | 0.01 | True | True | True |
| Film 7 | 1.79 | 0.50 | True | True | True |
| Film 8 | 1.50 | 0.49 | True | True | True |
| Film 9 | 1.57 | 0.10 | True | True | True |
| Film 10 | 1.72 | 0.36 | True | True | True |
| Film 11 | 1.62 | 0.49 | True | True | True |
| Film 12 | 1.49 | 0.30 | True | True | True |
| Film 13 | 1.47 | 0.02 | True | False | True |
| Film 14 | 1.58 | 0.02 | False | True | True |
| Film 15 | 1.70 | 0.30 | False | True | True |
| Film 16 | 1.79 | 0.48 | False | True | True |
| Film 17 | 1.77 | 0.51 | True | True | False |
| Film 18 | 1.50 | 0.51 | True | True | False |
| Film 19 | 1.49 | 0.48 | True | False | True |

(Pattern Etching Test)

As a material for the resist underlayer film, a composition (28 parts by mass of a resin and 100 parts by mass of a solvent) containing bisnaphthol fluorene resin (Polymer 1) was applied by spin-coating onto a Si wafer substrate with a diameter of 300 mm having a formed SiO$_2$ film having the film thickness of 200 nm; then it was baked at 310° C. for one minute to form UL-1 having the film thickness of 300 nm.

polymer 1

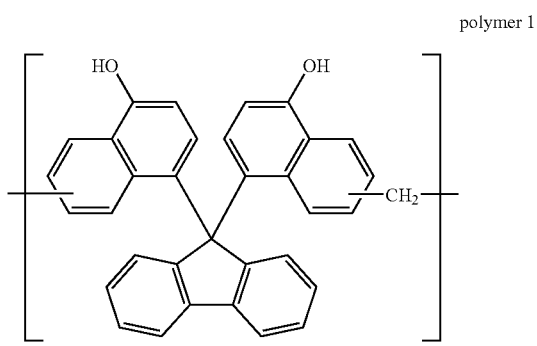

As the other material for the underlayer film, a composition (26 parts by mass of a resin, 4 parts by mass of a crosslinker, 1 part by mass of an acid generator, and 100 parts by mass of a solvent) containing a copolymer resin of acenaphthylene and 4-hydroxystyrene (Polymer 2, molecular weight of 8,800) was applied by spin-coating onto a Si wafer substrate with a diameter of 300 mm having a formed SiO$_2$ film having the film thickness of 200 nm; then it was baked at 200° C. for one minute to form UL-2 having the film thickness of 300 nm.

Polymer 2

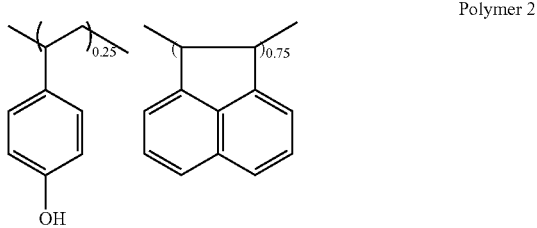

Then, as the other material for the underlayer film, a composition (28 parts by mass of a resin, 4 parts by mass of a crosslinker, 1 part by mass of an acid generator, and 100 parts by mass of a solvent) containing a copolymer resin of 6-hydroxy-2-vinylnaphthalene and indene (Polymer 3, molecular weight of 15,000) was applied by spin-coating onto a Si wafer substrate with a diameter of 300 mm having a formed SiO$_2$ film having the film thickness of 200 nm; then it was baked at 200° C. for one minute to form UL-3 having the film thickness of 300 nm.

Polymer 3

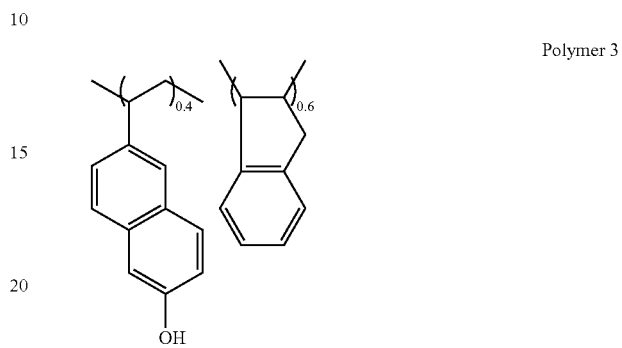

Onto it was applied a coating solution for forming a silicon-containing antireflection film (Sol. 1 to Sol. 19); and then it was baked at 200° C. for 60 seconds to form a resist intermediate layer film having the film thickness of 35 nm. Then, a material for a resist upperlayer film (SL resist solution for an ArF) was applied; then it was baked at 105° C. for 60 seconds to form a resist upperlayer film having the film thickness of 100 nm. The resist upperlayer film was coated with an immersion top coat (TC-1); then it was baked at 90° C. for 60 seconds to form a top coat having the film thickness of 50 nm.

A material for the resist upperlayer film was prepared by dissolving a resin, an acid generator, and a basic compound into a solvent containing 0.1% by mass of FC-4430 (manufactured by Sumitomo 3M Limited) in accordance with the composition as shown in Table 4, which was followed by filtering the resulting mixture through a 0.1 μm filter made of a fluorinated resin.

TABLE 4

| No. | Resin (parts by mass) | Acid generator (parts by mass) | Basic compound (parts by mass) | Solvent (parts by mass) |
|---|---|---|---|---|
| SL resist for ArF | ArF monolayer resist polymer (100) | PAG 1 (6.6) | TMMEA (0.8) | PGMEA (2,500) |

As ArF monolayered resist polymer, PAG1 and TMMEA in Table 4, the followings were used.

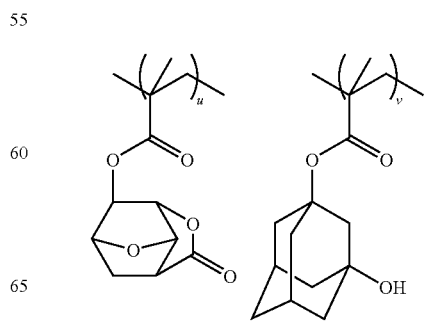

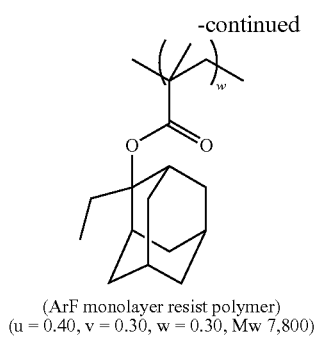

(ArF monolayer resist polymer)
(u = 0.40, v = 0.30, w = 0.30, Mw 7,800)

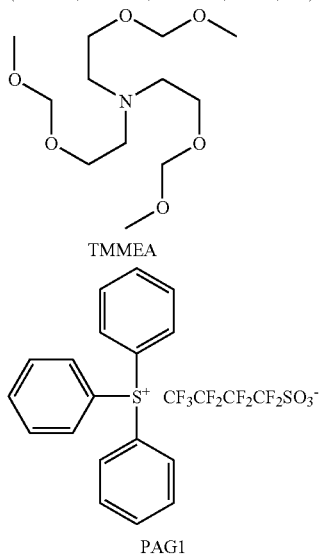

TMMEA

PAG1

A resin having a composition shown in Table 5, was dissolved into a solvent, followed by filtration by a filter made of fluororesin of a 0.1 μm size, to prepare a immersion resist top coat (TC-1).

TABLE 5

| | Resin (parts by mass) | Organic solvent (parts by mass) |
|---|---|---|
| TC-1 | Top coat polymer (100) | diisoamyl ether (2,700) 2-methyl-1-butanol (270) |

Top coat polymer:
 molecular weight (Mw)=8,800
 dispersity (Mw/Mn)=1.69

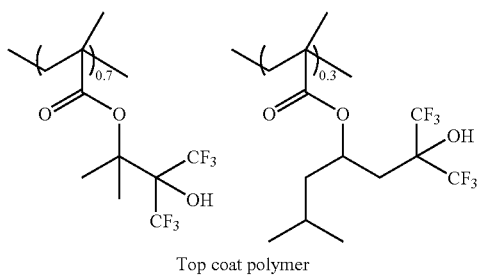

Top coat polymer

Then, the exposure was made with an ArF immersion exposure instrument (NSR-S610C manufactured by Nikon Corp. with NA of 1.30, σ of 0.98/0.65, 35°-dipole polarized illumination, and 6%-half tone phase shift mask), which was followed by baking (PEB) at 100° C. for 60 seconds, and then by development in an aqueous solution containing 2.38% by mass of tetramethyl ammonium hydroxide (TMAH) for 30 seconds to obtain a 43-nm 1:1 positive line-and-space pattern.

Subsequently, as the comparative material for the underlayer film, a composition (28 parts by mass of a resin and 100 parts by mass of a solvent) containing a 4,4'-(9H-fluorene-9-ylidene) bisphenol novolak resin (Comparative Polymer 1, molecular weight of 11,000) was applied by spin-coating onto a Si wafer substrate with a diameter of 300 mm having a formed $SiO_2$ film having the film thickness of 200 nm; then it was baked at 300° C. for one minute to form UL-4 having the film thickness of 300 nm.

Comparative polymer 1

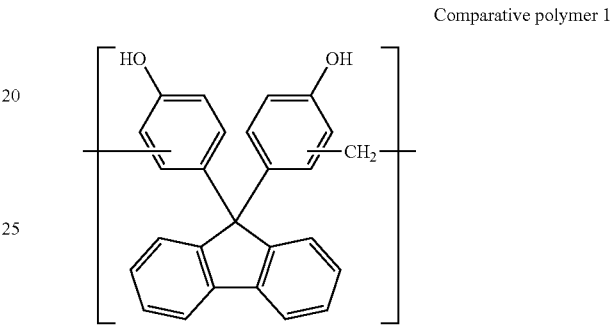

Onto it was applied Sol. 1 to Sol. 19, a coating solution for forming a silicon-containing antireflection film; and then it was baked at 200° C. for 60 seconds to form a resist intermediate layer film having the film thickness of 35 nm, in a similar manner to the foregoing. Then, a material for a resist upperlayer film (SL resist solution for an ArF) was applied; and then it was baked at 105° C. for 60 seconds to form a resist upperlayer film having the film thickness of 100 nm. The resist upperlayer film was coated with an immersion top coat (TC-1); then it was baked at 90° C. for 60 seconds to form a top coat having the film thickness of 50 nm.

Thereafter, a silicon-containing antireflection film (Film 1 to 19) was processed by dry etching with an etching instrument Telius (manufactured by Tokyo Electron Ltd.) by using a mask of a resist pattern; an organic underlayer film was processed by using a mask of the silicon-containing antireflection film; and a $SiO_2$ film was processed by using a mask of the obtained organic underlayer film. The etching was done under the conditions shown below.

Transfer condition of a resist pattern to a silicon-containing antireflection film:
 Chamber Pressure: 10.0 Pa
 RF power: 1,500 W
 $CF_4$ gas flow rate: 75 sccm
 $O_2$ gas flow rate: 15 sccm
 Time: 15 sec
Transfer condition of a silicon-containing antireflection film to an underlying organic film:
 Chamber Pressure: 2.0 Pa
 RF power: 500 W
 Ar gas flow rate: 75 sccm
 $O_2$ gas flow rate: 45 sccm
 Time: 120 sec
Transfer condition of an underlying organic film to an $SiO_2$ film:
 Chamber Pressure: 2.0 Pa
 RF power: 2,200 W
 $C_5F_{12}$ gas flow rate: 20 sccm $C_2F_6$ gas flow rate: 10 sccm
Ar gas flow rate: 300 sccm
$O_2$ gas flow rate: 60 sccm
Time: 90 sec Cross section of the pattern was observed by an electron microscope (S-4700, manufactured by Hitachi Ltd.) and the forms were compared. Results of Examples and Comparative Examples are summarized in Table 6 and Table 7, respectively.

TABLE 6

| Example | Underlying organic film | Silicon-containing antireflection film | Overlying resist film | Pattern profile after development | Profile after etching for transfer to silicon containing film | Profile after etching for transfer to underlying organic film | Profile after etching for transfer to substrate | Pattern deformation after etching for transfer to substrate |
|---|---|---|---|---|---|---|---|---|
| 1 | UL-1 | Film 1 | SL resist for ArF | Perpendicular | Perpendicular | Perpendicular | Perpendicular | None |
| 2 | UL-1 | Film 2 | SL resist for ArF | Perpendicular | Perpendicular | Perpendicular | Perpendicular | None |
| 3 | UL-1 | Film 3 | SL resist for ArF | Perpendicular | Perpendicular | Perpendicular | Perpendicular | None |
| 4 | UL-1 | Film 4 | SL resist for ArF | Perpendicular | Perpendicular | Perpendicular | Perpendicular | None |
| 5 | UL-1 | Film 5 | SL resist for ArF | Perpendicular | Perpendicular | Perpendicular | Perpendicular | None |
| 6 | UL-1 | Film 6 | SL resist for ArF | Perpendicular | Perpendicular | Perpendicular | Perpendicular | None |
| 7 | UL-1 | Film 7 | SL resist for ArF | Perpendicular | Perpendicular | Perpendicular | Perpendicular | None |
| 8 | UL-1 | Film 8 | SL resist for ArF | Perpendicular | Perpendicular | Perpendicular | Perpendicular | None |
| 9 | UL-1 | Film 9 | SL resist for ArF | Perpendicular | Perpendicular | Perpendicular | Perpendicular | None |
| 10 | UL-1 | Film 10 | SL resist for ArF | Perpendicular | Perpendicular | Perpendicular | Perpendicular | None |
| 11 | UL-1 | Film 11 | SL resist for ArF | Perpendicular | Perpendicular | Perpendicular | Perpendicular | None |
| 12 | UL-1 | Film 12 | SL resist for ArF | Perpendicular | Perpendicular | Perpendicular | Perpendicular | None |
| 13 | UL-2 | Film 1 | SL resist for ArF | Perpendicular | Perpendicular | Perpendicular | Perpendicular | None |
| 14 | UL-2 | Film 2 | SL resist for ArF | Perpendicular | Perpendicular | Perpendicular | Perpendicular | None |
| 15 | UL-2 | Film 3 | SL resist for ArF | Perpendicular | Perpendicular | Perpendicular | Perpendicular | None |
| 16 | UL-2 | Film 4 | SL resist for ArF | Perpendicular | Perpendicular | Perpendicular | Perpendicular | None |
| 17 | UL-2 | Film 5 | SL resist for ArF | Perpendicular | Perpendicular | Perpendicular | Perpendicular | None |
| 18 | UL-2 | Film 6 | SL resist for ArF | Perpendicular | Perpendicular | Perpendicular | Perpendicular | None |
| 19 | UL-2 | Film 7 | SL resist for ArF | Perpendicular | Perpendicular | Perpendicular | Perpendicular | None |
| 20 | UL-2 | Film 8 | SL resist for ArF | Perpendicular | Perpendicular | Perpendicular | Perpendicular | None |
| 21 | UL-2 | Film 9 | SL resist for ArF | Perpendicular | Perpendicular | Perpendicular | Perpendicular | None |
| 22 | UL-2 | Film 10 | SL resist for ArF | Perpendicular | Perpendicular | Perpendicular | Perpendicular | None |
| 23 | UL-2 | Film 11 | SL resist for ArF | Perpendicular | Perpendicular | Perpendicular | Perpendicular | None |
| 24 | UL-2 | Film 12 | SL resist for ArF | Perpendicular | Perpendicular | Perpendicular | Perpendicular | None |
| 25 | UL-3 | Film 1 | SL resist for ArF | Perpendicular | Perpendicular | Perpendicular | Perpendicular | None |
| 26 | UL-3 | Film 2 | SL resist for ArF | Perpendicular | Perpendicular | Perpendicular | Perpendicular | None |
| 27 | UL-3 | Film 3 | SL resist for ArF | Perpendicular | Perpendicular | Perpendicular | Perpendicular | None |
| 28 | UL-3 | Film 4 | SL resist for ArF | Perpendicular | Perpendicular | Perpendicular | Perpendicular | None |
| 29 | UL-3 | Film 5 | SL resist for ArF | Perpendicular | Perpendicular | Perpendicular | Perpendicular | None |
| 30 | UL-3 | Film 6 | SL resist for ArF | Perpendicular | Perpendicular | Perpendicular | Perpendicular | None |
| 31 | UL-3 | Film 7 | SL resist for ArF | Perpendicular | Perpendicular | Perpendicular | Perpendicular | None |
| 32 | UL-3 | Film 8 | SL resist for ArF | Perpendicular | Perpendicular | Perpendicular | Perpendicular | None |
| 33 | UL-3 | Film 9 | SL resist for ArF | Perpendicular | Perpendicular | Perpendicular | Perpendicular | None |

TABLE 6-continued

| Example | Underlying organic film | Silicon-containing antireflection film | Overlying resist film | Pattern profile after development | Profile after etching for transfer to silicon containing film | Profile after etching for transfer to underlying organic film | Profile after etching for transfer to substrate | Pattern deformation after etching for transfer to substrate |
|---|---|---|---|---|---|---|---|---|
| 34 | UL-3 | Film 10 | SL resist for ArF | Perpendicular | Perpendicular | Perpendicular | Perpendicular | None |
| 35 | UL-3 | Film 11 | SL resist for ArF | Perpendicular | Perpendicular | Perpendicular | Perpendicular | None |
| 36 | UL-3 | Film 12 | SL resist for ArF | Perpendicular | Perpendicular | Perpendicular | Perpendicular | None |

TABLE 7

| Comparative Example | Underlying organic film | Silicon-containing antireflection film | Overlying resist film | Pattern profile after development | Profile after etching for transfer to silicon containing film | Profile after etching for transfer to underlying organic film | Profile after etching for transfer to substrate | Pattern deformation after etching for transfer to substrate |
|---|---|---|---|---|---|---|---|---|
| 1 | UL-1 | Film 13 | SL resist for ArF | Taper | Taper | Taper | Taper | Partially exist |
| 2 | UL-1 | Film 14 | SL resist for ArF | Taper | Taper | Taper | Taper | Partially exist |
| 3 | UL-1 | Film 15 | SL resist for ArF | Taper | Taper | Taper | Taper | Partially exist |
| 4 | UL-1 | Film 16 | SL resist for ArF | Taper | Taper | Taper | Taper | Partially exist |
| 5 | UL-1 | Film 17 | SL resist for ArF | Taper | Taper | Taper | Taper | Partially exist |
| 6 | UL-1 | Film 18 | SL resist for ArF | Taper | Taper | Taper | Taper | Partially exist |
| 7 | UL-1 | Film 19 | SL resist for ArF | Taper | Taper | Taper | Taper | Partially exist |
| 8 | UL-2 | Film 13 | SL resist for ArF | Taper | Taper | Taper | Taper | Partially exist |
| 9 | UL-2 | Film 14 | SL resist for ArF | Taper | Taper | Taper | Taper | Partially exist |
| 10 | UL-2 | Film 15 | SL resist for ArF | Taper | Taper | Taper | Taper | Partially exist |
| 11 | UL-2 | Film 16 | SL resist for ArF | Taper | Taper | Taper | Taper | Partially exist |
| 12 | UL-2 | Film 17 | SL resist for ArF | Taper | Taper | Taper | Taper | Partially exist |
| 13 | UL-2 | Film 18 | SL resist for ArF | Taper | Taper | Taper | Taper | Partially exist |
| 14 | UL-2 | Film 19 | SL resist for ArF | Taper | Taper | Taper | Taper | Partially exist |
| 15 | UL-3 | Film 13 | SL resist for ArF | Taper | Taper | Taper | Taper | Partially exist |
| 16 | UL-3 | Film 14 | SL resist for ArF | Taper | Taper | Taper | Taper | Partially exist |
| 17 | UL-3 | Film 15 | SL resist for ArF | Taper | Taper | Taper | Taper | Partially exist |
| 18 | UL-3 | Film 16 | SL resist for ArF | Taper | Taper | Taper | Taper | Partially exist |
| 19 | UL-3 | Film 17 | SL resist for ArF | Taper | Taper | Taper | Taper | Partially exist |
| 20 | UL-3 | Film 18 | SL resist for ArF | Taper | Taper | Taper | Taper | Partially exist |
| 21 | UL-3 | Film 19 | SL resist for ArF | Taper | Taper | Taper | Taper | Partially exist |
| 22 | UL-4 | Film 1 | SL resist for ArF | Taper | Taper | Taper | Taper | Exist |
| 23 | UL-4 | Film 2 | SL resist for ArF | Taper | Taper | Taper | Taper | Exist |
| 24 | UL-4 | Film 3 | SL resist for ArF | Taper | Taper | Taper | Taper | Exist |
| 25 | UL-4 | Film 4 | SL resist for ArF | Taper | Taper | Taper | Taper | Exist |
| 26 | UL-4 | Film 5 | SL resist for ArF | Taper | Taper | Taper | Taper | Exist |
| 27 | UL-4 | Film 6 | SL resist for ArF | Taper | Taper | Taper | Taper | Exist |

TABLE 7-continued

| Comparative Example | Underlying organic film | Silicon-containing antireflection film | Overlying resist film | Pattern profile after development | Profile after etching for transfer to silicon containing film | Profile after etching for transfer to underlying organic film | Profile after etching for transfer to substrate | Pattern deformation after etching for transfer to substrate |
|---|---|---|---|---|---|---|---|---|
| 28 | UL-4 | Film 7 | SL resist for ArF | Taper | Taper | Taper | Taper | Exist |
| 29 | UL-4 | Film 8 | SL resist for ArF | Taper | Taper | Taper | Taper | Exist |
| 30 | UL-4 | Film 9 | SL resist for ArF | Taper | Taper | Taper | Taper | Exist |
| 31 | UL-4 | Film 10 | SL resist for ArF | Taper | Taper | Taper | Taper | Exist |
| 32 | UL-4 | Film 11 | SL resist for ArF | Taper | Taper | Taper | Taper | Exist |
| 33 | UL-4 | Film 12 | SL resist for ArF | Taper | Taper | Taper | Taper | Exist |
| 34 | UL-4 | Film 13 | SL resist for ArF | Taper | Taper | Taper | Taper | Exist |
| 35 | UL-4 | Film 14 | SL resist for ArF | Taper | Taper | Taper | Taper | Exist |
| 36 | UL-4 | Film 15 | SL resist for ArF | Perpendicular | Perpendicular | Perpendicular | Taper | Exist |
| 37 | UL-4 | Film 16 | SL resist for ArF | Taper | Taper | Taper | Taper | Exist |
| 38 | UL-4 | Film 17 | SL resist for ArF | Taper | Taper | Taper | Taper | Exist |
| 39 | UL-4 | Film 18 | SL resist for ArF | Taper | Taper | Taper | Taper | Exist |
| 40 | UL-4 | Film 19 | SL resist for ArF | Taper | Taper | Taper | Taper | Exist |

As shown in Table 6, the silicon-containing antireflection film formed by using the thermosetting silicon-containing antireflection film-forming composition of the present invention, in combination with UL-1, UL-2, or UL-3, gave a good resist form after the development, and a good form of the underlayer film without causing the pattern deformation after the oxygen etching and after the etching process of the substrate (Examples 1 to 36). On the other hand, as shown in Table 7, when the antireflection film outside the range of the present invention was used with UL-1, UL-2, or UL-3, the resist form after the development resulted in the shape of a taper. This was caused because an optical combination of the silicon-containing antireflection film with UL-1, UL-2, or UL-3 was not appropriate. In the subsequent processes, this form was transformed, resulting in a partial pattern deformation after the final etching process of the substrate (Comparative Examples 1 to 21).

Further, the silicon-containing antireflection film according to the present invention on the conventional organic underlayer film (UL-4) was not appropriate in the optical combination; the resist form after the development resulted in the shape of a taper. When the final substrate processing was done by etching, the pattern deformation was observed on the entire substrate surface because UL-4 was insufficient in the etching resistance (Comparative Examples 22 to 35 and 37 to 40).

The combination of the heretofore known organic underlayer film (UL-4) with Film 15 gave a good resist form after the development and a good form after the oxygen etching; but a pattern deformation was observed partially because the etching resistance was insufficient at the time of the etching process of the substrate (Comparative Example 36).

In FIG. 1, the results of these Examples and Comparative Examples are shown, in which the refractive index "n" at the wavelength of 193 nm is taken in the horizontal axis and the extinction coefficient "k" at the wavelength of 193 nm in the vertical axis.

In FIG. 1, in the intermediate layer film formed on the underlayer film having a naphthalene skeleton, when the refractive index "n" and the extinction coefficient "k" at the wavelength of 193 nm are in the right of the right hem of the trapezoidal area (2n–3.08>k, Films 14 to 16) or in the left of the left hem of the trapezoidal area (k>20n–29.4, Films 13 and 19), the reflection rate becomes so high that a standing wave is generated at the time of the light exposure, resulting in the problem of forming excessive concavity and convexity in the upperlayer resist pattern. In the area above the upper hem (k>0.5, Film 17 and 18), the amount of the organic substituent group introduced as a light absorbing group, namely the amount of the carbon component in the silicon-containing film, becomes so large that it results in the problem of deterioration of the etching selectivity required as the performance of the silicon-containing film. In the area below the lower hem (0.01>k), the exposing light cannot be absorbed efficiently, resulting in the problem of the lack of the antireflection effect.

All of these problems as mentioned above are caused by insufficient expression of the antireflection function of the intermediate layer film. Namely, it was demonstrated that the antireflection function of any of the foregoing intermediate layer films (black spots: Films 13 to 19) is not fully expressed on the underlayer film having a naphthalene skeleton (see Table 3 and Table 7).

On the other hand, in the intermediate layer film formed on the underlayer film having a naphthalene skeleton, when the refractive index "n" and the extinction coefficient "k" at the wavelength of 193 nm are in the left of the right hem of the trapezoidal area (2n–3.08≤k), in the right of the left hem (k≤20n–29.4), above the lower hem (0.01≤k), and below the upper hem (k≤0.5) (white plots: Film 1 to 12), there are no problems as mentioned above; the antireflection function of the intermediate layer film is fully expressed even on the underlayer film having a naphthalene skeleton.

Namely, in the case that the organic film having a naphthalene skeleton is used as the underlayer film, when the silicon-containing antireflection film is formed as the intermediate layer film by using the thermosetting silicon-containing antireflection film-forming composition satisfying the following relationship of the present invention, it is demonstrated that the antireflection function can be fully expressed even on the underlayer film having a naphthalene skeleton (see Table 3 and Table 6).

$$2n-3.08 \leq k \leq 20n-29.4 \text{ and } 0.01 \leq k \leq 0.5$$

As mentioned above, it was confirmed that, when the thermosetting silicon-containing antireflection film-forming composition of the present invention is used, a silicon-containing antireflection film, which can form an excellent pattern with depressed reflection of the exposing light even on the underlayer film having a naphthalene skeleton, has excellent dry etching properties between the photoresist film—which is the upperlayer of the silicon-containing antireflection film—and the organic film—which is the underlayer—, and has an excellent storage stability, can be formed.

The present invention is not limited to the above embodiments. The above embodiments are merely illustrative, and whatever having the substantially same configurations as the technical concept recited in the claims of the present application and exhibiting the same functions and effects are embraced within the technical scope of the present invention.

What is claimed is:

1. A thermosetting silicon-containing antireflection film-forming composition, to form a silicon-containing antireflection film in a multilayer resist process used in a lithography, comprising:
    a silicon-containing compound obtained by a hydrolysis-condensation of hydrolyzable silicon-containing compounds comprising one or more kinds of a compound represented by the following general formula (A-1) and one or more kinds of a compound represented by the following general formula (A-2):

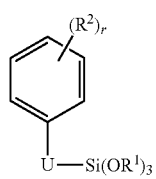
(A-1)

(A-2)

wherein:
    in the formula (A-1), $R^1$ represents an organic group having 1 to 6 carbon atoms; each $R^2$ represents a monovalent organic group having 1 to 30 carbon atoms or a silicon-containing organic group; U represents a single bond or a divalent organic group having 1 to 6 carbon atoms; and "r" represents 1 to 3,
    in the formula (A-2), R represents an alkyl group having 1 to 6 carbon atoms; $R^{11}$, $R^{12}$, and $R^{13}$ may be the same or different and represent a hydrogen atom or a monovalent organic group having 1 to 30 carbon atoms; "m11", "m12", and "m13" represent 0 or 1; and m11+m12+m13 is 0 to 3,
    the formula (A-2) is different from the formula (A-1), and
    the composition is at least capable of forming—on an organic film that is an underlayer film having a resin having a naphthalene compound, a bisnaphthol compound, an acenaphthylene compound, or a naphthol compound—a silicon-containing antireflection film whose refractive index "n" and extinction coefficient "k" at 193 nm satisfy the following relationship:

$$2n-3.08 \leq k \leq 20n-29.4 \text{ and } 0.01 \leq k \leq 0.5.$$

2. The thermosetting composition for forming a silicon-containing antireflection film according to claim 1, wherein:
    the composition contains a silicon-containing compound obtained by mixing the hydrolyzable silicon-containing compound further with one or more kinds of a hydrolyzable compound represented by the following general formula (A-3),

and then carrying out a hydrolysis-condensation of the mixture thus obtained,
    in the formula (A3):
        $R^3$ and $R^4$ represent an organic group having 1 to 30 carbon atoms;
        m3+m4 is a valency that can be determined by the kind of D;
        "m3" and "m4" represent an integer of 0 or more; and
        D represents an element belonging to a group of III, IV, or V, except for a silicon atom and a carbon atom.

3. A substrate comprising at least:
    an organic film having a naphthalene skeleton formed on a processing substrate,
    a silicon-containing antireflection film formed on the organic film by using the thermosetting silicon-containing antireflection film-forming composition according to claim 1, and
    a photoresist film formed on the silicon-containing antireflection film.

4. A substrate comprising at least:
    an organic film having a naphthalene skeleton formed on a processing substrate,
    a silicon-containing antireflection film formed on the organic film by using the thermosetting silicon-containing antireflection film-forming composition according to claim 2, and
    a photoresist film formed on the silicon-containing antireflection film.

5. The substrate according to claim 3, wherein a resist top coat is further formed on the photoresist film.

6. The substrate according to claim 4, wherein a resist top coat is further formed on the photoresist film.

7. A patterning process, on a substrate by a lithography, comprising:
    forming a silicon-containing antireflection film from the thermosetting silicon-containing antireflection film-forming composition according to claim 1 on an organic film having a naphthalene skeleton formed on a processing substrate;
    forming a photoresist film on the silicon-containing antireflection film;
    subsequently exposing a pattern circuit region in the photoresist film;
    developing the photoresist film by a developer to form a resist film pattern in the photoresist film;
    dry-etching the silicon-containing antireflection film by using the obtained resist film pattern as an etching mask;
    etching the organic film by using the obtained silicon-containing antireflection film pattern as an etching mask; and etching the substrate by using the organic film having the formed pattern as a mask, to form the pattern on the substrate.

8. A patterning process, on a substrate by a lithography, comprising:

forming a silicon-containing antireflection film from the thermosetting silicon-containing antireflection film-forming composition according to claim 2 on an organic film having a naphthalene skeleton formed on a processing substrate;

forming a photoresist film on the silicon-containing antireflection film;

subsequently exposing a pattern circuit region in the photoresist film;

developing the photoresist film by a developer to form a resist film pattern in the photoresist film;

dry-etching the silicon-containing antireflection film by using the obtained resist film pattern as an etching mask;

etching the organic film by using the obtained silicon-containing antireflection film pattern as an etching mask; and etching the substrate by using the organic film having the formed pattern as a mask, to form the pattern on the substrate.

9. The patterning process according to claim 7, wherein, after the photoresist film is formed on the silicon-containing antireflection film, a top coat is formed further on the photoresist film.

10. The patterning process according to claim 8, wherein, after the photoresist film is formed on the silicon-containing antireflection film, a top coat is formed further on the photoresist film.

* * * * *